United States Patent
Pendse

(10) Patent No.: US 12,355,022 B2
(45) Date of Patent: Jul. 8, 2025

(54) DISPLAY PROJECTOR SYSTEMS AND DEVICES FOR AUGMENTED-REALITY

(71) Applicant: Meta Platforms Technologies, LLC, Menlo Park, CA (US)

(72) Inventor: Rajendra D. Pendse, Fremont, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 19/000,405

(22) Filed: Dec. 23, 2024

(65) Prior Publication Data

US 2025/0125322 A1   Apr. 17, 2025

Related U.S. Application Data

(63) Continuation of application No. 17/193,871, filed on Mar. 5, 2021, now Pat. No. 12,224,271.
(Continued)

(51) Int. Cl.
*H01L 25/16* (2023.01)
*G02B 27/01* (2006.01)
(Continued)

(52) U.S. Cl.
CPC ............ *H01L 25/167* (2013.01); *G06F 1/163* (2013.01); *H01L 21/6835* (2013.01);
(Continued)

(58) Field of Classification Search
CPC ............... H01L 25/167; H01L 21/6835; H01L 25/0753; H01L 2221/68354;
(Continued)

(56) References Cited

U.S. PATENT DOCUMENTS 8,791,474 B1   7/2014   Bibl et al.
9,904,058 B2 *  2/2018   Yeoh .................... G02B 6/0035
(Continued)

FOREIGN PATENT DOCUMENTS

CN   107924964 A   4/2018
CN   108573992 A   9/2018
(Continued)

OTHER PUBLICATIONS

Office Action mailed Mar. 11, 2025 for Japanese Patent Application No. 2022-541825, filed on Mar. 10, 2021, 2 pages.
(Continued)

*Primary Examiner* — Vinh T Lam
(74) *Attorney, Agent, or Firm* — Morgan Lewis & Bockius LLP

(57) ABSTRACT

Systems and devices describe an augmented-reality glasses having a plurality of panels of light emitters arranged to form an array of light emitters, collimation optics for collimating light received from the array of light emitters, an optical coupler for receiving the collimated light, and a waveguide for display of augmented-reality content to a wearer of the augmented-reality glasses. In some embodiments, the array of light emitters includes light emitters generating three colors, each panel of the plurality of panels of light emitters having light emitters generating a same color, and each panel of the plurality of panels of light emitters positioned on a surface of a semiconductor with at least one integrated circuit. The array of light emitters can be two-dimensional array of light emitters arranged on a common plane and characterized by a pitch that is less than 2 μm.

20 Claims, 30 Drawing Sheets

Related U.S. Application Data

(60) Provisional application No. 63/043,898, filed on Jun. 25, 2020, provisional application No. 63/021,441, filed on May 7, 2020, provisional application No. 62/987,744, filed on Mar. 10, 2020.

(51) Int. Cl.
*G06F 1/16* (2006.01)
*H01L 21/683* (2006.01)
*H01L 25/075* (2006.01)
*H10H 20/01* (2025.01)
*H10H 20/852* (2025.01)
*H10H 20/857* (2025.01)

(52) U.S. Cl.
CPC ......... *H01L 25/0753* (2013.01); *H10H 20/01* (2025.01); *H10H 20/013* (2025.01); *H10H 20/852* (2025.01); *H10H 20/857* (2025.01); *G02B 27/0172* (2013.01); *H01L 2221/68354* (2013.01); *H01L 2221/68368* (2013.01); *H10H 20/0362* (2025.01); *H10H 20/0364* (2025.01)

(58) Field of Classification Search
CPC .......... H01L 2221/68368; G06F 1/163; H10H 20/01; H10H 20/013; H10H 20/852; H10H 20/857; H10H 20/0362; H10H 20/0364; G02B 27/0172
See application file for complete search history.

(56) References Cited

U.S. PATENT DOCUMENTS

| | | | |
|---|---|---|---|
| 10,424,232 B2* | 9/2019 | Schubert | H04N 13/324 |
| 10,712,569 B2* | 7/2020 | Jiang | G02B 27/0172 |
| 10,878,732 B2* | 12/2020 | Schubert | G02B 26/06 |
| 11,056,037 B1* | 7/2021 | Buckley | G06F 1/163 |
| 11,086,125 B2* | 8/2021 | Yeoh | G02B 27/0172 |
| 11,175,447 B1* | 11/2021 | Pynn | H10H 20/825 |
| 11,239,400 B1* | 2/2022 | Chio | G02B 27/0172 |
| 11,302,676 B2* | 4/2022 | Zhang | H10H 20/857 |
| 11,349,053 B1* | 5/2022 | Chio | C09J 9/02 |
| 11,640,063 B2* | 5/2023 | Trisnadi | G09G 3/32 345/694 |
| 11,914,150 B2* | 2/2024 | Trisnadi | H04N 13/341 |
| 11,977,230 B2* | 5/2024 | Klug | H02N 2/028 |
| 2004/0188696 A1 | 9/2004 | Hsing Chen et al. | |
| 2005/0096776 A1 | 5/2005 | Beaulieu et al. | |
| 2009/0286342 A1 | 11/2009 | Takahashi et al. | |
| 2012/0001534 A1 | 1/2012 | Kim | |
| 2013/0126921 A1 | 5/2013 | Mohammed et al. | |
| 2013/0285086 A1 | 10/2013 | Hu et al. | |
| 2015/0380622 A1 | 12/2015 | Miyoshi et al. | |
| 2016/0066461 A1 | 3/2016 | Park et al. | |
| 2017/0092897 A1 | 3/2017 | Liu | |
| 2017/0141091 A1 | 5/2017 | Bibl et al. | |
| 2017/0179352 A1 | 6/2017 | Song | |
| 2018/0012949 A1 | 1/2018 | Takeya et al. | |
| 2018/0269191 A1 | 9/2018 | England et al. | |
| 2018/0277523 A1 | 9/2018 | Ahmed et al. | |
| 2018/0358405 A1 | 12/2018 | Chaji et al. | |
| 2019/0019449 A1 | 1/2019 | Pappas | |
| 2019/0044040 A1 | 2/2019 | Andrews | |
| 2019/0088633 A1 | 3/2019 | Tao et al. | |
| 2019/0096864 A1 | 3/2019 | Huitema et al. | |
| 2019/0287949 A1 | 9/2019 | Chong et al. | |
| 2019/0393069 A1 | 12/2019 | Paranjpe et al. | |
| 2020/0006924 A1 | 1/2020 | Zou et al. | |
| 2020/0013761 A1 | 1/2020 | Chaji et al. | |
| 2020/0135706 A1 | 4/2020 | Sa et al. | |
| 2020/0144327 A1 | 5/2020 | Lee et al. | |
| 2020/0227393 A1 | 7/2020 | Kim et al. | |
| 2020/0251451 A1 | 8/2020 | Schuele et al. | |
| 2020/0287110 A1 | 9/2020 | Oh et al. | |
| 2020/0312904 A1 | 10/2020 | Hin et al. | |
| 2020/0327842 A1* | 10/2020 | Buckley | G02B 6/005 |
| 2021/0005794 A1* | 1/2021 | Sakong | H10H 29/142 |
| 2021/0041182 A1 | 2/2021 | Eid et al. | |
| 2021/0049957 A1 | 2/2021 | Lee | |
| 2021/0151648 A1* | 5/2021 | Hin | H01L 21/4853 |
| 2021/0165318 A1* | 6/2021 | Pendse | G02B 7/003 |
| 2021/0272935 A1 | 9/2021 | Wang et al. | |
| 2022/0013689 A1 | 1/2022 | Kishimoto | |
| 2022/0293573 A1 | 9/2022 | Ishii et al. | |
| 2023/0282489 A1 | 9/2023 | Hin et al. | |

FOREIGN PATENT DOCUMENTS

| | | |
|---|---|---|
| CN | 109923468 A | 6/2019 |
| CN | 110249429 A | 9/2019 |
| CN | 110462850 A | 11/2019 |
| CN | 110494983 A | 11/2019 |
| JP | 2003162231 A | 6/2003 |
| JP | 2010034529 A | 2/2010 |
| JP | 2010517289 A | 5/2010 |
| JP | 2018538554 A | 12/2018 |
| JP | 2019153723 A | 9/2019 |
| JP | 2023502245 A | 1/2023 |
| KR | 20190127872 A | 11/2019 |
| WO | 2018102955 A1 | 6/2018 |
| WO | 2018175338 A1 | 9/2018 |
| WO | 2019076752 A1 | 4/2019 |

OTHER PUBLICATIONS

Office Action mailed Mar. 11, 2025 for Japanese Patent Application No. 2022-541826, filed on Mar. 10, 2021, 2 pages.
Office Action mailed Mar. 18, 2025 for Chinese Application No. 202180016898.X, filed Mar. 10, 2021, 8 pages.
Co-Pending U.S. Appl. No. 17/193,855, filed Mar. 5, 2021, 111 Pages.
Co-Pending U.S. Appl. No. 17/193,871, filed Mar. 5, 2021, 111 Pages.
International Search Report and Written Opinion for International Application No. PCT/US2021/021618, mailed Jun. 24, 2021, 9 Pages.
International Search Report and Written Opinion of International Application No. PCT/US2021/021633, mailed Jun. 29, 2021, 9 Pages.
Notice of Allowance mailed Aug. 4, 2023 for U.S. Appl. No. 17/193,855, filed Mar. 5, 2021, 8 pages.
Notice of Allowance mailed Dec. 9, 2024 for U.S. Appl. No. 17/193,871, filed Mar. 5, 2021, 2 pages.
Notice of Allowance mailed Jan. 15, 2025 for U.S. Appl. No. 17/193,871, filed Mar. 5, 2021, 2 pages.
Office Action mailed Nov. 5, 2024 for Japanese Patent Application No. 2022-541825, filed on Mar. 10, 2021, 8 pages.
Office Action mailed Nov. 5, 2024 for Japanese Patent Application No. 2022-541826, filed on Mar. 10, 2021, 22 pages.
Office Action mailed Feb. 10, 2025 for Korean Application No. 10-2022-7023458, filed Mar. 10, 2021, 7 pages.
Office Action mailed Oct. 24, 2024 for Chinese Application No. 202180016895.6, filed Mar. 10, 2021, 16 pages.
Office Action mailed May 21, 2025 for Korean Application No. 10-2022-7023474, filed Mar. 10, 2021, 7 pages.

* cited by examiner

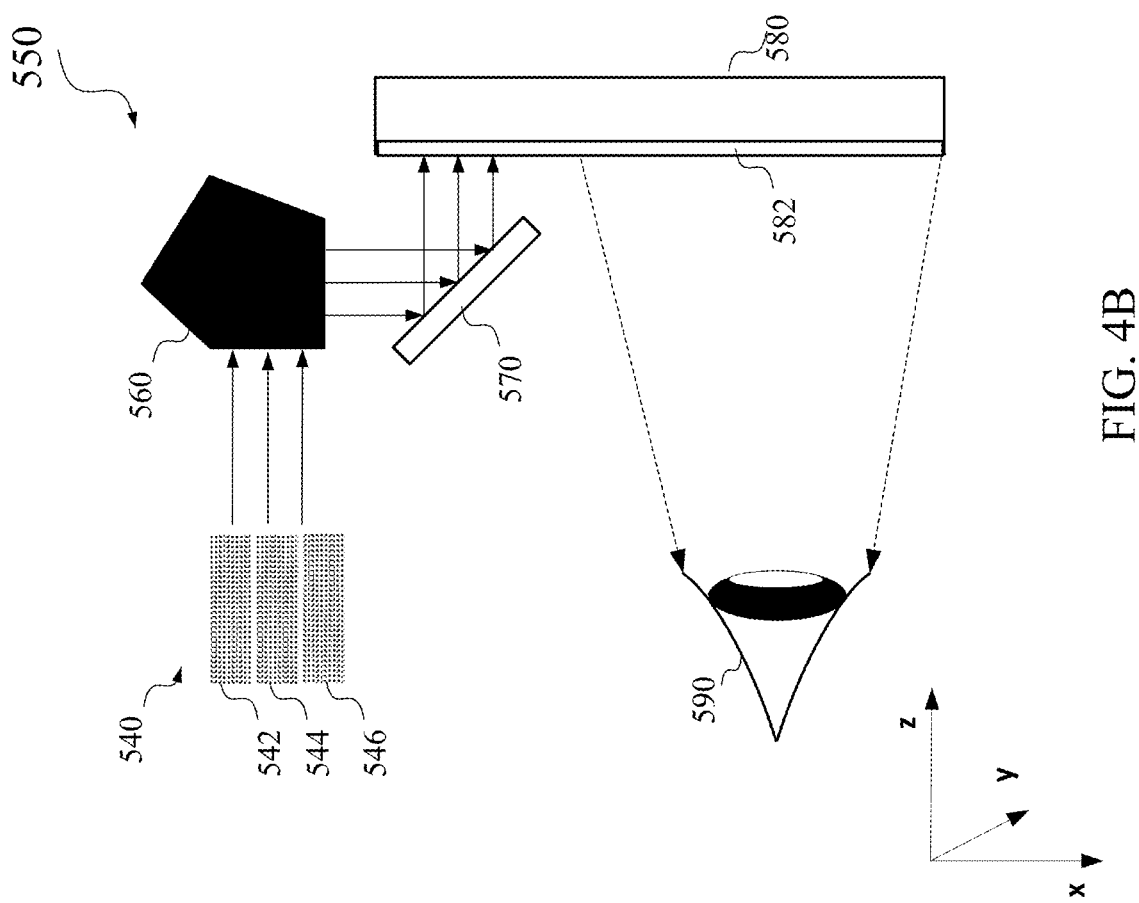
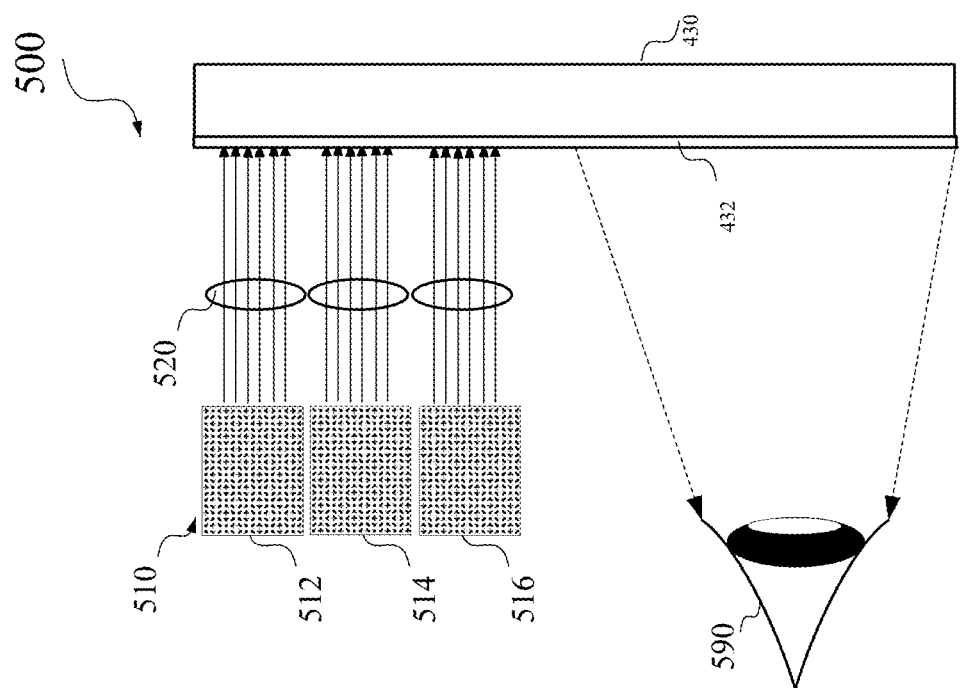
FIG. 4B
FIG. 4A

DISPLAY PROJECTOR SYSTEMS AND DEVICES FOR AUGMENTED-REALITY

This application is a continuation of U.S. patent application Ser. No. 17/193,871, filed on Mar. 5, 2021, entitled "Integrating Control Circuits With Light Emissive Circuits With Dissimilar Wafer Sizes," which claims the benefit of U.S. Provisional Patent Application No. 62/987,744 filed on 10 Mar. 2020, U.S. Provisional Patent Application No. 63/021,441 filed on 7 May 2020, and U.S. Provisional Patent Application No. 63/043,898 filed on 25 Jun. 2020, the entire contents of each of which are incorporated by reference herein.

TECHNICAL FIELD

This disclosure generally relates to semiconductor devices and semiconductor processing.

BACKGROUND

Optical devices, such as optical displays, present content to a user. For example, an optical display emits light and typically spatially and temporally modulates the light to form images and/or video. In some applications, the display emits spatially uniform light from one or more light sources and modulates the light using a spatial filter, such as a liquid crystal (LC) panel. In other applications, light sources of the optical display may be arranged in a 2D array and spatially modulate the light by virtue of emitting a range of brightnesses. Some light sources may incorporate different substrate materials for drive circuitry and light emission devices to achieve different optical characteristics.

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-nitride semiconductors, such as alloys of AN, GaN, InN, AlGaInP, other quaternary phosphide compositions, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

In general, the present disclosure describes semiconductor wafer manufacturing methods, systems and articles for integrating micro light emitting diodes (µLEDs) with digital and/or analog circuitry and devices including µLEDs integrated with digital and/or analog circuitry. The techniques include reconstituting a semiconductor wafer, such as a CMOS device driver integrated circuit (DDIC) wafer, with a layer in which µLEDs have been or will be formed. In some examples, the wafer reconstitution occurs after forming an inorganic semiconductor layer on a substrate. The substrate and inorganic semiconductor layer may be singulated into a plurality of dice, each die including a portion the substrate and a corresponding portion of the inorganic semiconductor layer. An inorganic semiconductor layer is then bonded to each corresponding semiconductor die within the semiconductor wafer, processed, and µLED arrays are formed in each inorganic semiconductor layer. The result is a plurality of stacked integrated circuits, each including a µLED array on a semiconductor chip. This may allow integration of device driver circuitry with emissive devices in a stacked µLED array.

In some examples, wafer reconstitution may occur after formation of a stacked wafer that includes a semiconductor wafer and an embedded pixel array layer on the semiconductor wafer. The embedded pixel array layer may include a plurality of µLED arrays, each µLED array on a corresponding semiconductor die. The techniques described herein may include singulating the stacked wafer into stacked dice, temporarily attaching individual stacked dice to a carrier wafer, and completing through substrate via (TSV) processing on the semiconductor dice (which may include through silicon vias, through package vias, and the like).

Accordingly, the techniques described herein provide for wafer reconstitution to combine control circuitry and emissive devices for µLEDs. As such, the techniques disclosed may enable an increase in efficiency, and a reduction in cost and time, of fabrication of µLED display packages.

In one example, this disclosure describes an article that includes a semiconductor including at least one integrated circuit; and an inorganic semiconductor layer bonded to a first surface of the semiconductor, wherein the inorganic semiconductor layer comprises a µLED array, wherein the first surface of the semiconductor extends beyond a first edge of the inorganic semiconductor layer, and wherein the first edge of the inorganic semiconductor layer is oriented substantially perpendicular to the first surface of the semiconductor.

In another example, this disclosure describes a method that includes singulating a wafer into a plurality of singulated dice, wherein the wafer comprises an inorganic semiconductor layer on a substrate, and wherein each singulated die includes a portion of the substrate and a corresponding portion of the inorganic semiconductor layer; bonding the plurality of singulated dice to a semiconductor wafer including a plurality of integrated circuits; after bonding the plurality of singulated dice to the semiconductor wafer, removing substantially the entire substrate portion from each of the plurality of singulated dice; and forming a µLED array in at least one of the portions of the inorganic semiconductor layer.

In another example, this disclosure describes an artificial reality system includes a semiconductor including at least one integrated circuit; and an inorganic semiconductor layer bonded to a first surface of the semiconductor, wherein the first surface of the semiconductor extends beyond a first edge of the inorganic semiconductor layer.

In another example, this disclosure describes an article that includes a semiconductor including at least one integrated circuit; a µLED array on a first surface of the semiconductor die; and a fill material disposed on a first edge of the semiconductor, wherein the first edge of the at least µLED array or the semiconductor is oriented substantially perpendicular to the first surface of the semiconductor.

In another example, this disclosure describes a method that includes attaching at least one semiconductor including at least one integrated circuit and a µLED array to a carrier wafer, wherein the carrier wafer has a diameter different than the diameter of the at least one semiconductor; and forming at least one through substrate via in the semiconductor.

In another example, this disclosure describes a method that includes attaching a first wafer to a carrier wafer, wherein the first wafer comprises a plurality of μLED arrays on a plurality of corresponding integrated circuits, wherein the carrier wafer has a diameter different than the diameter of the first wafer; and forming at least one through substrate via in a substrate of at least one of the plurality of integrated circuits.

Thus, the disclosed examples provide methods and techniques for integrating μLED dice with digital/analog circuitry. The details of one or more examples are set forth in the accompanying drawings and the description below. Other features, objects, and advantages will be apparent from the description, drawings, and claims.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4A illustrates an example of a near-eye display device including a waveguide display, in accordance with the techniques described in this disclosure.

FIG. 4B illustrates an example of a near-eye display device including a waveguide display, in accordance with the techniques described in this disclosure.

Figure 1:
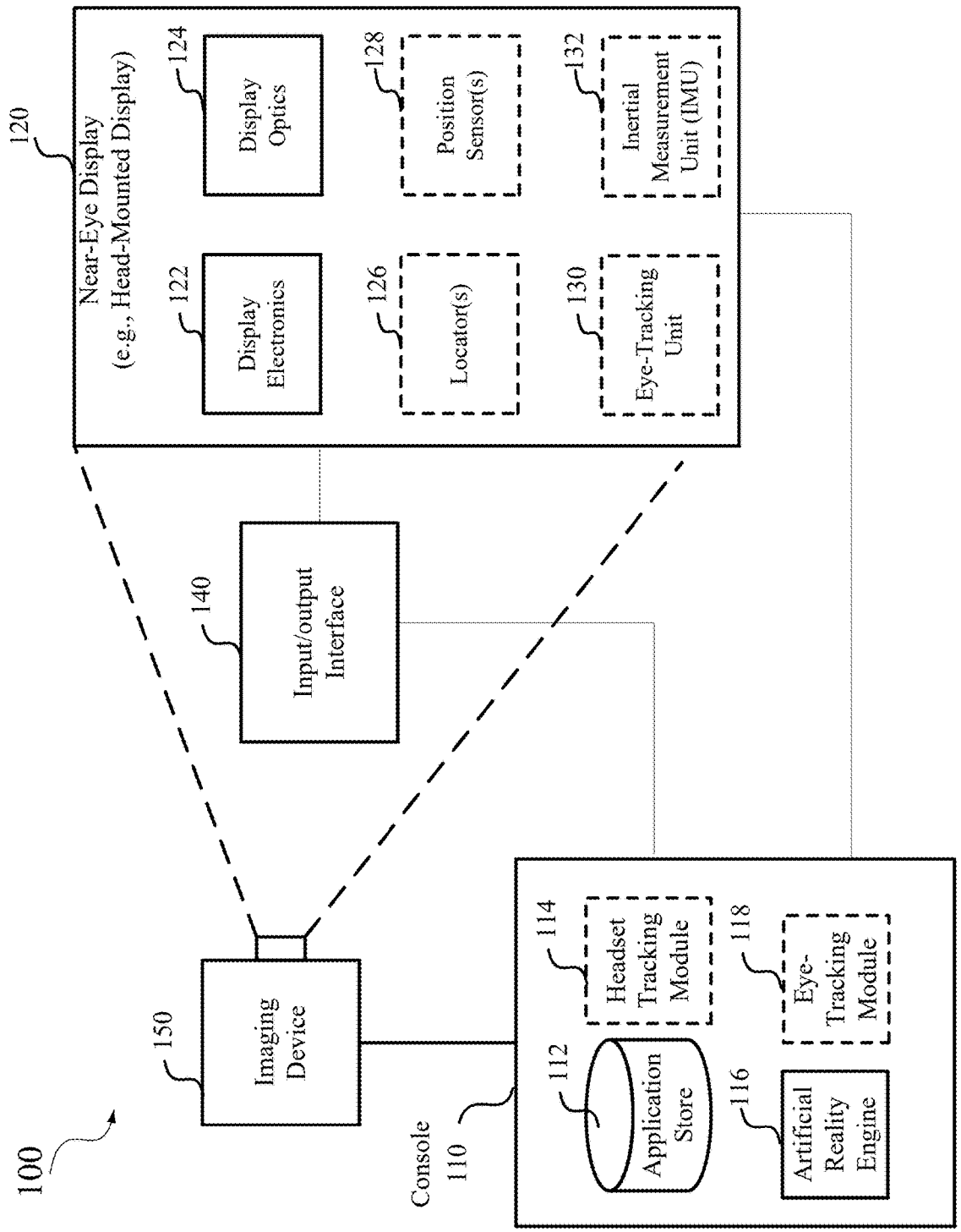
FIG. 1 is a simplified block diagram of an example of an artificial reality system environment including a near-eye display, in accordance with the techniques described in this disclosure.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs) and/or semiconductor components. In some examples, and without limitation, the present disclosure is directed to systems, methods and articles that integrate micro light emitting diodes (μLEDs) with associated digital and/or analog circuitry, such as control or driver circuitry for the μLEDs, in a stacked configuration. Various inventive embodiments are described herein, including devices, systems, methods, materials, and the like.

In some devices, for example, artificial reality devices (including virtual reality, augmented reality, and mixed reality), μLEDs and waveguides may be used to render artificial reality images. The μLEDs may be integrated with digital and analog circuitry in the form of one or more digital/analog die and may be integrated with other components, such as a graphics processor, in a miniaturized display package.

The integration of μLEDs with digital/analog circuitry often requires wafer-level manufacturing operations such as embedding μLEDs into the surface of a pre-formed wafer with pre-existing CMOS digital/analog circuitry, or formation of through-silicon vias (TSVs, or vias) in the wafers after the μLEDs are embedded to facilitate the integration of the circuits in a display package. However, these manufacturing operations may utilize semiconductor fabrication lines of different wafer sizes. For example, the processes for producing CMOS digital/analog circuits may use 300 mm wafers and are performed on 300 mm production lines. By contrast, the processes for forming μLEDs arrays may use 100 mm or 200 mm wafers manufacturing using different product lines. For example, the underlying epitaxial wafers of gallium nitride (GaN) and/or gallium arsenide (GaAs), which form the base for green, blue, and red μLEDs are currently often produced in diameters of 100 mm or 200 mm and processed using 100 mm or 200 mm production lines. Furthermore, the processes for formation of vias usually use 300 mm wafers and are performed on 300 mm production lines.

The mismatch in wafer diameters presents limitations and technical challenges for the integration of μLEDs and digital and analog circuitry into a common semiconductor wafer. For example, wafer-to-wafer bonding of wafers of mismatched size, e.g., a 300 mm CMOS wafer to a smaller diameter μLED wafer, is difficult or impossible. As such, in some techniques, a pre-formed CMOS 300 mm wafer with the digital/analog circuits may be "cored," e.g., the center portion matching the diameter of the μLED wafer cut from the CMOS wafer, with the outer, larger diameter portions discarded. This results in large amounts of waste from the CMOS wafers. Furthermore, for downstream operations such as formation of through substrate vias, a smaller wafer that includes CMOS integrated circuits and an embedded pixel array layer may be accommodated using an artificial "handle" wafer to form an assembly with an effective 300 mm diameter to enable further processing of the wafer using 300 mm processes and production lines. This results in increased cost, complexity, and processing time due to forming the artificial "handle" wafers and assembling a "handle" wafer with the smaller wafer that includes CMOS integrated circuits and the embedded pixel array layer.

The example techniques of the present disclosure address at least some of these issues through wafer reconstitution process(es). In some examples, the 300 mm CMOS wafers may be reconstituted with a plurality of individual dice from one or more wafers including a substrate and an inorganic semiconductor layer. The inorganic semiconductor layer may include material in which μLED arrays will be formed. Reconstitution may include singulating dice, each dice including a substrate and a corresponding inorganic semiconductor layer, from a wafer having a certain diameter, e.g., 100 mm, 200 mm, etc. The dice may then be re-populated onto a CMOS wafer with a different diameter, e.g., 300 mm, forming a wafer that may be seamlessly processed to form the μLED arrays, which are integrated with and stacked on corresponding CMOS integrated circuits, using 300 mm processes and production lines.

In other examples, smaller (e.g., 100 mm or 200 mm) stacked μLED and integrated circuit wafer may be singulated to form a plurality of dice, each dice including a stacked μLED array and integrated circuit. A plurality of stacked μLED and integrated circuit dice may be attached to a larger (e.g., 300 mm) carrier wafer, then processed to form through substrate vias in a substrate of the integrated circuits. This may allow 300 mm processes and production lines to be used to form the through substrate vias.

In any of the examples described herein, wafer reconstitution may decrease the cost, complexity, and/or processing time of integrating μLEDs with digital and/or analog circuitry. In addition, reconstitution may preserve pre-processed material that would otherwise be thrown away, e.g., from a larger CMOS digital/analog circuitry wafer. Furthermore, reconstitution may eliminate the need for the accommodation process described above.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications.

For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding. In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail.

In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs. FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2A:
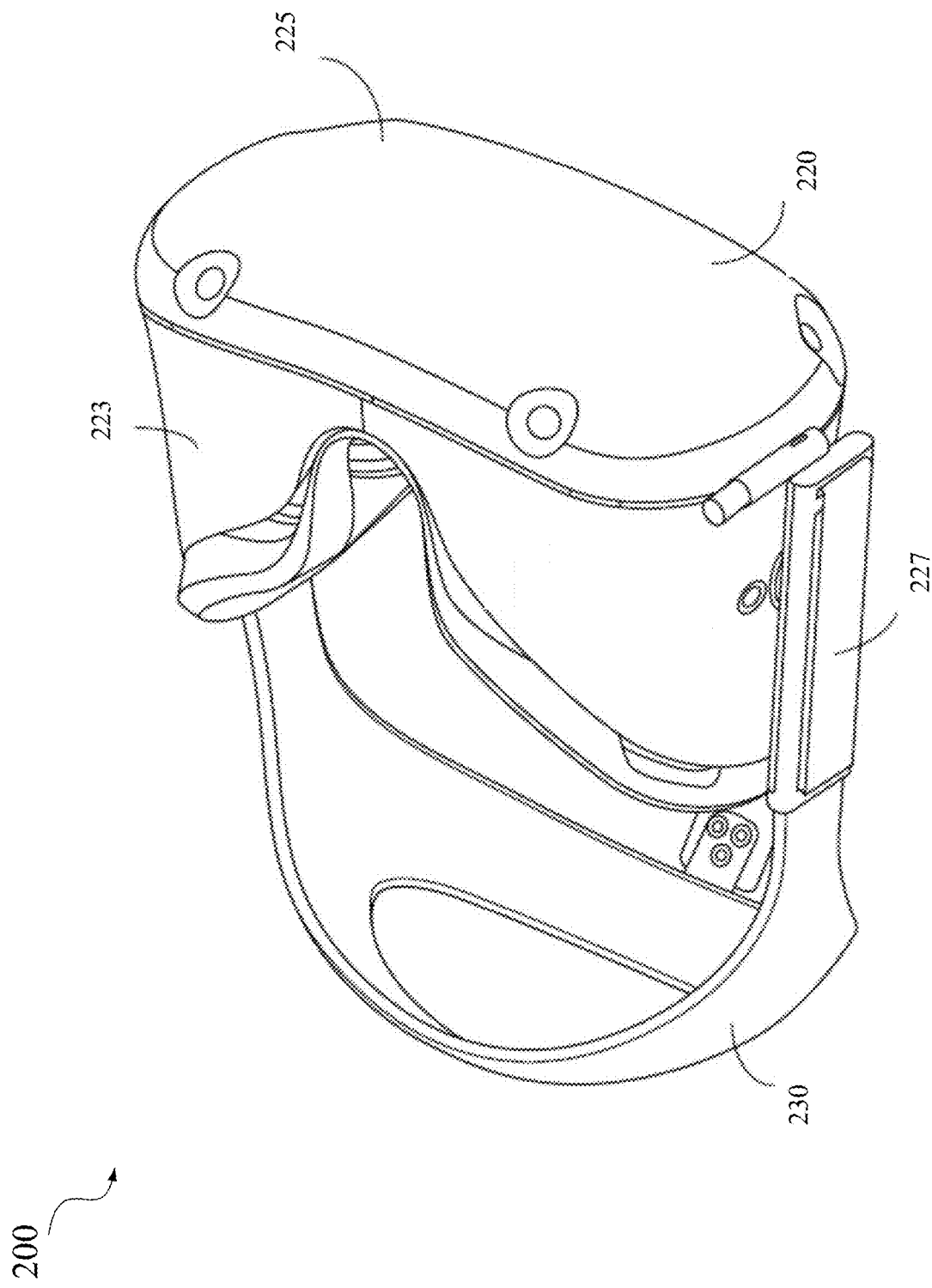
FIG. 2A is a perspective view of an example of a near-eye display in the form of a head-mounted display (HMD) device for implementing some of the examples disclosed herein.

In some examples, artificial reality system 100 may include one or more reconstituted semiconductor components such as described herein, e.g., display electronics 122 may include one or more reconstituted semiconductor components such as described herein. In some examples, one or more reconstituted semiconductor components such as described herein may comprise µLEDs and/or arrays of µLEDs, which may be integrated with display driver circuitry in a stacked configuration. For example, a µLED array may be stacked on the display driver circuitry, where the display driver circuitry which may include an integrated circuit including digital and analog circuitry for controlling the µLED array. This may facilitate packaging of the µLED and display driver circuitry in a relatively small volume and/or using an efficient, cost effective process. The stacked µLED and display driver circuitry may be formed using any of the techniques described herein. FIG. 2A is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2A shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 2B below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

In some examples, HMD device 200 may include one or more reconstituted semiconductor components such as described herein.

Figure 2B:
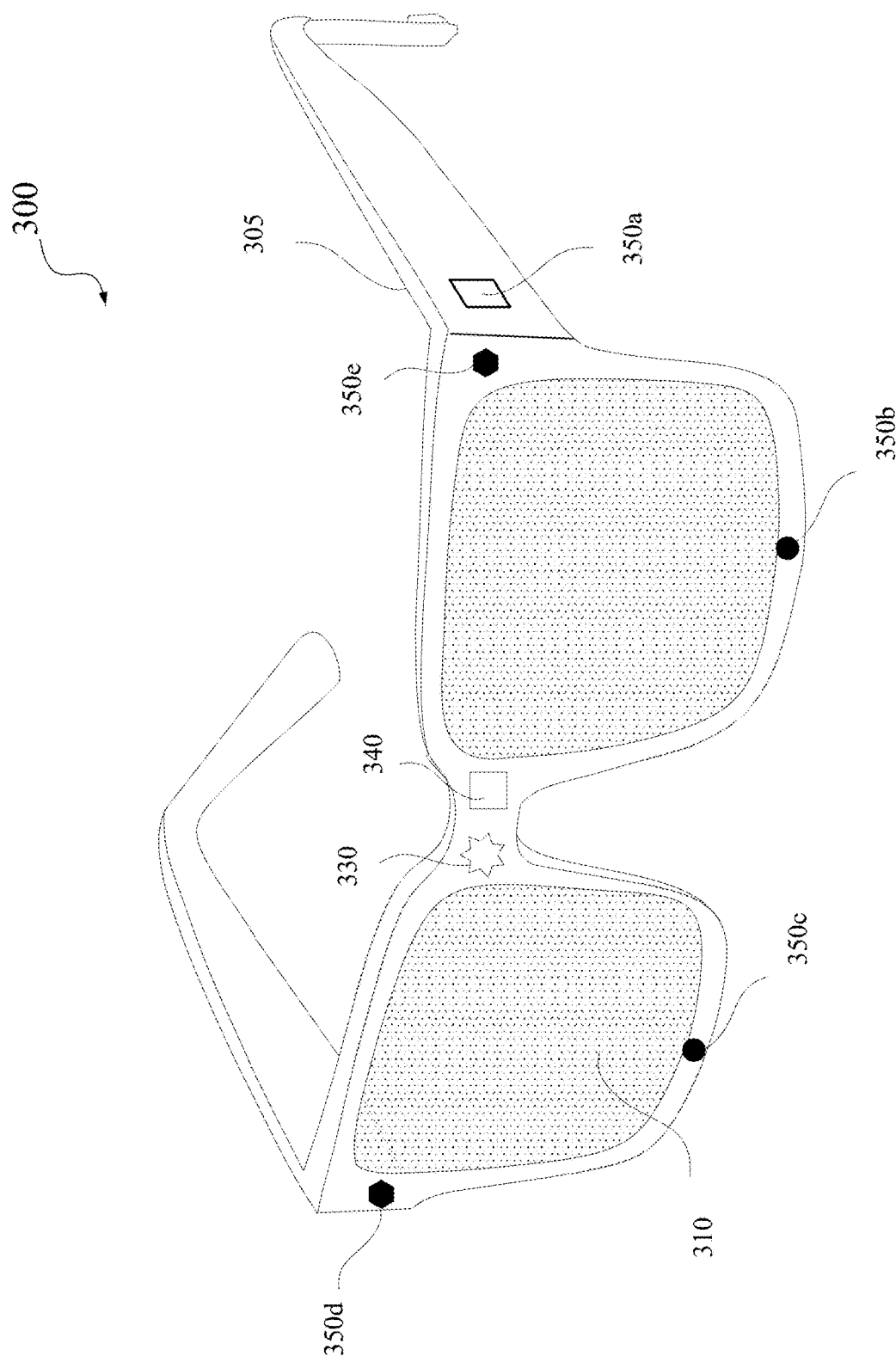
FIG. 2B is a perspective view of an example of a near-eye display in the form of a pair of glasses for implementing some of the examples disclosed herein.

FIG. 2B is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

In some examples, near-eye display 300 may include one or more reconstituted semiconductor components such as described herein.

Figure 3:
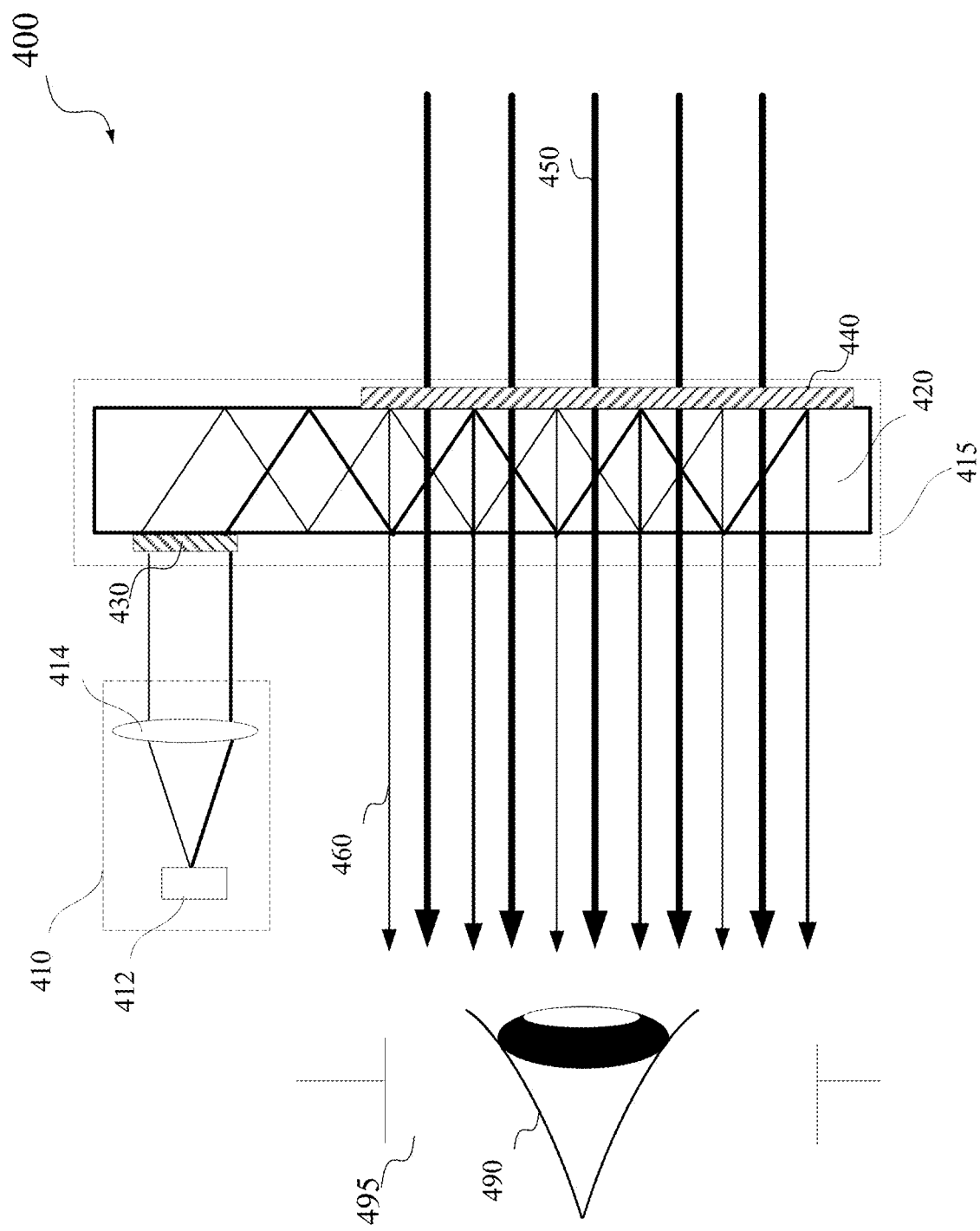
FIG. 3 illustrates an example of an optical see-through augmented reality system including a waveguide display, in accordance with the techniques described in this disclosure.

FIG. 3 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly (methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

In some examples, augmented reality system 400 may include one or more reconstituted semiconductor components such as described herein, e.g., image source 412 may include one or more reconstituted semiconductor components such as described herein.

FIG. 4A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 3. Coupler 532 may also couple portions of the light propagating within waveguide display 530 out of waveguide display 530 and towards user's eye 590.

In some examples, NED device 500 may include one or more reconstituted semiconductor components such as described herein, e.g., light source 510 may include one or more reconstituted semiconductor components such as described herein.

FIG. 4B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 3. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

In some examples, NED device 550 may include one or more reconstituted semiconductor components such as described herein, e.g., light source 540 may include one or more reconstituted semiconductor components such as described herein.

Figure 5:
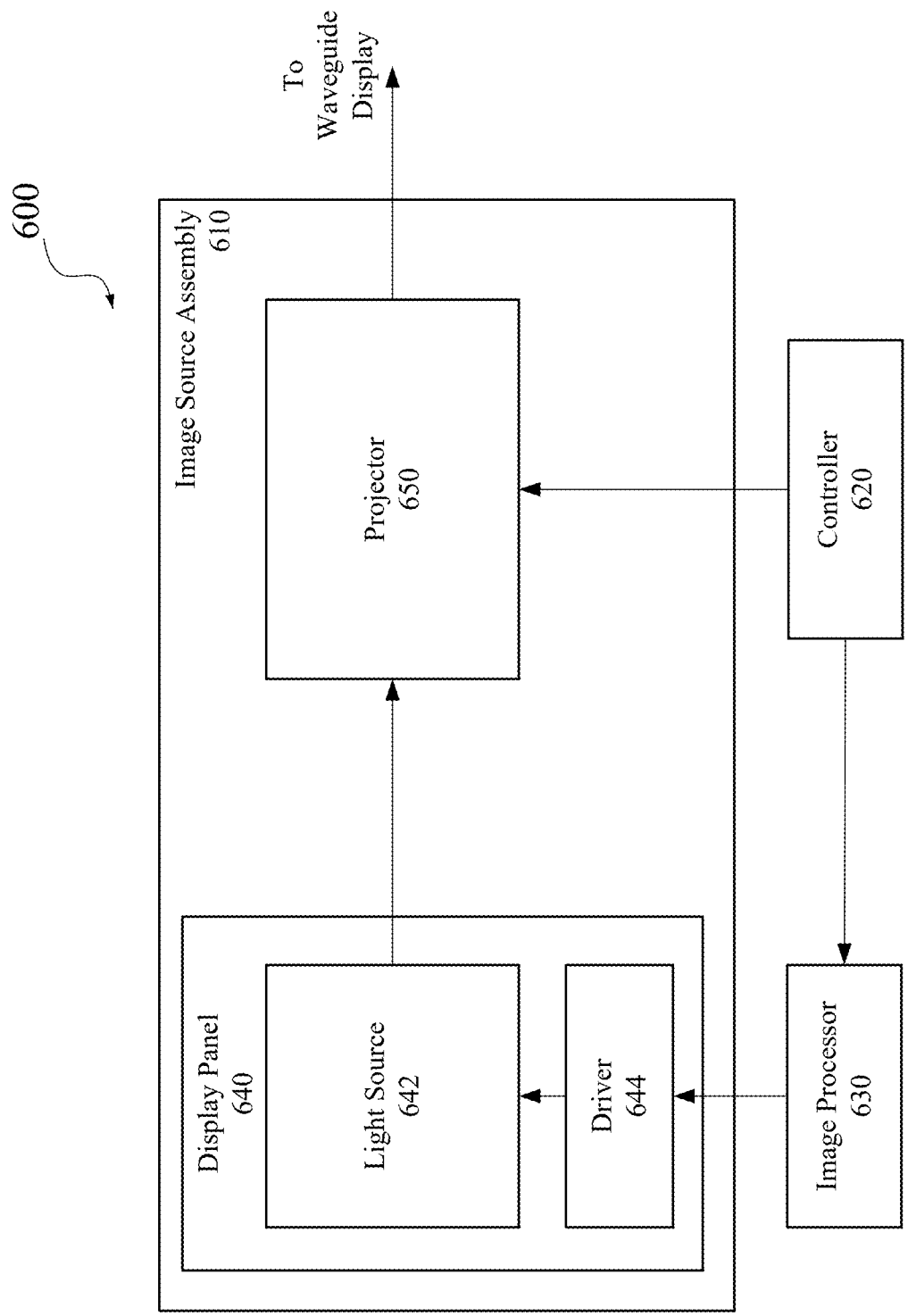
FIG. 5 illustrates an example of an image source assembly in an augmented reality system, in accordance with the techniques described in this disclosure.

FIG. 5 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 5), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 4B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 5 is shown as a standalone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 5, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

In some examples, near-eye display system 600 may include one or more reconstituted semiconductor components such as described herein, e.g., display panel 640 may include one or more reconstituted semiconductor components such as described herein.

In some examples, one or more reconstituted semiconductor components may include µLEDs and/or µLEDs arrays. The µLEDs and/or µLEDs arrays may include emissive µLED elements stacked on display driver circuitry and may be formed using any of the techniques described herein.

In some examples, µLED arrays may comprise an array of red, green, and blue µLEDs arranged, in any suitable subpixel arrangement. In other examples, µLED arrays may include separate red, green, and blue µLED arrays that may be combined before or after projection via projection optics and/or waveguide(s). In some examples, µLED arrays may be formed via reconstitution techniques and methods, as described further below with respect to FIGS. 6-24.

Figure 6:
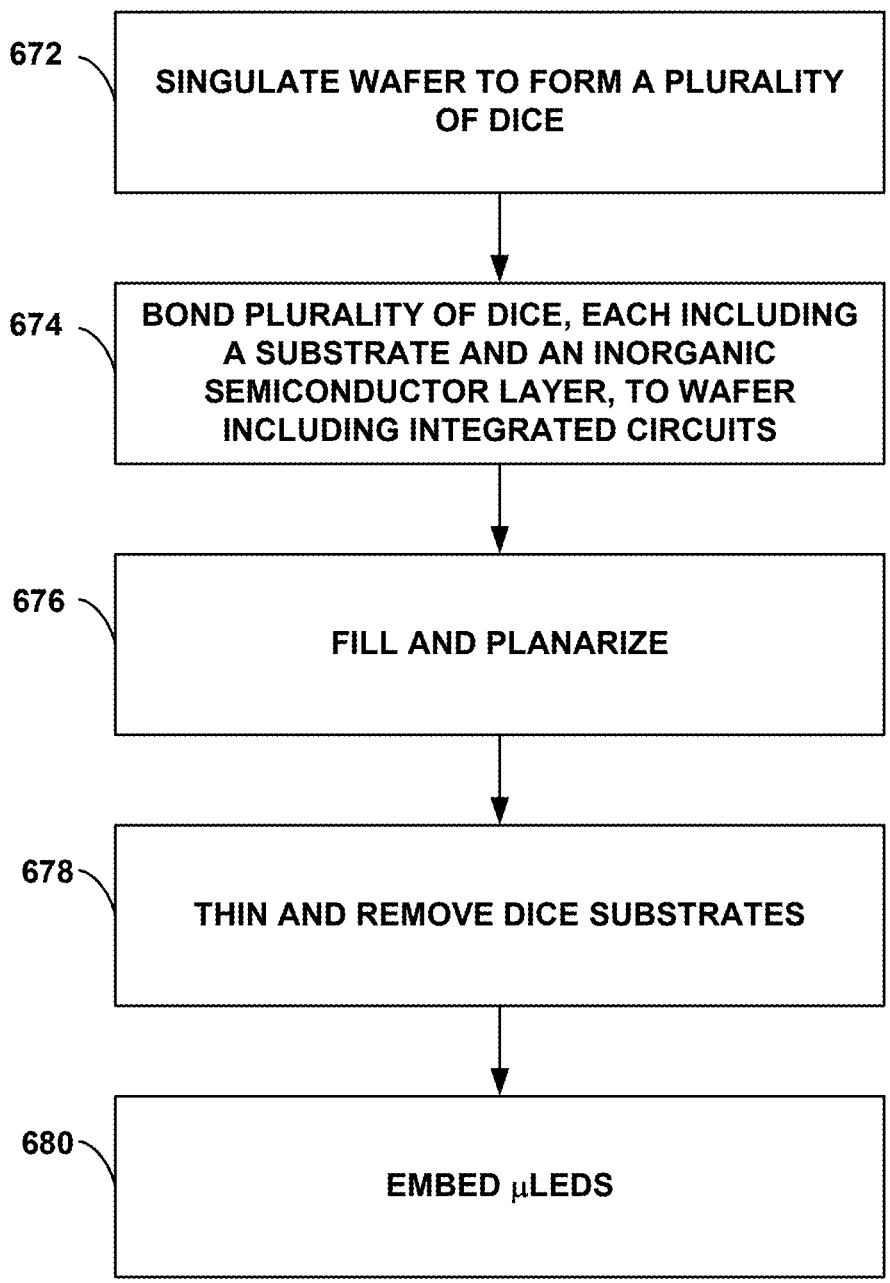
FIG. 6 is a flowchart of an example method for reconstituting a wafer, in accordance with the techniques described in this disclosure.
Figure 7:
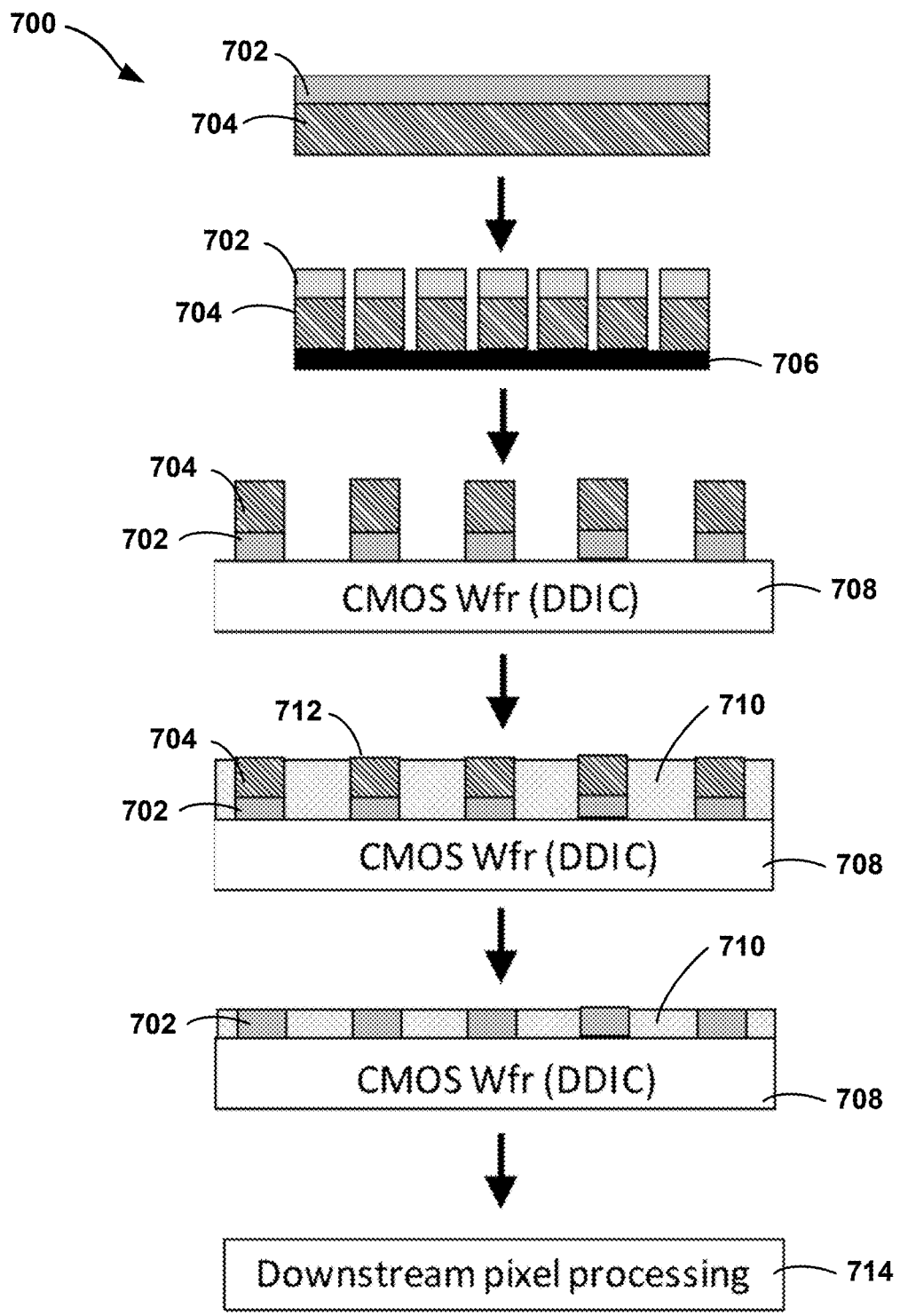
FIG. 7 is a schematic illustration of a wafer and inorganic semiconductor layer illustrating the method steps of FIG. 6, in accordance with the techniques described in this disclosure.

Stacked µLED and display driver circuits may be formed using wafer reconstitution techniques, as mentioned above. In some examples, the stacked µLED and display driver circuits may be formed by reconstituting dice on a wafer prior to forming µLED emissive elements. For example, FIGS. 6 and 7 illustrate an example method of reconstituting a wafer, e.g., integrating µLED dice with display driver circuitry, and will be described concurrently. FIG. 6 is a flowchart of an example method of reconstituting a wafer, in accordance with the techniques described in this disclosure. FIG. 7 is a schematic illustration of a semiconductor wafer 708 illustrating the method steps of FIG. 6, in accordance with the techniques described in this disclosure.

The technique of FIG. 6 includes singulating a wafer 700 to form a plurality of dice (672). Wafer 700 may include a substrate 704 and an inorganic semiconductor layer 702 on substrate 704. Substrate 704 may include any suitable material configured to support and allow formation of inorganic semiconductor layer 702 on substrate 704. For example, substrate 704 may include silicon, sapphire, or the like. Inorganic semiconductor layer 702 may be an epitaxial layer, such as an epitaxial GaN layer, an epitaxial GaAs layer, an epitaxial InGaN, or an epitaxial InGaAs layer. Inorganic semiconductor layer 702 may include quantum wells, or multiple quantum wells, e.g., forming the bandgaps in the semiconductor for the generation of photons having a predetermined spectra, such as red, green, and/or blue. In some examples, µLED wafer 800 may be a 75 mm, 100 mm, 150 mm, 200 mm, or similar diameter wafer.

Singulating wafer 700 may cut wafer 700 into a plurality of dice. Each dice of the plurality of dice may include a portion of inorganic semiconductor layer 702 on a corresponding portion of substrate 704. During singulation, a frame layer 706 may be used for support of wafer 700 and the dice after singulation. In some examples, the singulated dice have a surface area of about 3 mm×4 mm, and a thickness of about 5 µm. In other examples, the singulated dice may be any other appropriate size and thickness.

Once wafer 700 has been singulated (672), individual dice may be bonded to a semiconductor wafer 708 that includes a plurality of integrated circuits (674). A plurality of dice may be bonded to semiconductor wafer 708 with spaces between adjacent dice. In particular, the surface of inorganic semiconductor layers 702 of respective dice is bonded to semiconductor wafer 708.

Semiconductor wafer 708 includes integrated circuitry, e.g., a plurality of integrated circuits. In some examples, each integrated circuit constitutes device driver integrated circuitry (DDIC) for communication and control of µLED arrays formed in inorganic semiconductor layers 702. In some examples, the integrated circuitry includes digital and analog circuitry. In some examples, wafer 708 is a complementary metal-oxide-semiconductor (CMOS) wafer, a bi-CMOS wafer, or any other architecture including digital and/or analog circuitry for communication and control of µLEDs.

The dice may be bonded to semiconductor wafer 708 so that a inorganic semiconductor layer 702 is bonded to a corresponding integrated circuit (e.g., for each integrated circuit in semiconductor wafer 708) The integrated circuits of semiconductor wafer 708 may have a surface area larger than the dice, for example, a 4 mm×5 mm area. In some examples, the integrated circuits of semiconductor wafer 708 include one or more electrical contacts on the surface of semiconductor wafer 808 to which the dice are bonded, which enabled electrical signals to pass between the integrated circuits and the corresponding inorganic semiconductor layer 702 (e.g., once μLEDs are formed in inorganic semiconductor layer 702).

In some examples, the surface of semiconductor wafer 708 and the surfaces of the dice, e.g., the surface of inorganic semiconductor layers 702 may be cleaned using chemical and/or mechanical means prior to bonding the dice to semiconductor wafer 708 (664). The dice may then be substantially aligned to the integrated circuits (e.g., to the electrical contacts of the integrated circuits) so as to form electrical connections between the μLEDs to be embedded in inorganic semiconductor layer 702 and the integrated circuitry, for example, by the formation of vias, in further downstream processing steps. In some examples, the bonding between inorganic semiconductor layer 702 and semiconductor wafer 708 may include metal-to-metal bonding (e.g., via annealing), oxide-to-oxide bonding (e.g., via annealing of surface oxide layers on semiconductor wafer 708 and inorganic semiconductor layer 702), or the like.

Once the plurality of dice has been bonded to semiconductor wafer 708, the volume between the dice bonded to CMOS wafer 708 may be filled with fill material 710 and the resulting structure planarized (676). Fill material 710 may be an organic material or an inorganic material. For example, fill material 710 may be an oxide or a dielectric polymer. Fill material may be deposited, spun, or otherwise disposed in the volume between the dice. The combination of substrates 704 and fill material 710 then may be planarized using grinding, polishing, chemical-mechanical polishing, or the like, so that the surfaces of substrates 704 and fill material 710 are substantially planar at surface 712.

Surface 712 then may be worked to thin fill material 710 and substantially remove substrates 704 (678). For example, surface 712 may be thinned using grinding, polishing, chemical mechanical polishing, or the like. Surface 712 may be thinned such that surfaces of inorganic semiconductor layers 702 are exposed.

Once the surfaces of inorganic semiconductor layers 702 have been exposed, μLEDs are embedded (e.g., patterned) in inorganic semiconductor layers 702 (680). Embedding of μLEDs may be done via lithography, or any appropriate method, and is referred to as downstream pixel processing 714 in FIG. 7. Embedding (680) results in an array of μLEDs on each of the dice. In this way, the technique of FIGS. 6 and 7 may result in a μLED stacked on and integrated with an underlying integrated circuit, such as device driver circuitry. This may enable space-efficient packaging of emissive μLED elements and corresponding device driver circuitry, which may benefit applications with stringent size requirements, such as HMDs.

Figure 8:
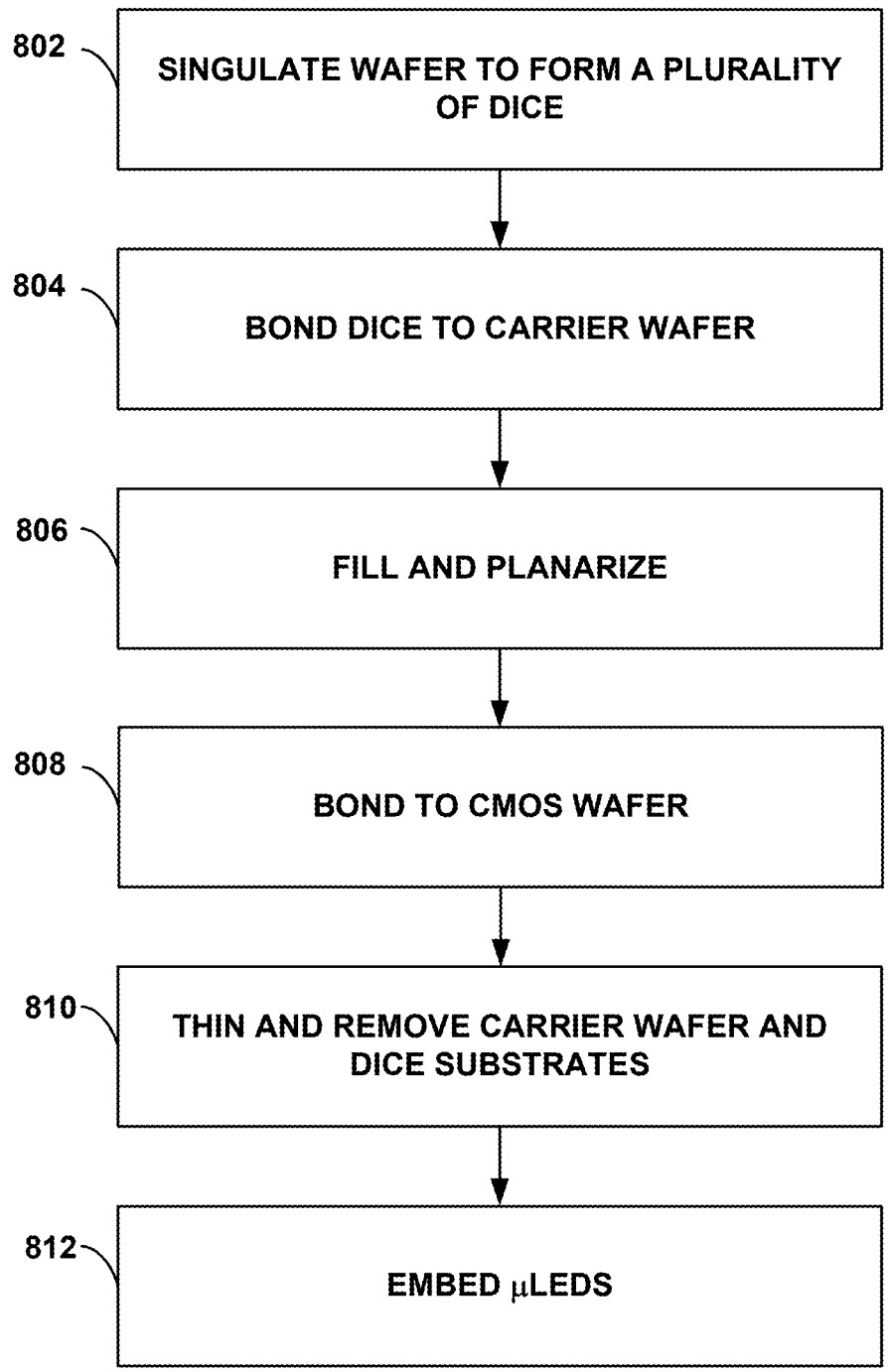
FIG. 8 is a flowchart of another example method for reconstituting a wafer, in accordance with the techniques described in this disclosure.
Figure 9:
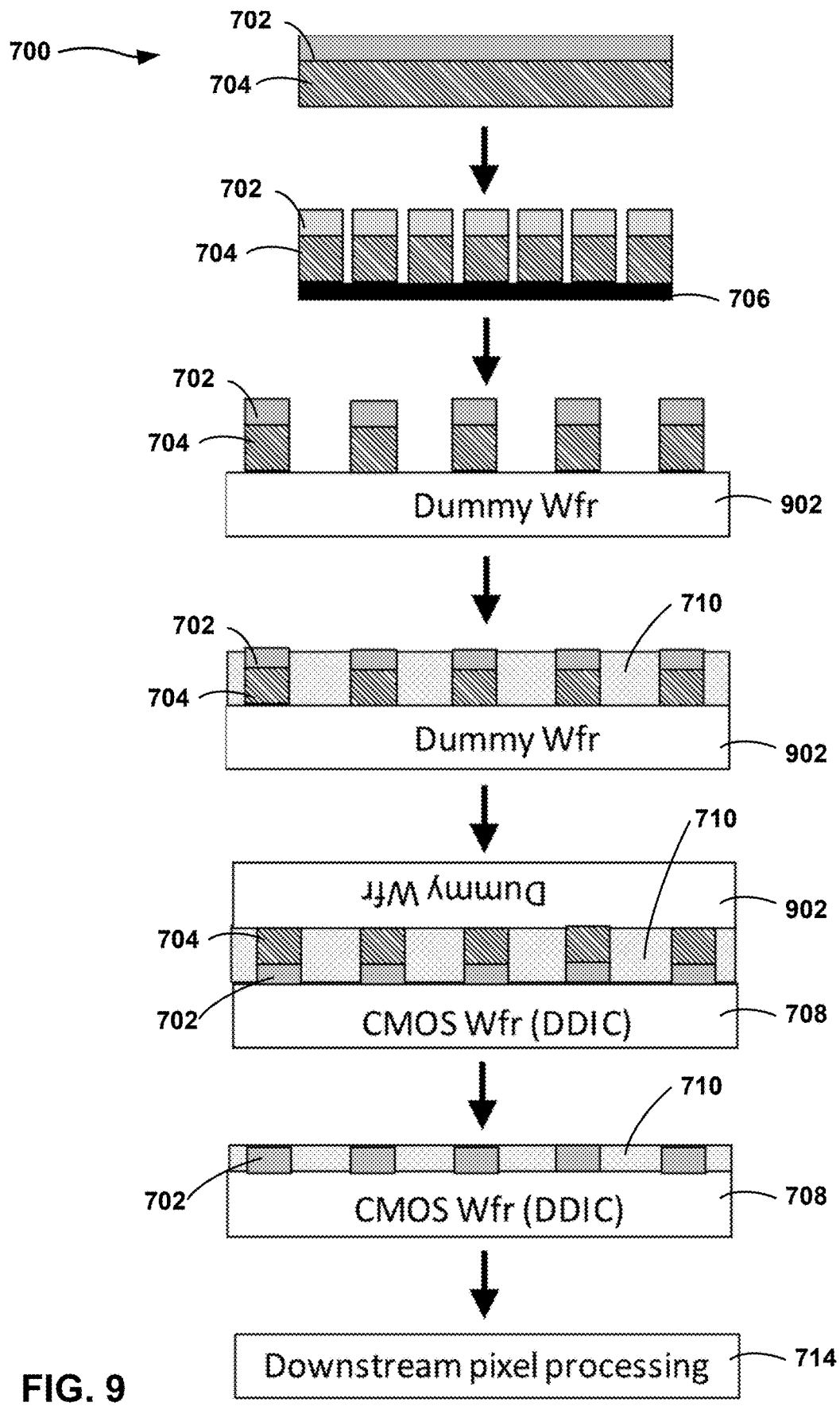
FIG. 9 is a schematic illustration of a wafer and inorganic semiconductor layer illustrating the method steps of FIG. 8, in accordance with the techniques described in this disclosure.

In other examples, rather than bonding individual dice directly to a semiconductor wafer to reconstitute a wafer, a plurality of dice may first be attached to a carrier wafer, then bonded to a semiconductor wafer. FIGS. 8 and 9 illustrate an example technique for reconstituting a wafer, e.g., integrating μLED dice with integrated circuitry, and will be described concurrently. FIG. 8 is a flowchart of an example method of reconstituting a wafer, in accordance with the techniques described in this disclosure. FIG. 9 is a schematic diagram illustrating the method steps of FIG. 8, in accordance with the techniques described in this disclosure.

Initially, a wafer 700 may be singulated into a plurality of dice (802). Wafer 700, substrate 704, inorganic semiconductor layer 702, and the singulating step (802) may be similar to or substantially the same as the corresponding structures illustrated in FIG. 7 and the corresponding step illustrated in FIG. 6.

Once wafer 700 has been singulated into a plurality of dice (802), multiple dice may be bonded to a carrier wafer or dummy wafer 902 (804). In particular, substrate 704 of each of the dice is bonded to carrier wafer 902. Carrier wafer 902 may be a silicon wafer, or any suitable material for bonding of the dice and subsequent thinning and removal at later processing steps. In some examples, the dice are positioned and bonded to carrier wafer 902 at locations that will correspond to the positions of a plurality of integrated circuits included in semiconductor wafer 708, such that each inorganic semiconductor layer 702 will be substantially aligned with a corresponding integrated circuit in semiconductor wafer 708. In some examples, carrier wafer 902 defines substantially the same diameter as semiconductor wafer 708, such as about 300 mm.

In some examples, prior to bonding the dice to carrier wafer 902 (804), the surfaces of substrates 704 and carrier wafer 902 may be cleaned. In some examples, the bonding between substrates 704 and carrier wafer 902 may be a metal-to-metal bond (e.g., using annealing), an oxide-to-oxide bond (e.g., using annealing), or both.

The spaces between adjacent dice then may be filled, and the fill material 710 and inorganic semiconductor layers 702 planarized (806). The fill material 710 may include, for example, and oxide or polymer. The planarizing may be accomplished using grinding, polishing, chemical-mechanical polishing, or the like. Fill material 710 may provide mechanical support for the dice during subsequent processing.

Once fill material 710 and inorganic semiconductor layers 702 are planarized (806), inorganic semiconductor layers 702 may be bonded to semiconductor wafer 708 (808). In some examples, wafer-to-wafer bonding techniques may be used, and cleaning of the surface may not be as important as in the technique of FIGS. 6 and 7. The bonding may use metal-to-metal bonding, oxide-to-oxide bonding, or the like. As describes above with reference to FIGS. 6 and 7, a respective inorganic semiconductor layer 702 may be bonded to each corresponding integrated circuit of semiconductor wafer 708.

Carrier wafer 902, substrates 704, and part of fill material 710 then may be thinned and removed (810). This step may be similar to or substantially the same as step (678) of FIG. 6.

Once the surfaces of inorganic semiconductor layers 702 have been exposed, μLEDs are embedded (e.g., patterned) in inorganic semiconductor layers 702 (812). Embedding of μLEDs may be done via lithography, or any appropriate method, and is referred to as downstream pixel processing 714 in FIG. 9. Embedding (812) results in an array of μLEDs on each of the dice. In this way, the technique of FIGS. 8 and 9 may result in a μLED stacked on and integrated with an underlying integrated circuit, such as device driver circuitry. This may enable space-efficient packaging of emissive μLED elements and corresponding device driver circuitry, which may benefit applications with stringent size requirements, such as HMDs. Additionally, compared to the technique of FIGS. 6 and 7, the bonding of inorganic semiconductor layers 702 to semiconductor wafer 708 may be simplified and may use less cleaning and preparation.

Figure 10:
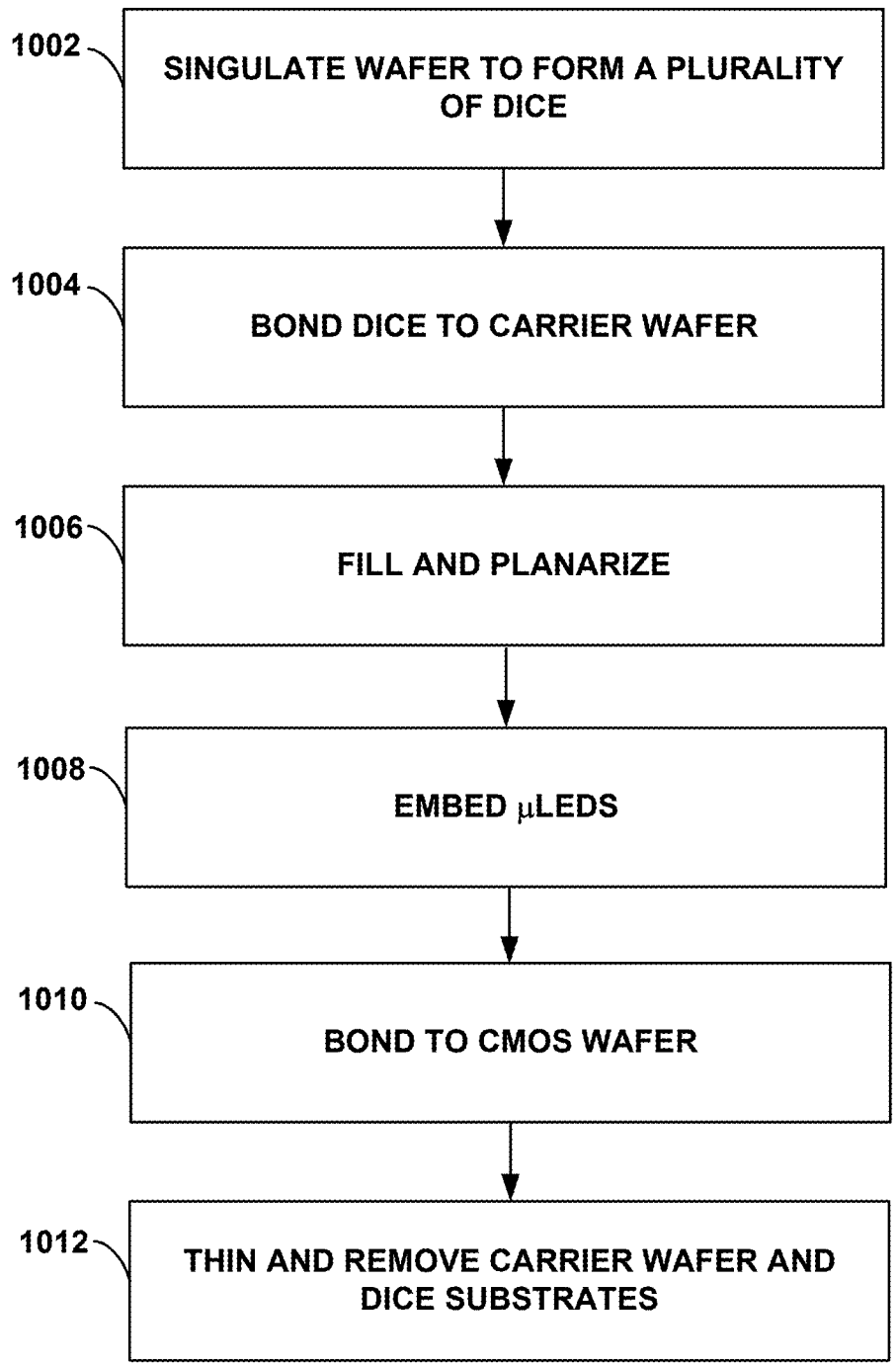
FIG. 10 is a flowchart of another example method for reconstituting a wafer, in accordance with the techniques described in this disclosure.
Figure 11:
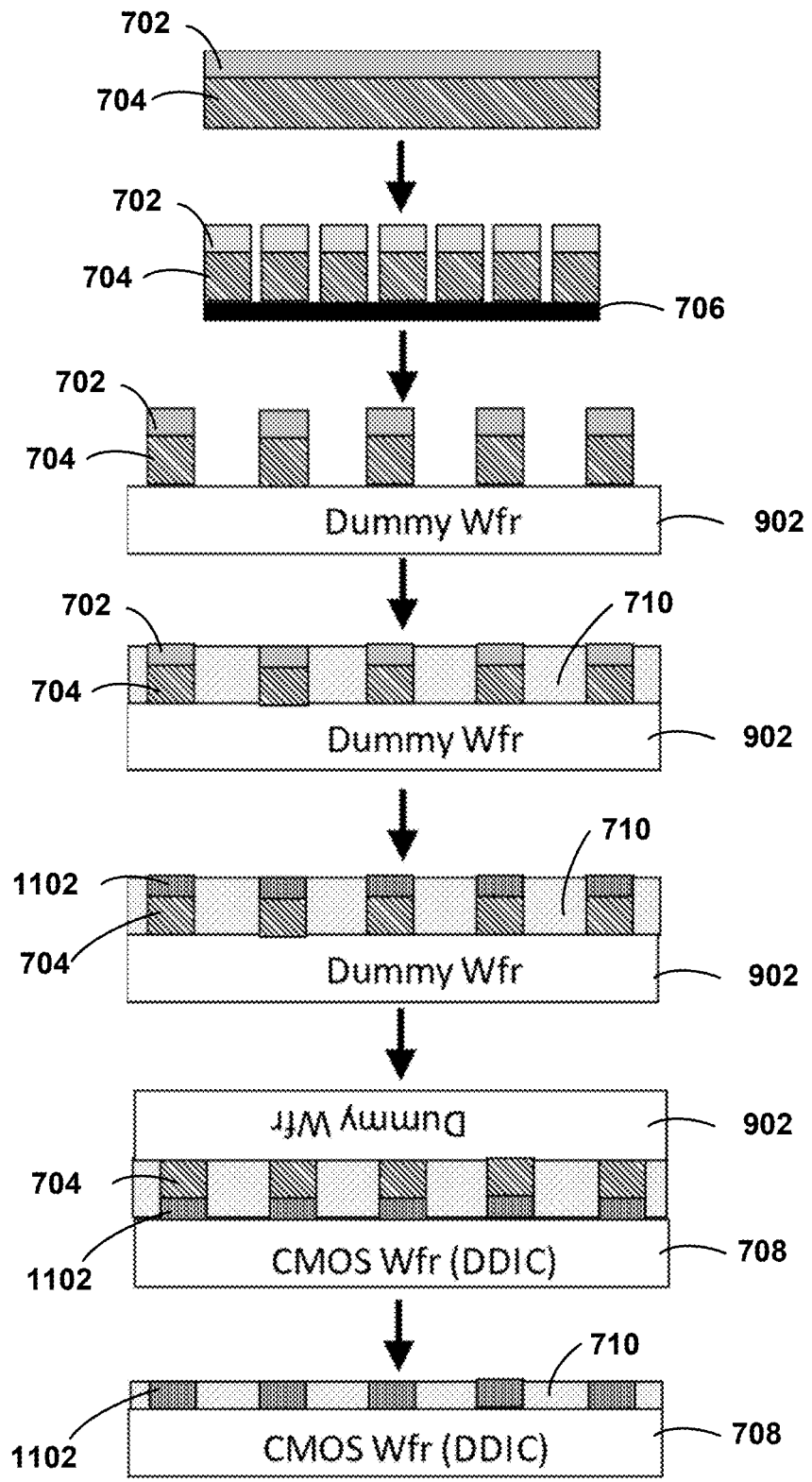
FIG. 11 is a schematic illustration of a wafer and inorganic semiconductor layer illustrating the method steps of FIG. 10, in accordance with the techniques described in this disclosure.

In some examples, rather than embedding μLEDs in inorganic semiconductor layers 702 after bonding inorganic semiconductor layers 702 to semiconductor wafer 708, μLEDs may be embedded in inorganic semiconductor layers 702 before bonding inorganic semiconductor layers 702 to semiconductor wafer 708. FIGS. 10 and 11 illustrate an example method for reconstituting a wafer, e.g., integrating μLED dice with integrated circuitry, and will be described concurrently. FIG. 10 is a flowchart of an example technique for reconstituting a wafer, in accordance with the techniques described in this disclosure. FIG. 11 is a schematic illustrating the method steps of FIG. 10, in accordance with the techniques described in this disclosure.

The steps of the technique of FIGS. 10 and 11 are substantially the same as the steps of the technique of FIGS. 8 and 9, but in a different order. In the technique of FIGS. 10 and 11, wafer 700 is singulated to form a plurality of dice (1002). Multiple dice are bonded to a carrier wafer (1004). A fill material 710 is then filled around the dice and the dice and fill material 710 are planarized (1006).

Once these steps are completed, μLEDs are embedded in inorganic semiconductor layers 702 (1008). As the surface of inorganic semiconductor layers 702 that will be bonded to semiconductor wafer 708 is exposed during the embedding of the μLEDs, the processing is done in reverse order, i.e., structures (e.g., conductive vias) that are adjacent to semiconductor wafer 708 are formed first. After the μLEDs are embedded in inorganic semiconductor layers 702 (1008), e.g., forming μLED embedded inorganic semiconductor layers 1102, the μLED embedded inorganic semiconductor layers 1102 are bonded to semiconductor wafer 708 (1010). Finally, carrier wafer 902, substrates 704, and part of fill material 710 may be thinned to expose surfaces of μLED embedded inorganic semiconductor layers 1102 (1012).

Figure 12:
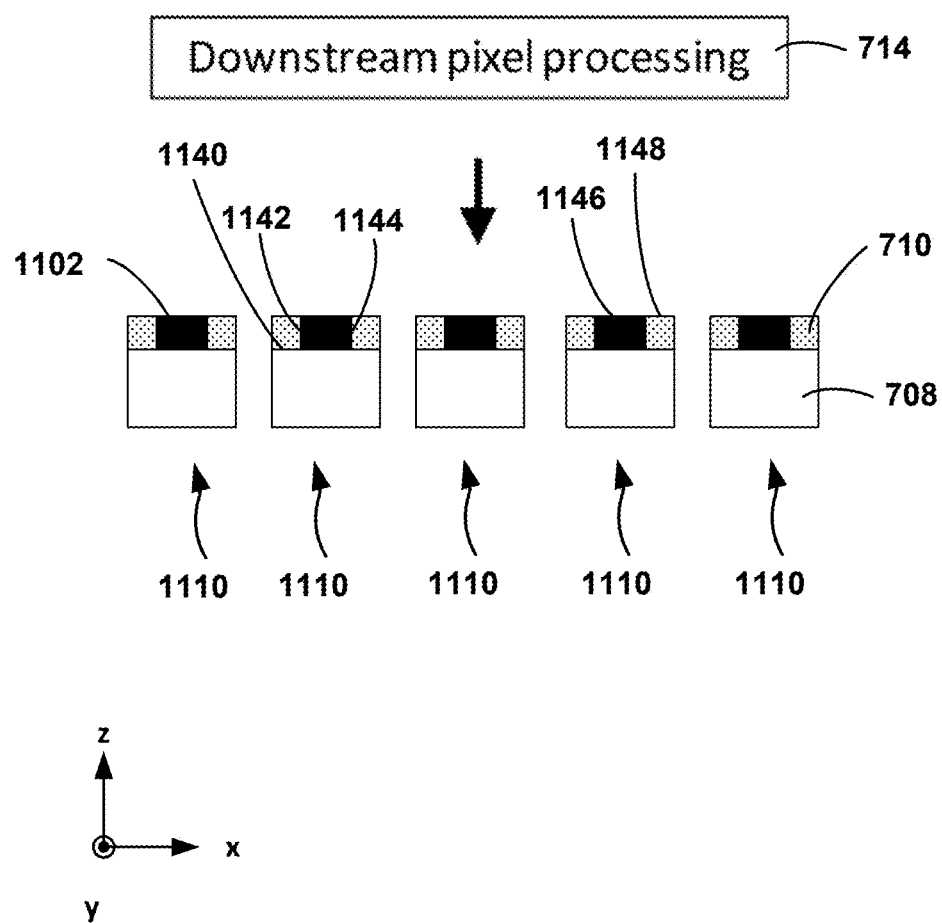
FIG. 12 is a schematic illustration of stacked dice including a μLED array on an integrated circuit after wafer reconstitution according to any of the example methods of FIGS. 6-11, in accordance with the techniques described in this disclosure.

FIG. 12 is a schematic illustration of stacked dice including a μLED array on an integrated circuit after wafer reconstitution according to any of the example methods of FIGS. 6-11, in accordance with the techniques described in this disclosure. In any of the techniques of FIGS. 6-11, once the μLEDs have been embedded in inorganic semiconductor layers 702, semiconductor wafer 708 including integrated μLED arrays may be singulated to form stacked dice 1110 including a μLED array, e.g., μLED embedded inorganic semiconductor layers 1102, on an integrated circuit, such as device driver circuitry. In the example shown, following μLED embedding at steps (680) or (812), or thinning and removal of the carrier wafer and dice substrates at step (1012), any of the wafer reconstitution techniques of FIGS. 6-11 may result in the formation of stacked dice 1110 including a μLED array.

In the example shown, each of stacked dice 1110 include semiconductor wafer 708 which may include integrated circuitry, e.g., at least one integrated circuit, μLED embedded inorganic semiconductor layers 1102 and fill material 710. In some examples, because the inorganic semiconductor layers 702 (before μLED embedding) and/or μLED embedded inorganic semiconductor layers 1102 are bonded to semiconductor wafer 708 before singulating to form stacked dice 1110, semiconductor layers 1102 extend beyond μLED embedded inorganic semiconductor layers 1102, e.g., in the x-y directions as shown. For example, surface 1140 of semiconductor wafer 708 extends beyond edge 1142 of μLED embedded inorganic semiconductor layers 1102, and in the example shown also extends beyond edge 1144 of μLED embedded inorganic semiconductor layers 1102, e.g., in the x-direction. In some examples, surface 1140 of semiconductor wafer 708 may extend beyond the edge of μLED embedded inorganic semiconductor layers 1102 in the y-direction as well, e.g., beyond a first edge (not shown) of μLED embedded inorganic semiconductor layers 1102 in the positive y-direction and beyond a second edge of μLED embedded inorganic semiconductor layers 1102 in the negative y-direction. In some examples, edges 1142, 1144 of μLED embedded inorganic semiconductor layers 1102, as well as the other edges of μLED embedded inorganic semiconductor layers 1102 in the x-z plane (not shown in the cross-sectional view of FIG. 12), may be substantially perpendicular to surface 1140 of semiconductor wafer 708.

In some examples, fill material 710 may fill the volume above surface 1140 (e.g., in the positive z-direction from surface 1140) extending to the thickness of μLED embedded inorganic semiconductor layers 1102 and extending from edges 1142, 1144 (and the other edges in the x-z plane) to the width of surface 1140. In other words, each of stacked dice 1110 may include fill material 710 disposed on surface 1140 of semiconductor wafer 708 and contacting and extending beyond at least one of edges 1142, 1144, or the other edges of μLED embedded inorganic semiconductor layers 1102 in the x-z plane. In some examples, fill material 710 may be substantially coplanar with the top (e.g., in the positive z direction) surface of μLED embedded inorganic semiconductor layers 1102. In other words, surface 1148 of fill material 710 may be substantially coplanar with major surface 1146 of μLED embedded inorganic semiconductor layers 1102. In some examples, edges 1142, 1144 of μLED embedded inorganic semiconductor layers 1102, as well as the other edges of μLED embedded inorganic semiconductor layers 1102 in the x-z plane (not shown in the cross-sectional view of FIG. 12), may be substantially perpendicular to major surface 1144 of μLED embedded inorganic semiconductor layers 1102 and surface 1148 of fill material 710.

Figure 13:
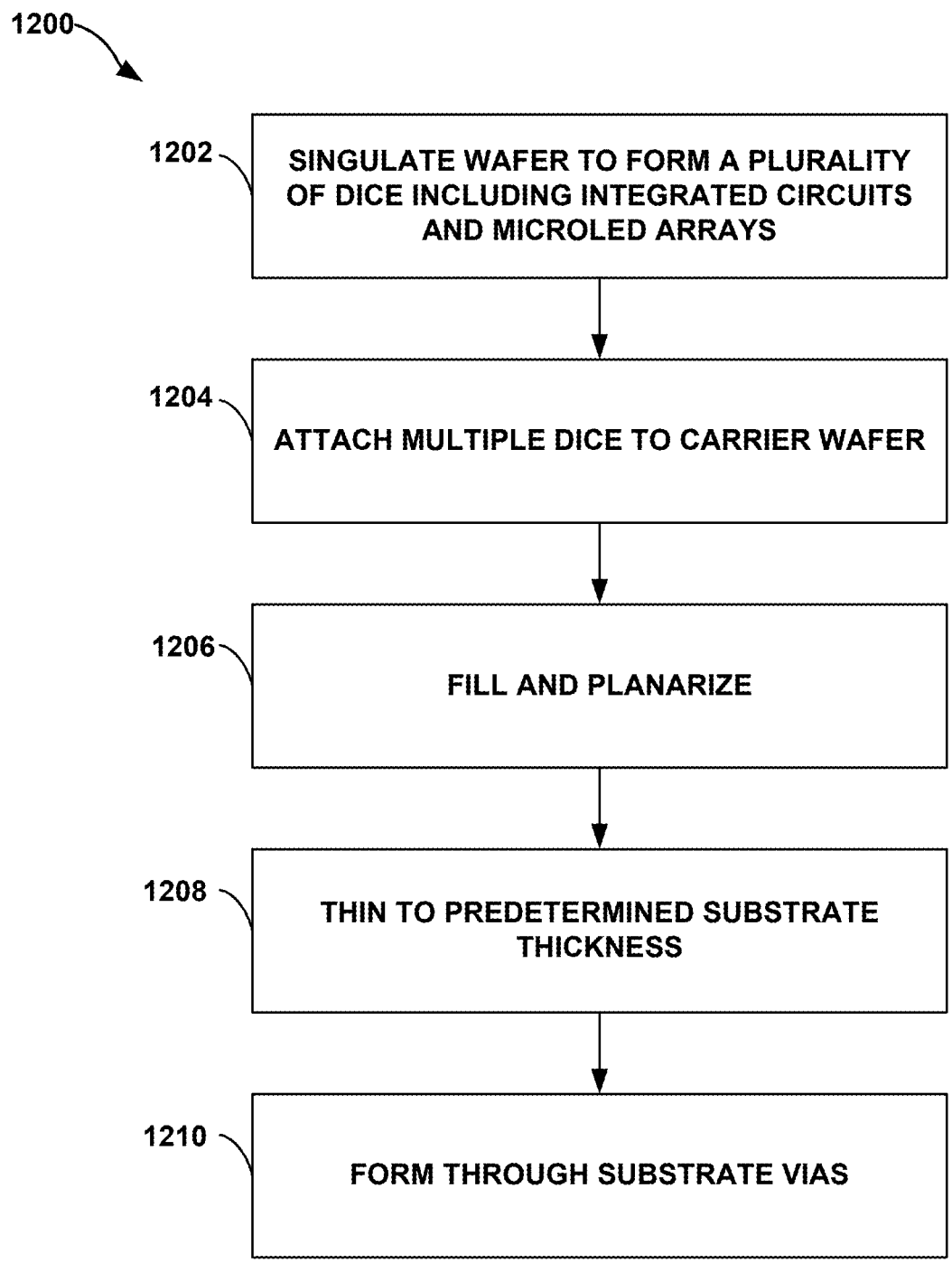
FIG. 13 is a flowchart of another example method for reconstituting a wafer, in accordance with the techniques described in this disclosure.
Figure 14:
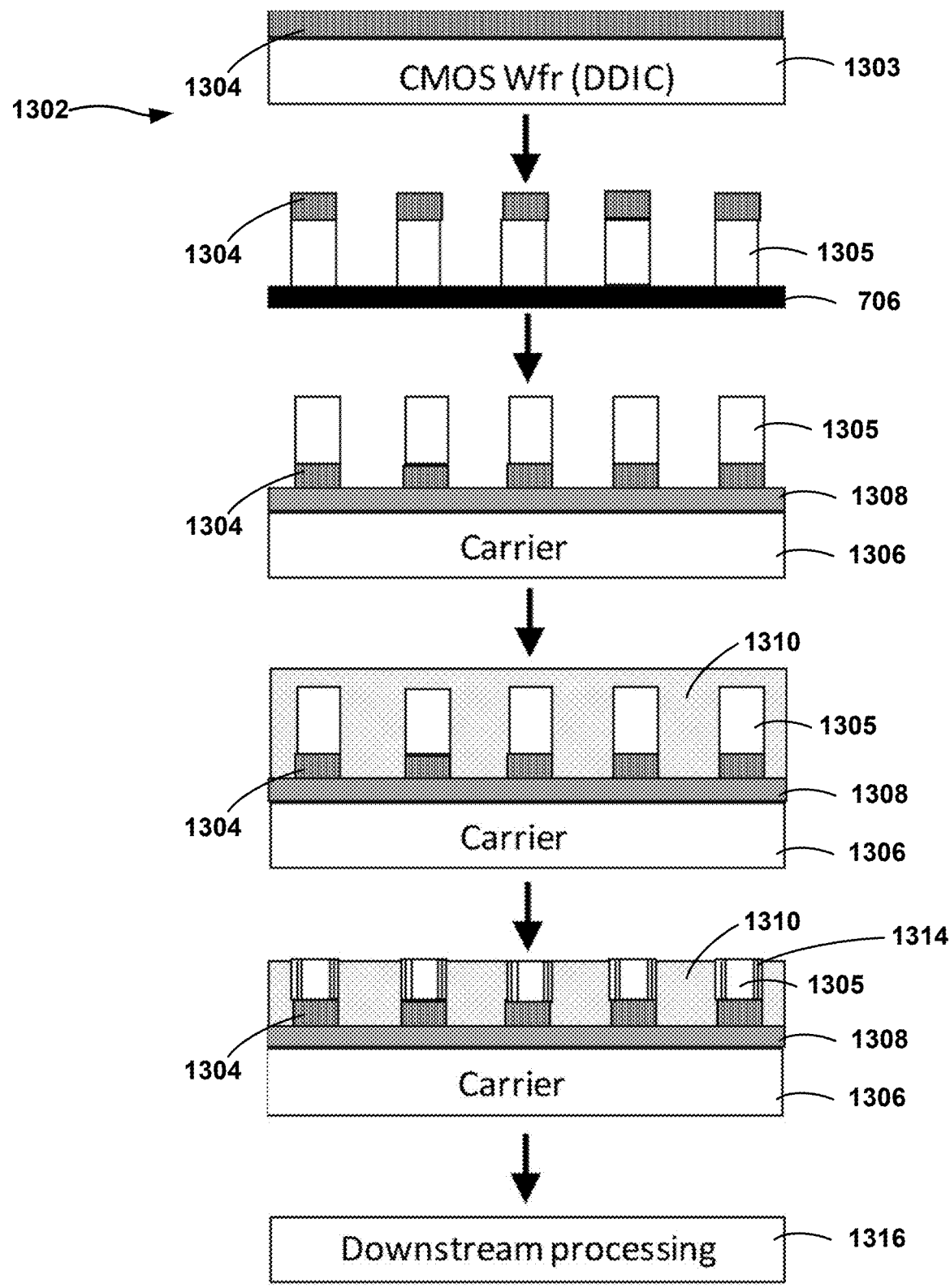
FIG. 14 is a process diagram illustrating an example wafer having an embedded pixel array layer as processed during the method steps of FIG. 13, in accordance with the techniques described in this disclosure.

In some examples, rather than reconstituting a wafer prior to forming μLED arrays, a wafer may be reconstituted after forming μLED arrays on a semiconductor wafer. FIGS. 13 and 14 illustrate an example method of reconstituting a wafer, e.g., integrating μLED dice with digital/analog circuitry, and will be described concurrently. FIG. 13 is a flowchart of an example method 1200 for reconstituting a wafer, in accordance with the techniques described in this disclosure. FIG. 14 is a schematic illustration of a wafer 1302 throughout the processing steps of FIG. 13, in accordance with the techniques described in this disclosure.

The technique of FIGS. 13 and 14 includes singulating a wafer 1302 that includes a plurality of integrated circuits and a plurality of μLED arrays into a plurality of dice (1202). During the singulation process, wafer 1302 and the singulated dice may be supported by a frame layer 706. The integrated circuits may be part of a semiconductor wafer 1303. Semiconductor wafer 1303 may be similar to or substantially the same as semiconductor wafer 708 described above with reference to FIG. 7. The plurality of μLED arrays may be part of an embedded pixel array layer 1304. Embedded pixel array layer 1304 may include an inorganic semiconductor layer, such as GaN, GaAs, InGaN, InGaAs, or the like. Each singulated die includes an integrated circuit and a μLED array stacked on and integrated with the integrated circuit. Like the integrated circuits described above, the integrated circuits may include analog and/or digital circuits, such as device driver circuitry for the μLED array. In some examples, a μLED array may be on a corresponding integrated circuit. In some examples, each singulated die includes one or more I/O contacts which may be integrated with the integrated circuits and be configured to be electrically connected to one or more TSV.

Wafer 1302 may define a diameter smaller than 300 mm, such that wafer 1302 cannot be processed using 300 mm processing equipment. For example, wafer 1302 may be a 75 mm, 100 mm, 150 mm, 200 mm, or similar diameter wafer. In some examples, wafer 1302 may be formed by coring a larger semiconductor wafer to remove an outer annulus of the larger semiconductor layer. In some examples, embedded pixel array layer 1304 may have a nominal thickness of about 5 µm, and semiconductor wafer 1303 may have a nominal thickness of about 780 µm. In some examples, semiconductor wafer 1303 may be thinned before singulation of wafer 1302. For example, semiconductor wafer 1303 may be thinned using mechanical grinding, mechanical polishing, chemical mechanical polishing, or the like. In some examples, semiconductor wafer 1303 may be thinned from its nominal thickness, e.g., 780 µm, to a nominal thickness of about 500 µm. In some examples, thinning of semiconductor wafer 1303 may reduce bow during wafer reconstitution method 1200.

Multiple singulated dice may be attached to a carrier wafer 1306 (1204). In the example shown, µLED arrays are attached to carrier wafer 1306, e.g., via a temporary adhesive 1308. In some examples, carrier wafer 1306 may be sized to be compatible with semiconductor processing techniques. For example, carrier wafer 1306 may have a 300 mm diameter. As described above with respect to semiconductor wafer 708 of FIGS. 6-11, semiconductor 1303 may similarly include a plurality of integrated circuits, such as analog and/or digital circuits. In some examples, carrier wafer 1306 may be silicon, and in some examples carrier wafer 1306 may be a glass.

In some examples, the individual singulated dice 1305 may be thinned after singulation, e.g., after attachment to carrier wafer 1306. For example, if semiconductor wafer 1303 has not been thinned before singulation and attachment of the singulated dice 1305 to carrier wafer 1306, the semiconductor wafer material of the individual dice 1305 may be thinned from its nominal thickness, e.g., 780 µm, to a nominal thickness of about 500 µm, via mechanical grinding or polishing, or chemical mechanical grinding, similar to as described above. In some examples, thinning of the semiconductor wafer material of the individual dice may reduce bow during wafer reconstitution method 1200.

Once the multiple singulated dice are attached to carrier wafer 1306, a fill material 1310 may be deposited around the singulated dice to fill a volume between adjacent singulated dice with fill material 1310 (1206). Fill material 1310 may be an oxide, a polymer, or the like. In some examples, fill material 1310 may have a thickness that extends beyond the dice and may encapsulate the dice.

Fill material 1310 and semiconductor wafers 1303 then may be thinned and planarized (1208). Thinning and planarizing may include mechanical grinding, mechanical polishing, chemical mechanical polishing, or the like. Fill material 1310 and semiconductor dice 1305 may be thinned to a predetermined thickness (1208). Fill material 1310 and semiconductor dice 1305 may be thinned using mechanical grinding, mechanical polishing, chemical mechanical polishing, or the like. The predetermined thickness may be for example, about 150 micrometers. Surfaces of semiconductor dice 1305 may be exposed after the thinning.

Through substrate vias 1314 then may be formed in each of the plurality of semiconductor dice 1305 (1210). For example, through substrate vias 1314 may be formed via semiconductor processing techniques for forming through silicon vias. In some examples, the through substrate vias provide I/O connection points to the integrated circuits, and/or µLED arrays, and/or individual µLEDs, and may be connected to the one or more I/O contacts. Additionally, method 1200 may include coating a thin protective layer on exposed die surfaces and sidewalls of the wafer during TSV formation, as further illustrated and described below with respect to method 1600 and FIGS. 18 and 19.

Figure 15:
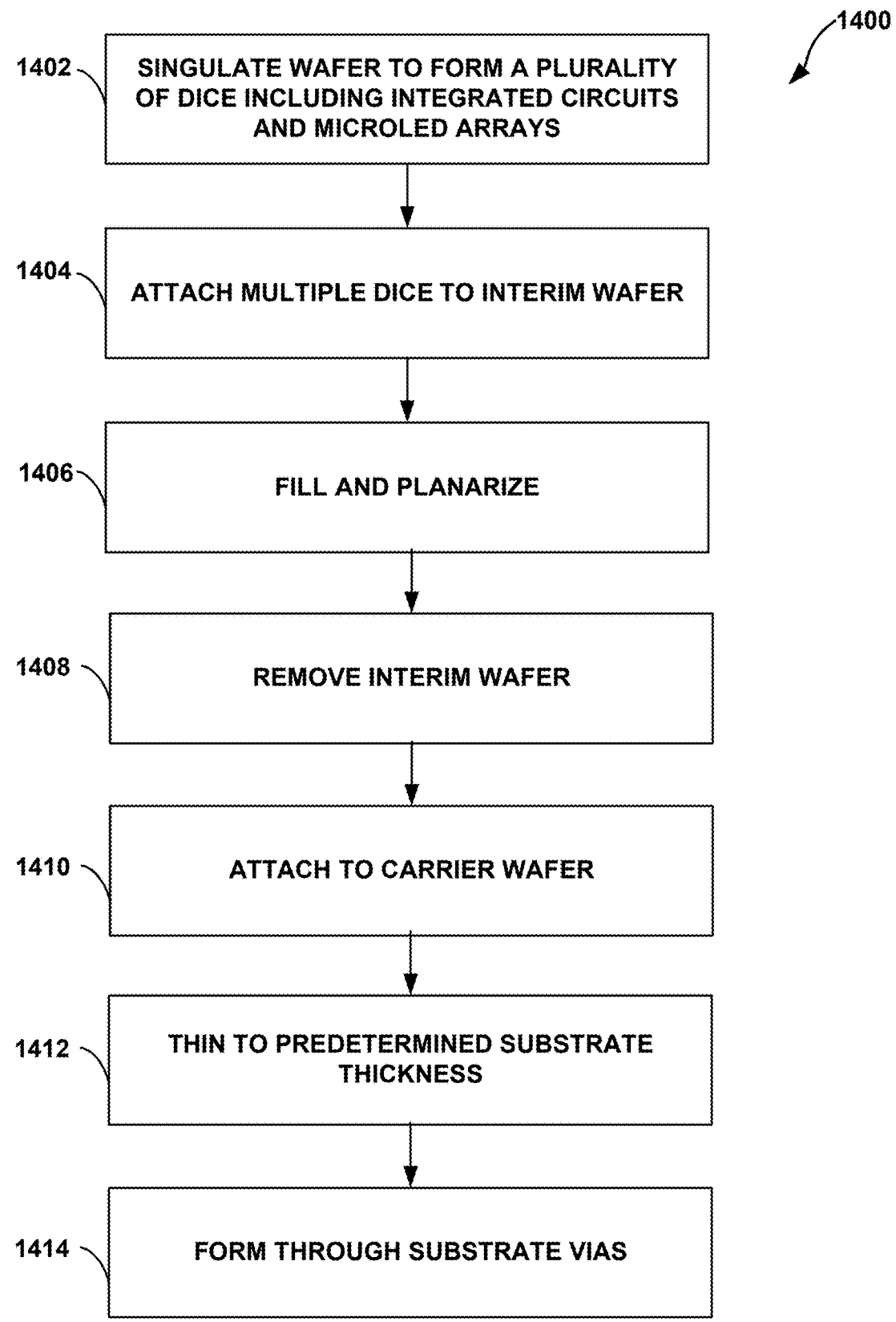
FIG. 15 is a flowchart of another example method for reconstituting a wafer, in accordance with the techniques described in this disclosure.
Figure 16:
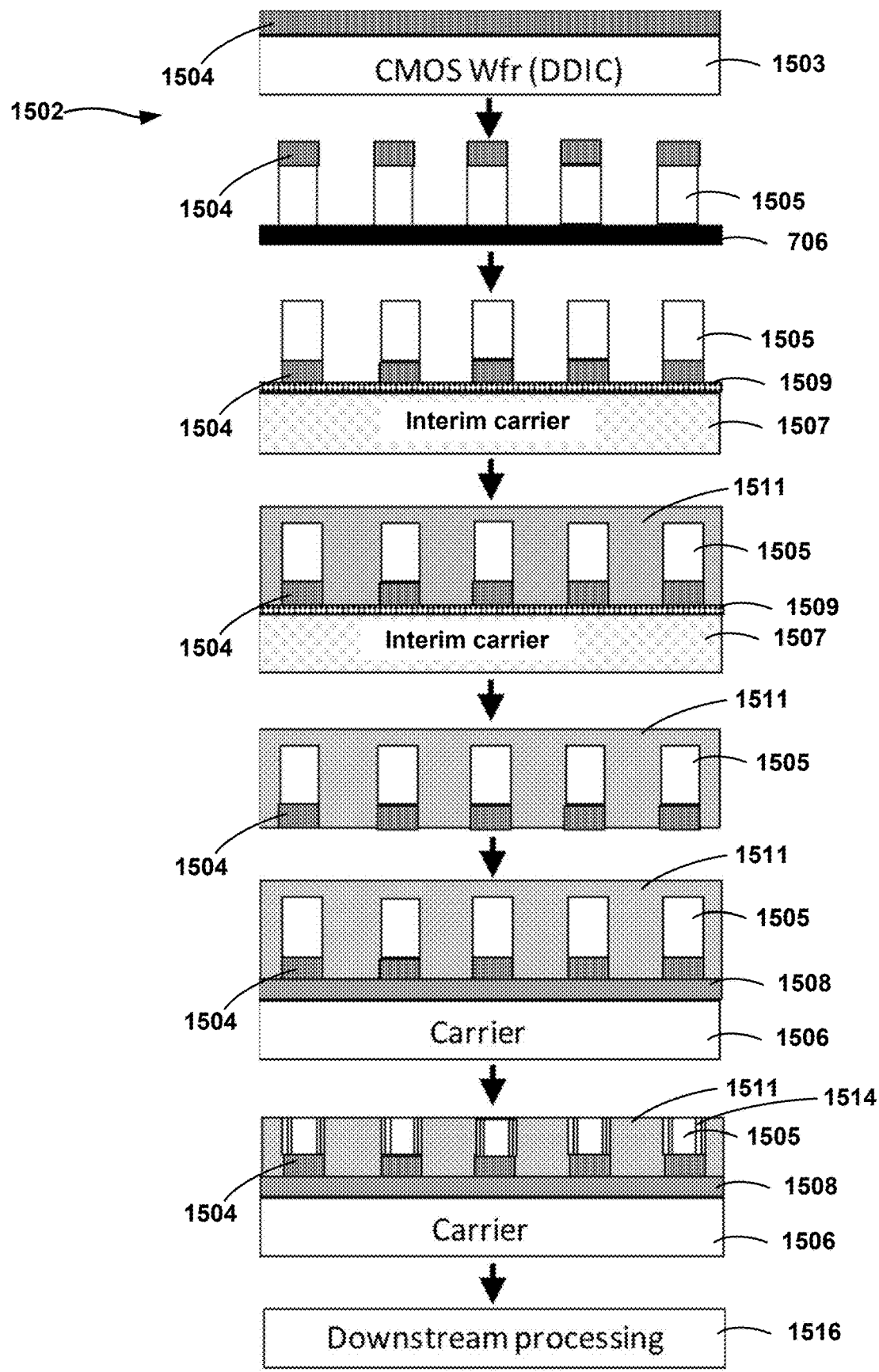
FIG. 16 is a process diagram illustrating an example wafer having an embedded pixel array layer as processed during the method steps of FIG. 15, in accordance with the techniques described in this disclosure.

FIGS. 15 and 16 illustrate another example method 1400 of reconstituting a wafer, e.g., integrating µLED dice with digital/analog circuitry, and will be described concurrently. FIG. 15 is a flowchart of an example method 1400 for reconstituting a wafer, in accordance with the techniques described in this disclosure. FIG. 16 is a schematic illustration of a wafer 1502 throughout the processing steps of FIG. 15, in accordance with the techniques described in this disclosure.

The technique of FIGS. 15 and 16 includes singulating a wafer 1502 that includes a plurality of integrated circuits and a plurality of µLED arrays into a plurality of singulated dice 1505 (1402). During the singulation process, wafer 1502 and the singulated dice 1505 may be supported by a frame layer 706. The integrated circuits may be part of a semiconductor wafer 1503. Semiconductor wafer 1503 may be similar to or substantially the same as semiconductor wafer 708 described above with reference to FIG. 7. The plurality of µLED arrays may be part of an embedded pixel array layer 1504. Embedded pixel array layer 1504 may include an inorganic semiconductor layer, such as GaN, GaAs, InGaN, InGaAs, or the like. Each singulated die 1505 includes an integrated circuit and a µLED array stacked on and integrated with the integrated circuit. Like the integrated circuits described above, the integrated circuits may include analog and/or digital circuits, such as device driver circuitry for the µLED array. In some examples, a µLED array may be on a corresponding integrated circuit. In some examples, each singulated die includes one or more I/O contacts which may be integrated with the integrated circuits and be configured to be electrically connected to one or more TSV.

Wafer 1502 may define a diameter smaller than 300 mm, such that wafer 1502 cannot be processed using 300 mm processing equipment. For example, wafer 1502 may be a 75 mm, 100 mm, 150 mm, 200 mm, or similar diameter wafer. In some examples, wafer 1502 may be formed by coring a larger semiconductor wafer to remove an outer annulus of the larger semiconductor wafer. In some examples, embedded pixel array layer 1504 may have a nominal thickness of about 5 µm, and semiconductor wafer 1503 may have a nominal thickness of about 780 µm. In some examples, semiconductor wafer 1503 may be thinned before singulation of wafer 1502. For example, semiconductor wafer 1503 may be thinned using mechanical grinding, mechanical polishing, chemical mechanical polishing, or the like. In some examples, semiconductor wafer 1503 may be thinned from its nominal thickness, e.g., 780 µm, to a nominal thickness of about 500 µm. In some examples, thinning of semiconductor wafer 1503 may reduce bow during wafer reconstitution method 1400.

Multiple singulated dice 1505 may be attached to an interim carrier 1507 (1404). In the example shown, embedded pixel array layers 1504 are attached to interim carrier 1507, e.g., via an adhesive 1509. In some examples, interim carrier 1507 may be sized to be compatible with semiconductor processing techniques, e.g., interim carrier 1507 may have a 300 mm diameter. In some examples, interim carrier 1507 may be silicon, and in other examples interim carrier may be a material that is harder and has increased stability, e.g., dimensional and/or temperature stability, as compared to silicon. For example, interim carrier 1507 may be a metal such as copper.

In some examples, adhesive 1509 may be a relatively thin layer of adhesive, e.g., about less than 200 μm, or less than about 150 μm, or less than about 100 μm, or less than about 50 μm. In some examples, adhesive 1509 is configured to exhibit reduce deformation such as tilt and/or shift of singulated dice 1505 during die placement and process, e.g., during attachment of singulated dice 1505 to interim carrier 1507 and/or during filling and planarizing (1406). For example, adhesive 1509 may have a thickness of less than 10 μm, e.g., for a relatively soft adhesive 1509. In other examples, adhesive 1509 may have a thickness of up to 50 μm, e.g., for a relatively rigid adhesive 1509. In some examples, adhesive 1509 may be an acrylic adhesive, such as an acrylic adhesive available under the trade designation 3M™ Liquid UV-Curable adhesive, e.g., a 3M Wafer Support System LC series adhesive. In some examples, adhesive 1509 may be a Sekisui SELFA HS tape and/or Sekisui SELFA SE tape, and the like. In still other examples, adhesive 1509 may be a Loctite® Ablestik ATB series adhesive film, or a Brewer Science BrewerBOND® series adhesive.

In some examples, the plurality of dice may be bonded to interim wafer 1507 with spaces between adjacent dice. In some examples, embedded pixel array layers 1504 may be attached to interim wafer 1507 via a face down fan-out process.

In some examples, the individual singulated dice 1505 may be thinned after singulation, e.g., after attachment to interim wafer 1507. For example, if semiconductor wafer 1503 has not been thinned before singulation and attachment of the singulated dice 1505 to interim carrier 1507, the semiconductor wafer material of the individual dice 1505 may be thinned from its nominal thickness, e.g., 780 μm, to a nominal thickness of about 500 μm, via mechanical grinding or polishing, or chemical mechanical grinding, similar to as described above. In some examples, thinning of the semiconductor wafer material of the individual dice may reduce bow during subsequent steps of wafer reconstitution method 1400.

Once the multiple singulated dice 1505 are attached to interim wafer 1507, a fill material 1511 may be deposited around the singulated dice 1505 to fill a volume between adjacent singulated dice 1505 with fill material 1511 (1406). Fill material 1511 may be a polymer, or the like. In some examples, fill material 1511 may have a thickness that extends beyond the dice and may encapsulate the dice. In some examples, fill material 1511 may be deposited via a molding process and may be a mold material. For example, fill material 1511 may be dispensed, e.g., via a nozzle and/or a liquid dispensing needle.

In some examples, fill material 1511 may be configured to reduce tilt and shift of singulated dice 1505, e.g., during subsequent temporary adhering of singulated dice 1505 to a carrier wafer for TSV formation. Fill material 1511 may be thinned and planarized, e.g., via mechanical grinding and/or polishing, or chemical mechanical grinding as described above. In some examples, fill material 1511 and singulated dice 1505 may be planarized and thinned to a predetermined thickness, e.g., about 150 μm, during the filling and planarizing (1406). In other examples, planarizing and thinning to a predetermined thickness may occur at a subsequent step, e.g., after removal of interim carrier 1507 at (1408) or after attachment to carrier wafer 1506 at (1410), both described below.

Interim carrier 1507 may be removed from fill material 1511 and singulated dice 1505 (1408). Fill material 1511 and singulated dice 1505 may be attached to a carrier wafer 1506 (1410). In the example shown, μLED arrays are attached to carrier wafer 1506, e.g., via a temporary adhesive 1508. In some examples, carrier wafer 1506 may be sized to be compatible with semiconductor processing techniques. For example, carrier wafer 1506 may have a 300 mm diameter. In some examples, carrier wafer 1506 may be silicon, and in some examples carrier wafer 1506 may be glass.

Fill material 1511 and singulated dice 1505 then may be thinned and planarized (1412). Fill material 1511 and semiconductor dice 1505 may be thinned to a predetermined thickness (1412). Fill material 1511 and semiconductor dice 1505 may be thinned using mechanical grinding, mechanical polishing, chemical mechanical polishing, and the like. The predetermined thickness may be, for example, about 150 micrometers. Surfaces of semiconductor dice 1505 may be exposed after the thinning.

Through substrate vias 1514 then may be formed in each of the plurality of semiconductor dice 1505 (1414). For example, through substrate vias 1514 may be formed via semiconductor processing techniques for forming through silicon vias. In some examples, the through substrate vias provide I/O connection points to the integrated circuits, and/or μLED arrays, and/or individual μLEDs, and may be connected to the one or more I/O contacts. By first attaching singulated dice 1505 to interim carrier 1507 (1404) and filling and planarizing around singulated dice 1505 (1406), a polymeric wafer including partially encapsulated singulated dice 1505 is formed, which may be more compatible with subsequent attachment to carrier wafer 1506 using temporary adhesive 1508. For example, the polymeric wafer including partially encapsulated singulated dice 1505 may enable more precise spatial relationships between singulated dice 1505 when attached to carrier wafer 1506 than directly attaching individual singulated dice 1305 to carrier wafer 1306, as is done in the technique of FIGS. 13 and 14. This may facilitate forming through substrate vias 1514 in desired locations. Additionally, method 1400 may include coating a thin protective layer on exposed die surfaces and sidewalls of the wafer during TSV formation, as further illustrated and described below with respect to method 1600 and FIGS. 18 and 19.

Figure 17:
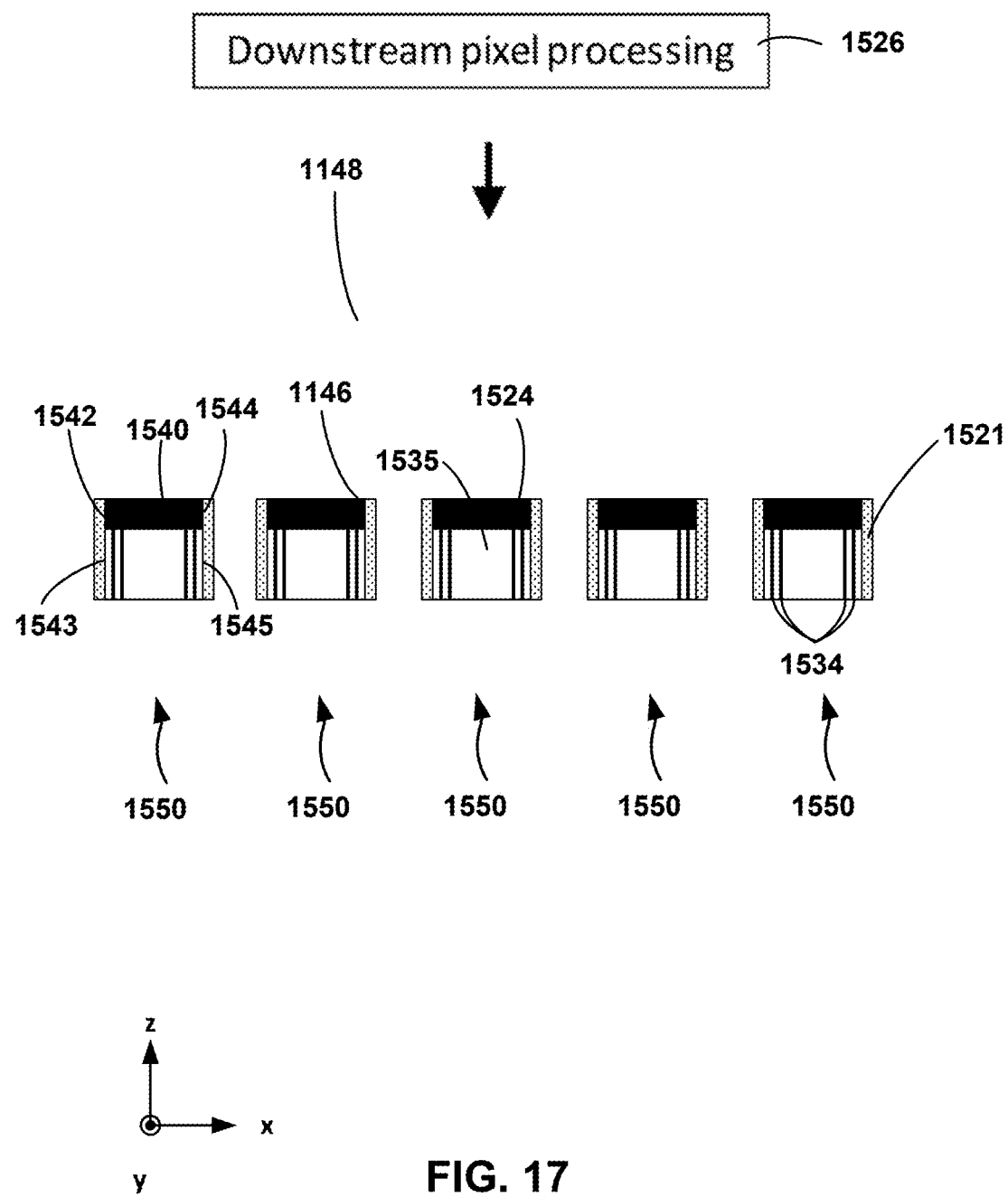
FIG. 17 is a schematic illustration of stacked dice including a μLED array on an integrated circuit including through substrate vias after wafer reconstitution according to any of the example methods of FIGS. 13-16, in accordance with the techniques described in this disclosure.

FIG. 17 is a schematic illustration of stacked dice including a μLED array on an integrated circuit including through substrate vias after wafer reconstitution according to any of the example methods of FIGS. 13-16, in accordance with the techniques described in this disclosure. In any of the techniques of FIGS. 13-16, once TSVs have been formed in each of the plurality of semiconductor dice, the carrier wafer may be removed and the semiconductor including integrated μLED arrays may be singulated to form stacked dice including a μLED array and TSVs. In the example shown, following formation of TSVs 1534, which may be any of TSVs 1314 formed at step (1210) or TSVs 1514 formed at step (1412), the singulated dice 1535 including embedded pixel array layers 1524 and at least a portion of fill material 1521 (which may correspond to any of singulated dice 1305, 1505, embedded pixel array layers 1304, 1504, and fill material 1310, 1511, respectively) may be singulated to form stacked dice 1550.

In the example shown, each of stacked dice 1550 include singulated die 1535 which may include integrated circuitry, e.g., at least one integrated circuit, embedded pixel array layer 1524 which may include a plurality of μLED arrays, fill material 1521, and TSVs 1514. In some examples, because singulated dice 1535 and embedded pixel array layers 1524 are singulated together and then bonded to a carrier for TSV processing, e.g., carrier 1306, 1506, surfaces 1540 of singulated dice 1535 may not extend beyond embedded pixel array layer 1524, e.g., in the x-y directions as shown. For example, first edge 1542 of embedded pixel array layer 1524 may be substantially coplanar with first edge 1543 of singulated die 1535, second edge 1544 of embedded pixel array layer 1524 may be substantially coplanar with second edge 1545 of singulated die 1535, and one or more other edges, e.g., edges in the x-z plane and not shown in the cross-sectional view of FIG. 17, of embedded pixel array layer 1524 may be substantially coplanar with the corresponding edges of singulated die 1535. In some examples, edges 1542-1545, as well as any the other edges such as in the x-z plane (not shown), may be substantially perpendicular to surface 1540 of singulated dice 1535.

In some examples, fill material 1521 may be disposed on one or more of first edge 1542 of embedded pixel array layer 1524, first edge 1543 of singulated die 1535, second edge 1544 of embedded pixel array layer 1524, second edge 1545 of singulated die 1535, or any other edges such as in the x-z plane (not shown). In other words, after downstream pixel processing 1526, each of stacked dice 1550 may include fill material 1521 disposed on one or more edges, e.g., edges that are substantially perpendicular to surface 1540 of singulated dice 1535 and/or major surface 1546 of embedded pixel array layer 1524.

Figure 18:
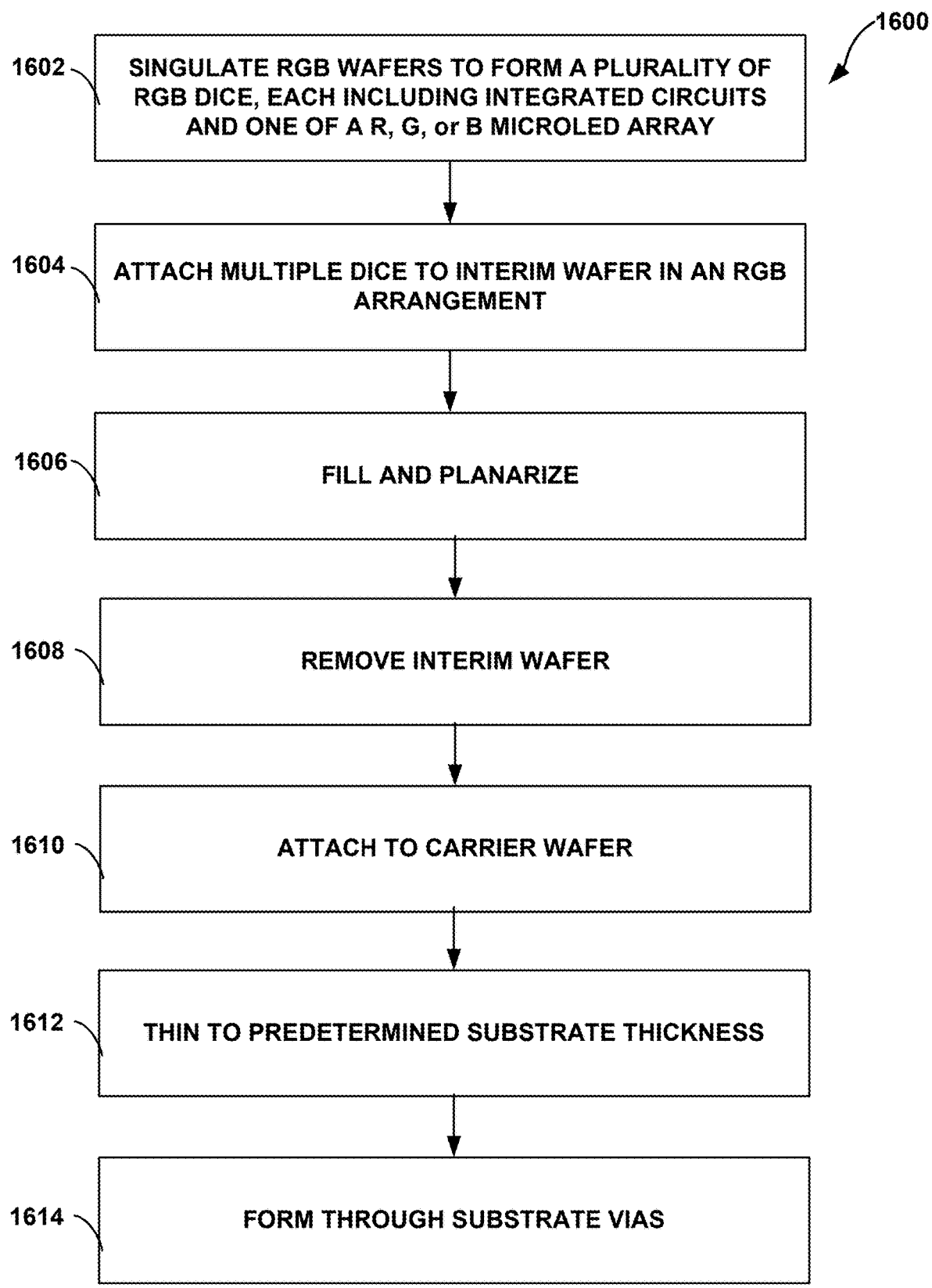
FIG. 18 is a flowchart of another example method for reconstituting a wafer, in accordance with the techniques described in this disclosure.
Figure 19:
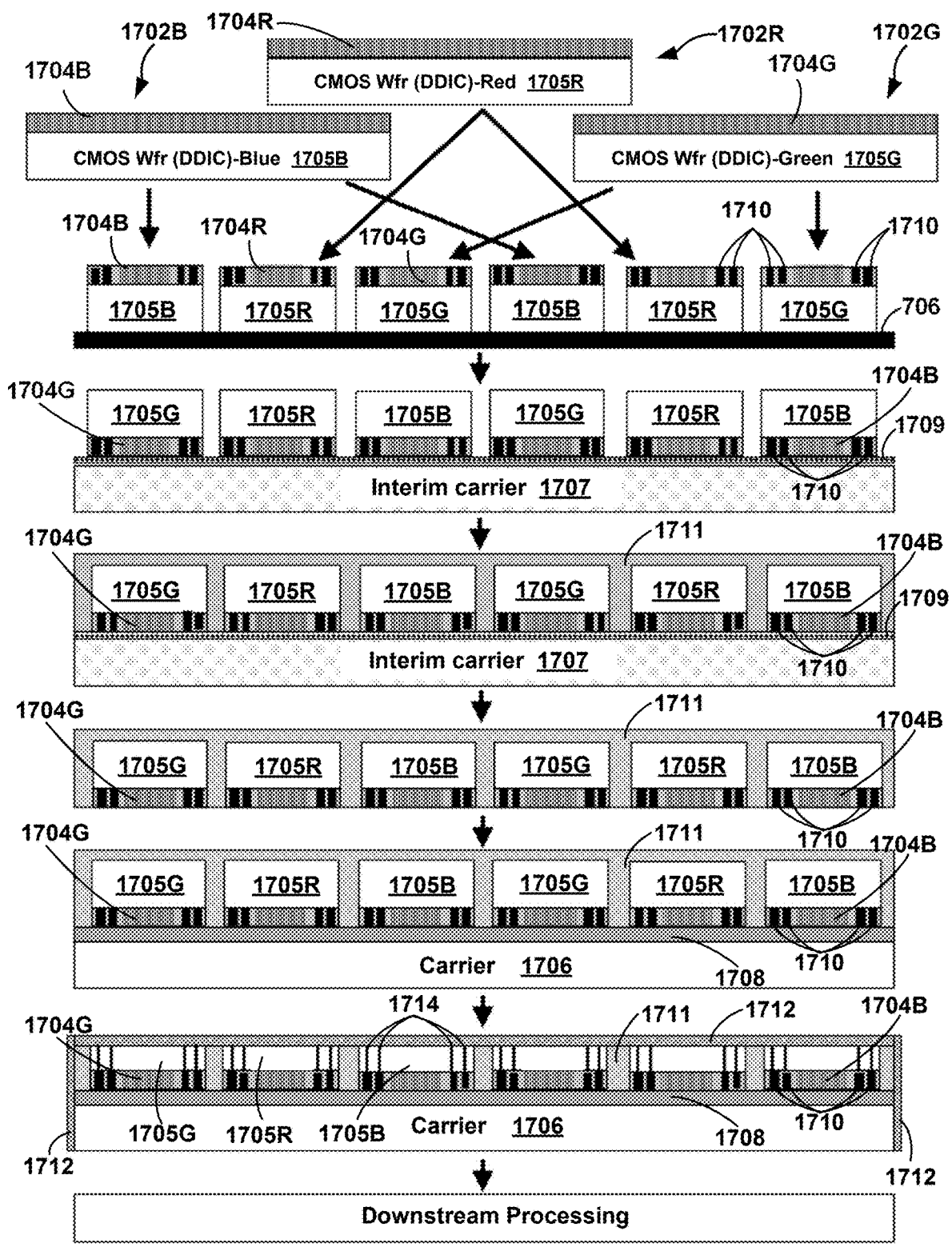
FIG. 19 is a process diagram illustrating an example wafer having an embedded pixel array layer as processed during the method steps of FIG. 18, in accordance with the techniques described in this disclosure.

FIGS. 18 and 19 illustrate another example method 1600 of reconstituting a wafer, e.g., integrating μLED dice with digital/analog circuitry, and will be described concurrently. FIG. 18 is a flowchart of an example method 1600 for reconstituting a wafer, in accordance with the techniques described in this disclosure. FIG. 19 is a schematic illustration of wafers 1702B, 1702R, and 1702G throughout the processing steps of FIG. 18, in accordance with the techniques described in this disclosure. In some examples, method 1600 includes reconstituting an arrangement of a plurality of dies corresponding to a plurality of emitted colors, e.g., red, green, and blue (RGB), in the final package configuration, thereby eliminating downstream processing steps of repeating the reconstitution method for each color individually and placing the reconstituted colors in the final color arrangement. The method 1600 also includes configuring the plurality of dies corresponding to a plurality of colors in the final color arrangement such that the light emitting surfaces of the μLED arrays are substantially co-planar, which may be referred to as "face referencing." Additionally, method 1600 may include coating a thin protective layer on exposed die surfaces and sidewalls of the wafer during TSV formation.

The technique of FIGS. 18 and 19 includes singulating each of wafers 1702B, 1702R, and 1702G that include a plurality of integrated circuits and a plurality of μLED arrays into a plurality of singulated dice 1705B, 1705R, and 1705G (1602). The plurality of μLED arrays of wafers 1702B, 1702R, and 1702G may be configured to emit light of a certain color, e.g., green, red, and blue corresponding to wafers 1702B, 1702R, and 1702G. In some examples, the techniques of FIGS. 18 and 19 may additionally include singulating a wafer that includes a plurality of integrated circuits and a plurality of μLED arrays configured to emit light of other colors and/or emit broadband, e.g., white, light. For example, a wafer including a "white" μLED arrays may be included in the method steps of method 1600 and may be in addition to, or in place of, wafers 1702B, 1702R, and 1702G respectively including embedded μLED arrays 1704B, 1704R, and 1704G. During the singulation process, wafers 1702B, 1702R, and 1702G (collectively referred to as wafers 1702) and the singulated dice 1705B, 1705R, and 1705G (collectively referred to as singulated dice 1705) may be supported by a frame layer 706. The plurality of integrated circuits may be a part of semiconductor wafers 1703G, 1703R, and 1703B (collectively referred to as semiconductor wafers 1703). Semiconductor wafers 1703 may be similar to or substantially the same as semiconductor wafer 708 described above with reference to FIG. 7. The plurality of μLED arrays may be part of an embedded pixel array layers 1704B, 1704R, and 1704G (collectively referred to as embedded pixel array layers 1704). Embedded pixel array layers 1704 may include an inorganic semiconductor layer, such as GaN, GaAs, InGaN, InGaAs, or the like. Each singulated die 1705 includes an integrated circuit and a μLED array stacked on and integrated with the integrated circuit. Like the integrated circuits described above, the integrated circuits may include analog and/or digital circuits, such as device driver circuitry for the μLED array. In some examples, a μLED array may be on a corresponding integrated circuit. In some examples, each singulated die includes one or more I/O contacts 1710 which may be integrated with the integrated circuits and be configured to be electrically connected to one or more TSV.

Wafers 1702 may define a diameter smaller than 300 mm, such that wafers 1702 cannot be processed using 300 mm processing equipment. For example, wafers 1702 may be a 75 mm, 100 mm, 150 mm, 200 mm, or similar diameter wafer. In some examples, wafers 1702 may be formed by coring a larger semiconductor wafer to remove an outer annulus of a larger semiconductor wafer. In some examples, embedded pixel array layers 1704 may have a nominal thickness of about 5 μm, and semiconductor wafers 1703 may have a nominal thickness of about 780 μm. In some examples, semiconductor wafers 1703 may be thinned before singulation of wafers 1702. For example, semiconductor wafers 1703 may be thinned using mechanical grinding, mechanical polishing, chemical mechanical polishing, or the like. In some examples, semiconductor wafers 1703 may be thinned from its nominal thickness, e.g., 780 μm, to a nominal thickness of about 500 μm. In some examples, thinning of semiconductor wafers 1703 may reduce bow during wafer reconstitution method 1600.

Multiple singulated dice 1705 may be attached to an interim carrier 1707 and placed in a final RGB package configuration and/or arrangement (1604). In the example shown, embedded pixel array layers 1704 are attached to interim carrier 1707, e.g., via an adhesive 1709. In some examples, interim carrier 1707 may be sized to be compatible with semiconductor processing techniques, e.g., interim carrier 1707 may have a 300 mm diameter. In some examples, interim carrier 1707 may be silicon, and in other examples interim carrier may be a material that is harder and has increased stability, e.g., dimensional and/or temperature stability, as compared to silicon. For example, interim carrier 1707 may be a metal such as copper.

In some examples, adhesive 1709 may be a relatively thin layer of adhesive, e.g., about less than 200 μm, or less than about 150 μm, or less than about 100 μm, or less than about 50 μm. In some examples, adhesive 1709 is configured to exhibit reduce deformation such as tilt and/or shift of singulated dice 1705 during die placement and process, e.g., during attachment of singulated dice 1705 to interim carrier 1707 and/or during filling and planarizing (1606). For example, adhesive 1709 may have a thickness of less than 10 µm, e.g., for a relatively soft adhesive 1709. In other examples, adhesive 1709 may have a thickness of up to 50 µm, e.g., for a relatively rigid adhesive 1709. In some examples, adhesive 1709 may be an acrylic adhesive, such as an acrylic adhesive available under the trade designation 3M™ Liquid UV-Curable adhesive, e.g., a 3M Wafer Support System LC series adhesive. In some examples, adhesive 1709 may be a Sekisui SELFA HS tape and/or Sekisui SELFA SE tape, and the like. In still other examples, adhesive 1509 may be a Loctite® Ablestik ATB series adhesive film, or a Brewer Science BrewerBOND® series adhesive.

In some examples, the plurality of singulated dice 1705 may be bonded to interim wafer 1707 including a plurality of final RGB package configurations and/or arrangements. A final RGB arrangement may refer to any arrangement of the singulated dice 1705 corresponding to a color, e.g., RGB, RBG, GRB, GBR, BRG, BGR, or other arrangements utilizing one or more color multiple times in an arrangement, e.g., RBGB. For example, the example of FIG. 19 illustrates two GRB arrangements of singulated dice 1705 having a predetermined spacing between each of the singulated dice 1705G, 1705R, and 1705B in both the GRB arrangement on the left and right, and a predetermined spacing between each GRB arrangement, e.g., between singulated die 1705B on the left (e.g., the right side of the left GRB arrangement) and singulated die 1705G on the right (e.g., the left side of the right GRB arrangement). In some examples, singulated dice 1705 may be bonded to interim wafer 1707 "face down," e.g., such that embedded pixel array layers 1504 may be attached to interim wafer 1507 face down via a face down fan-out process. In some examples, interim wafer 1707 may have a substantially flat surface to which singulated dice 1705 are to be bonded such that the surfaces of each of the embedded pixel array layers 1504 are co-planar, or "face referenced" by the substantially flat surface of interim wafer 1707.

In some examples, the individual singulated dice 1705 may be thinned after singulation, e.g., after attachment to interim wafer 1707. For example, if semiconductor wafers 1703 have not been thinned before singulation and attachment of the singulated dice 1705 to interim carrier 1707, the semiconductor wafer material of the individual dice 1705 may be thinned from its nominal thickness, e.g., 780 µm, to a nominal thickness of about 500 µm, via mechanical grinding or polishing, or chemical mechanical grinding, similar to as described above. In some examples, thinning of the semiconductor wafer material of the individual dice may reduce bowing during subsequent steps of wafer reconstitution method 1600.

Once the multiple singulated dice 1705 are arranged and attached to interim wafer 1707, a fill material 1711 may be deposited around the singulated dice 1705 to fill a volume between adjacent singulated dice 1705 with fill material 1711 (1606). Fill material 1711 may be a polymer, or the like. In some examples, fill material 1711 may have a thickness that extends beyond the dice and may encapsulate the dice. In some examples, fill material 1711 may be deposited via a molding process and may be a mold material. For example, fill material 1711 may be dispensed, e.g., via a nozzle and/or a liquid dispensing needle.

In some examples, fill material 1711 may be configured to reduce tilt and/or shift of singulated dice 1705, e.g., during subsequent temporary adhering of singulated dice 1705 to a carrier wafer for TSV formation. Fill material 1711 may be thinned and planarized, e.g., via mechanical grinding and/or polishing, or chemical mechanical grinding as described above. In some examples, fill material 1711 and singulated dice 1705 may be planarized and thinned to a predetermined thickness, e.g., about 170 µm, during the filling and planarizing (1606). In other examples, planarizing and thinning to a predetermined thickness may occur at a subsequent step, e.g., after removal of interim carrier 1707 at (1608) or after attachment to carrier wafer 1706 at (1610), both described below.

Interim carrier 1707 may be removed from fill material 1711 and singulated dice 1705 (1608). Fill material 1711 and singulated dice 1705 may be attached to a carrier wafer 1706 (1610). In the example shown, µLED arrays are attached to carrier wafer 1706, e.g., via a temporary adhesive 1708. In some examples, carrier wafer 1706 may be sized to be compatible with semiconductor processing techniques. For example, carrier wafer 1706 may have a 300 mm diameter. In some examples, carrier wafer 1706 may be silicon, and in some examples carrier wafer 1706 may be glass.

Fill material 1711 and singulated dice 1705 then may be thinned and planarized (1612). Fill material 1711 and semiconductor dice 1705 may be thinned to a predetermined thickness (1612). Fill material 1711 and semiconductor dice 1705 may be thinned using mechanical grinding, mechanical polishing, chemical mechanical polishing, and the like. The predetermined thickness may be, for example, about 170 µm. Surfaces of semiconductor dice 1705 may be exposed after the thinning.

Through substrate vias 1714 then may be formed in each of the plurality of semiconductor dice 1705 (1614). For example, through substrate vias 1714 may be formed via semiconductor processing techniques for forming through silicon vias. In some examples, the through substrate vias provide I/O connection points to the integrated circuits, and/or µLED arrays, and/or individual µLEDs, and may be connected to I/O contacts 1710. In some examples, a thin coating 1712 may be coated on the exposed surfaces of semiconductor dice 1705, fill material 1711, and any exposed sidewalls of fill material 1711, semiconductor dice 1705, temporary adhesive 1708, and carrier wafer 1706 before formation of TSVs 1714. Thin coating 1712 may be a protective layer and may be a thin oxide layer. For example, TSVs 1714 may be formed using a reactive ion etch (RIE) or deep RIE process, and thin coating 1712 may protect fill material 1711 from degradation due to the TSV forming process, e.g., RIE. In some examples, fill material 1711 may be an organic polymer, and thin coating 1712 may protect fill material 1711, including the sidewalls, during TSV formation.

By first attaching singulated dice 1705 to interim carrier 1707 (1604) and filling and planarizing around singulated dice 1705 (1606), a polymeric wafer including partially encapsulated singulated dice 1705 is formed, which may be more compatible with subsequent attachment to carrier wafer 1706 using temporary adhesive 1708. For example, the polymeric wafer including partially encapsulated singulated dice 1705 may enable more precise spatial relationships between singulated dice 1705 when attached to carrier wafer 1706 than directly attaching individual singulated dice 1305 to carrier wafer 1306, as is done in the technique of FIGS. 13 and 14. This may facilitate forming through substrate vias 1714 in desired locations.

Figure 20:
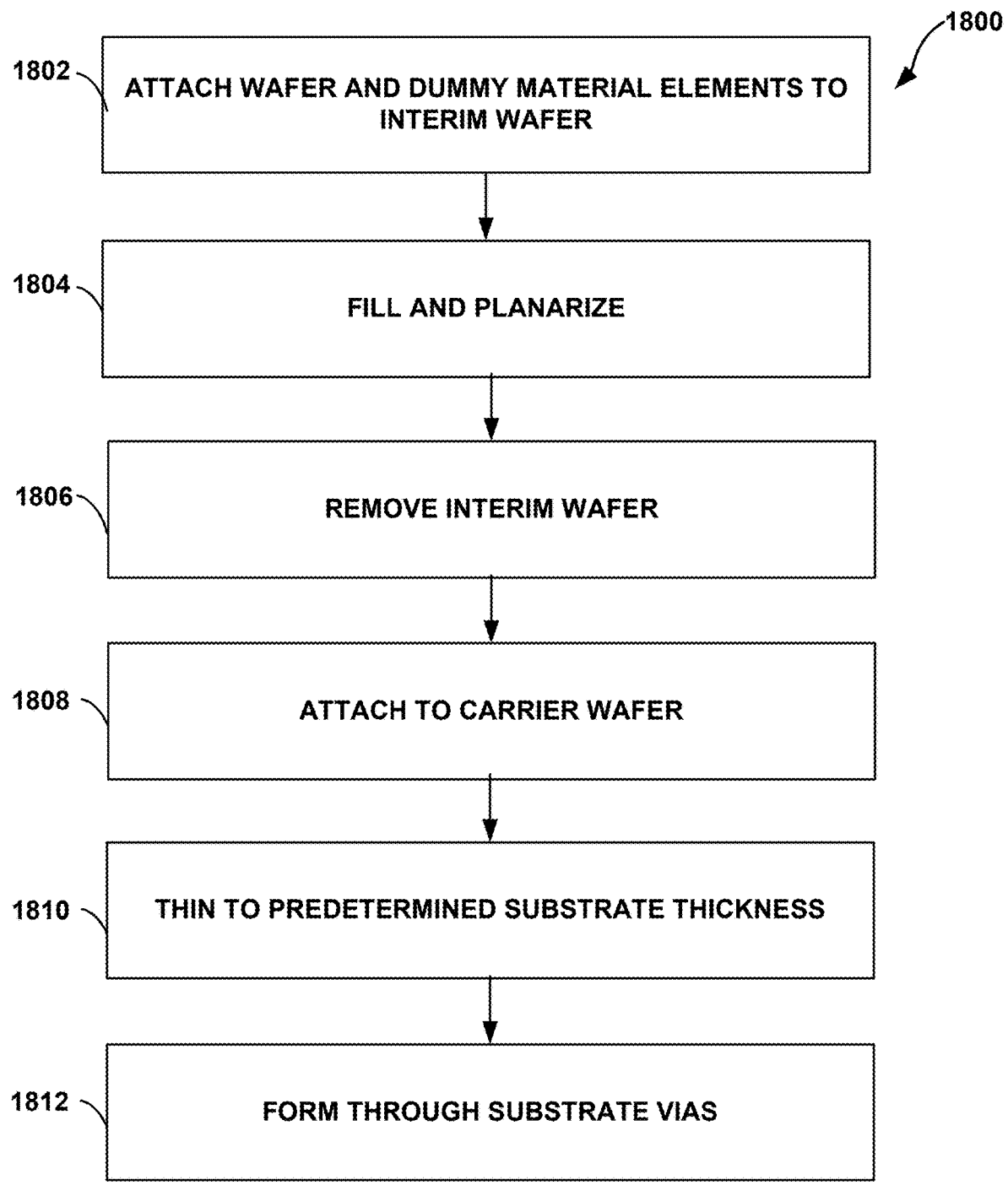
FIG. 20 is a flowchart of another example method for reconstituting a wafer, in accordance with the techniques described in this disclosure.
Figure 21:
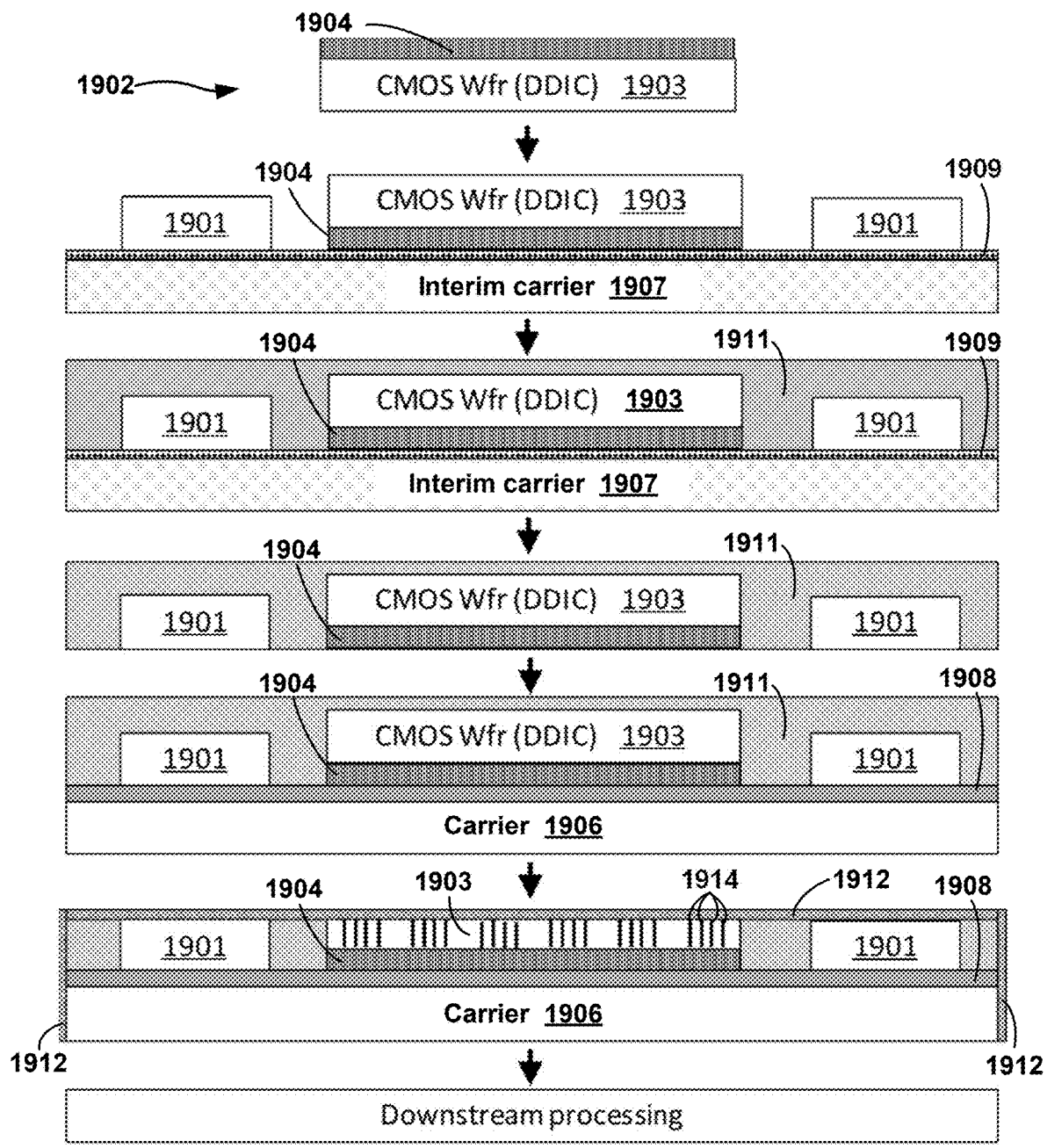
FIG. 21 is a process diagram illustrating an example wafer having an embedded pixel array layer as processed during the method steps of FIG. 20, in accordance with the techniques described in this disclosure.

FIGS. 20 and 21 illustrate another example method 1800 of reconstituting a wafer, e.g., integrating µLED dice with digital/analog circuitry, and will be described concurrently. FIG. 20 is a flowchart of an example method 1800 for reconstituting a wafer, in accordance with the techniques described in this disclosure. FIG. 21 is a schematic illustration of wafer 1902 throughout the processing steps of FIG. 20, in accordance with the techniques described in this disclosure. In some examples, method 1800 includes reconstituting a full wafer 1902 including one or more μLED die and/or μLED array. In some examples, method 1800 of reconstituting a full wafer may reduce the complexity and number of processing steps for integrating μLED dice with digital/analog circuitry. For example, method 1800 of reconstituting a full wafer may reduce or eliminate die shifting associated with singulating a plurality of individual dice from a full wafer and subsequently placing those singulated dice on a substrate such as frame layer 706 and/or a carrier wafer.

In some examples, wafer 1902 may include a plurality of integrated circuits and a plurality of μLED arrays. The plurality of integrated circuits may be a part of semiconductor wafers 1903. Semiconductor wafer 1903 may be similar to or substantially the same as semiconductor wafer 708 described above with reference to FIG. 7. The plurality of μLED arrays may be part of an embedded pixel array layer 1904. Embedded pixel array layers 1904 may include an inorganic semiconductor layer, such as GaN, GaAs, InGaN, InGaAs, or the like. Wafer 1902 may include one or more integrated circuit and a μLED array stacked on and integrated with the integrated circuit. Like the integrated circuits described above, the integrated circuits may include analog and/or digital circuits, such as device driver circuitry for the μLED array. In some examples, a μLED array may be on a corresponding integrated circuit. In some examples, each integrated circuit and a μLED array may include one or more I/O contacts which may be integrated with the integrated circuits and be configured to be electrically connected to one or more TSV.

Wafers 1902 may define a diameter smaller than 300 mm, such that wafers 1902 cannot be processed using 300 mm processing equipment. For example, wafers 1902 may be a 75 mm, 100 mm, 150 mm, 200 mm, or similar diameter wafer. In some examples, wafers 1902 may be formed by coring a larger semiconductor wafer to remove an outer annulus of the larger semiconductor wafer. In some examples, embedded pixel array layers 1904 may have a nominal thickness of about 5 μm, and semiconductor wafers 1903 may have a nominal thickness of about 780 μm. In some examples, semiconductor wafers 1903 may be thinned before attachment to a carrier substrate and/or wafer. For example, semiconductor wafers 1903 may be thinned using mechanical grinding, mechanical polishing, chemical mechanical polishing, or the like. In some examples, semiconductor wafers 1903 may be thinned from its nominal thickness, e.g., 780 μm, to a nominal thickness of about 500 μm. In some examples, thinning of semiconductor wafers 1903 may reduce bow during wafer reconstitution method 1800.

The technique of FIGS. 20 and 21 includes attaching wafer 1902 to an interim carrier 1907 (1802). In the example shown, embedded pixel array layers 1904 are attached to interim carrier 1907, e.g., via an adhesive 1909. In some examples, interim carrier 1907 may be sized to be compatible with semiconductor processing techniques, e.g., interim carrier 1907 may have a 300 mm diameter. In some examples, interim carrier 1907 may be silicon, and in other examples interim carrier may be a material that is harder and has increased stability, e.g., dimensional and/or temperature stability, as compared to silicon. For example, interim carrier 1907 may be a metal such as copper.

In some examples, one or more dummy material elements 1901 may be attached to interim carrier 1907. For example, dummy material elements 1901 may be of similar thickness and may made of the same material as semiconductor wafer 1903 but may or may not include any integrated circuitry. Dummy material elements 1901 may be silicon or may be a metal such as copper. Dummy material elements 1901 may improve the balance, stability, and structural integrity of wafer 1902 attached to the larger 300 mm substrate and/or carrier during subsequent encapsulation, thinning, TSV formation, and further downstream processing.

In some examples, adhesive 1909 may be a relatively thin layer of adhesive, e.g., about less than 200 μm, or less than about 150 μm, or less than about 100 μm, or less than about 50 μm. In some examples, adhesive 1909 is configured to exhibit reduce deformation such as tilt and/or shift of wafer 1902 during placement and processing, e.g., during attachment of wafer 1902 to interim carrier 1907 and/or during filling and planarizing (1804). For example, adhesive 1909 may have a thickness of less than 10 μm, e.g., for a relatively soft adhesive 1909. In other examples, adhesive 1909 may have a thickness of up to 50 μm, e.g., for a relatively rigid adhesive 1909. In some examples, adhesive 1909 may be an acrylic adhesive, such as an acrylic adhesive available under the trade designation 3M™ Liquid UV-Curable adhesive, e.g., a 3M Wafer Support System LC series adhesive. In some examples, adhesive 1909 may be a Sekisui SELFA HS tape and/or Sekisui SELFA SE tape, and the like. In still other examples, adhesive 1509 may be a Loctite® Ablestik ATB series adhesive film, or a Brewer Science BrewerBOND® series adhesive.

In some examples, wafer 1902 may be thinned after attachment to interim wafer 1907. For example, if semiconductor wafers 1903 have not been thinned before attachment to interim carrier 1907, the semiconductor wafer material of wafer 1902 may be thinned from its nominal thickness, e.g., 780 μm, to a nominal thickness of about 500 μm, via mechanical grinding or polishing, or chemical mechanical grinding, similar to as described above. In some examples, thinning of the semiconductor wafer material of wafer 1902 may reduce bow during subsequent steps of wafer reconstitution method 1800.

Once wafer 1902 is attached to interim wafer 1907, a fill material 1911 may be deposited around wafer 1902 to fill a volume between wafer 1902 and any dummy material elements 1901 with fill material 1911 (1804). Fill material 1911 may be a polymer, or the like. In some examples, fill material 1911 may have a thickness that extends beyond the dice and may encapsulate the dice. In some examples, fill material 1911 may be deposited via a molding process and may be a mold material. For example, fill material 1911 may be dispensed, e.g., via a nozzle and/or a liquid dispensing needle.

In some examples, fill material 1911 may be configured to reduce tilt and shift of wafer 1902, e.g., during subsequent temporary adhering of wafer 1902 to a carrier wafer for TSV formation. Fill material 1911 may be thinned and planarized, e.g., via mechanical grinding and/or polishing, or chemical mechanical grinding as described above. In some examples, fill material 1911 and wafer 1902 may be planarized and thinned to a predetermined thickness, e.g., about 190 μm, during the filling and planarizing (1804). In other examples, planarizing and thinning to a predetermined thickness may occur at a subsequent step, e.g., after removal of interim carrier 1907 at (1806) or after attachment to carrier wafer 1906 at (1808), both described below.

Interim carrier 1907 may be removed from fill material 1911 and wafer 1902 and dummy material elements 1901 (1806). Fill material 1911 and wafer 1902 and dummy material elements 1901 may be attached to a carrier wafer 1906 (1808). In the example shown, μLED arrays are attached to carrier wafer 1906, e.g., via a temporary adhesive 1908. In some examples, carrier wafer 1906 may be sized to be compatible with semiconductor processing techniques. For example, carrier wafer 1906 may have a 300 mm diameter. In some examples, carrier wafer 1906 may be silicon, and in some examples carrier wafer 1906 may be glass.

Fill material 1911 and wafer 1902 and dummy material elements 1901 then may be thinned and planarized (1810). Fill material 1911 and wafer 1902 and dummy material elements 1901 may be thinned to a predetermined thickness (1810). Fill material 1911 and wafer 1902 and dummy material elements 1901 may be thinned using mechanical grinding, mechanical polishing, chemical mechanical polishing, and the like. The predetermined thickness may be, for example, about 190 micrometers. Surfaces of wafer 1902 may be exposed after the thinning.

Through substrate vias 1914 then may be formed in wafer 1902 (1812). For example, through substrate vias 1914 may be formed via semiconductor processing techniques for forming through silicon vias. In some examples, the through substrate vias provide I/O connection points to the integrated circuits, and/or μLED arrays, and/or individual μLEDs, and may be connected to I/O contacts. In some examples, a thin coating 1912 may be coated on the exposed surfaces of wafer 1902, fill material 1911, and any exposed sidewalls of fill material 1911, wafer 1902, temporary adhesive 1908, and carrier wafer 1906 before formation of TSVs 1914. Thin coating 1912 may be a protective layer and may be a thin oxide layer. For example, TSVs 1914 may be formed using a reactive ion etch (RIE) or deep RIE process, and thin coating 1912 may protect fill material 1911 from degradation due to the TSV forming process, e.g., RIE. In some examples, fill material 1911 may be an organic polymer, and thin coating 1912 may protect fill material 1911, including the sidewalls, during TSV formation.

Figure 22:
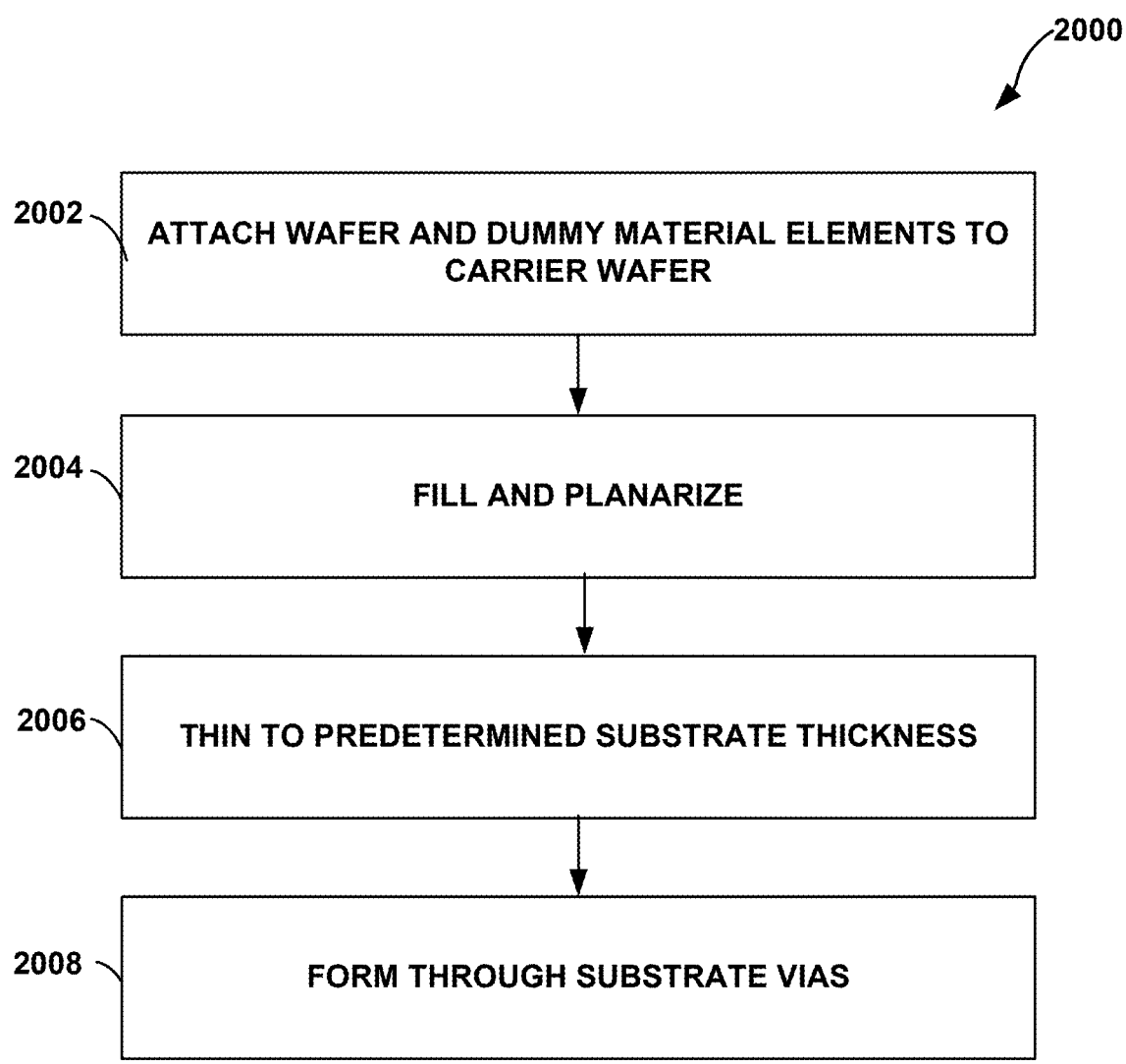
FIG. 22 is a flowchart of another example method for reconstituting a wafer, in accordance with the techniques described in this disclosure.
Figure 23:
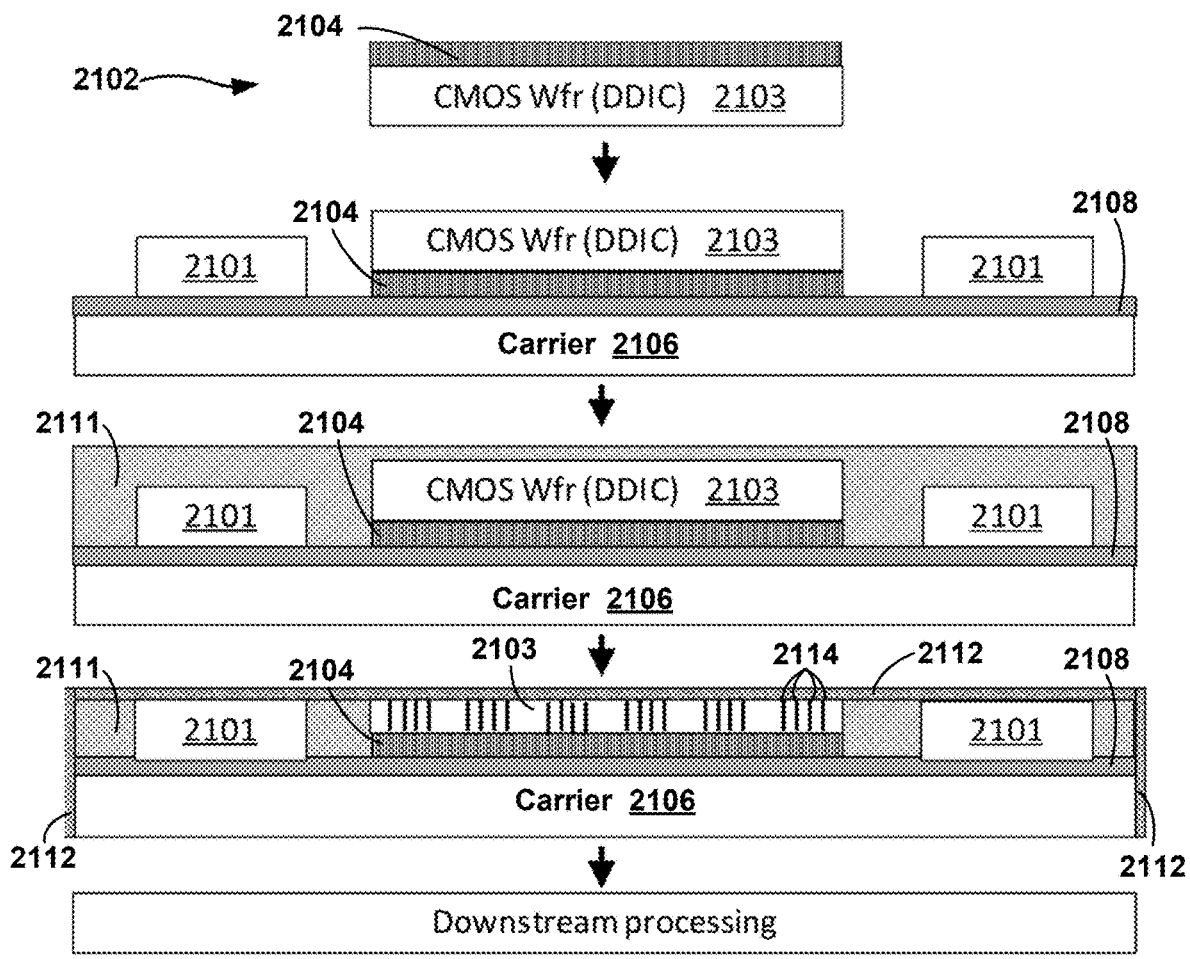
FIG. 23 is a process diagram illustrating an example wafer having an embedded pixel array layer as processed during the method steps of FIG. 22, in accordance with the techniques described in this disclosure.

FIGS. 22 and 23 illustrate another example method 2000 of reconstituting a wafer, e.g., integrating μLED dice with digital/analog circuitry, and will be described concurrently. FIG. 22 is a flowchart of an example method 2000 for reconstituting a wafer, in accordance with the techniques described in this disclosure. FIG. 23 is a schematic illustration of wafer 2102 throughout the processing steps of FIG. 22, in accordance with the techniques described in this disclosure. In some examples, method 2000 includes reconstituting a full wafer 2102 including one or more μLED die and/or μLED array. In some examples, method 2000 of reconstituting a full wafer may reduce the complexity and number of processing steps for integrating μLED dice with digital/analog circuitry. For example, method 2000 of reconstituting a full wafer may reduce or eliminate die shifting associated with singulating a plurality of individual dice from a full wafer and subsequently placing those singulated dice on a substrate such as frame layer 706 and/or a carrier wafer. Method 2000 may be substantially similar to method 1800 illustrated and described above, except that method 2000 eliminates the interim carrier and associated method steps, e.g., the steps of attaching wafer 2102 and dummy material elements 2101 to an interim carrier and removing the interim carrier after filling and planarizing with a fill material. Method 2000 may reduce the complexity of reconstituting a wafer, for example, by the elimination of an interim carrier and the associated processing steps of attaching wafer 2102 and dummy material elements 2101 to an interim carrier and removing the interim carrier after filling and planarizing with a fill material.

In some examples, wafer 2102 may include a plurality of integrated circuits and a plurality of μLED arrays. The plurality of integrated circuits may be a part of semiconductor wafers 2103. Semiconductor wafer 2103 may be similar to or substantially the same as semiconductor wafer 708 described above with reference to FIG. 7. The plurality of μLED arrays may be part of an embedded pixel array layer 2104. Embedded pixel array layers 2104 may include an inorganic semiconductor layer, such as GaN, GaAs, InGaN, InGaAs, or the like. Wafer 2102 may include one or more integrated circuit and a μLED array stacked on and integrated with the integrated circuit. Like the integrated circuits described above, the integrated circuits may include analog and/or digital circuits, such as device driver circuitry for the μLED array. In some examples, a μLED array may be on a corresponding integrated circuit. In some examples, each integrated circuit and a μLED array may include one or more I/O contacts which may be integrated with the integrated circuits and be configured to be electrically connected to one or more TSV.

Wafers 2102 may define a diameter smaller than 300 mm, such that wafers 2102 cannot be processed using 300 mm processing equipment. For example, wafers 2102 may be a 75 mm, 100 mm, 150 mm, 200 mm, or similar diameter wafer. In some examples, wafers 2102 may be formed by coring a larger semiconductor wafer to remove an outer annulus of the larger semiconductor wafer. In some examples, embedded pixel array layers 2104 may have a nominal thickness of about 5 μm, and semiconductor wafers 2103 may have a nominal thickness of about 780 μm. In some examples, semiconductor wafers 2103 may be thinned before attachment to a carrier substrate and/or wafer. For example, semiconductor wafers 2103 may be thinned using mechanical grinding, mechanical polishing, chemical mechanical polishing, or the like. In some examples, semiconductor wafers 2103 may be thinned from its nominal thickness, e.g., 780 μm, to a nominal thickness of about 500 μm. In some examples, thinning of semiconductor wafers 2103 may reduce bow during wafer reconstitution method 2000.

The technique of FIGS. 22 and 23 includes attaching wafer 2102 to a carrier wafer 2106 (2002). In the example shown, μLED arrays are attached to carrier wafer 2106, e.g., via a temporary adhesive 2108. In some examples, carrier wafer 2106 may be sized to be compatible with semiconductor processing techniques. For example, carrier wafer 2106 may have a 300 mm diameter. In some examples, carrier wafer 2106 may be silicon, and in some examples carrier wafer 2106 may be glass.

In some examples, one or more dummy material elements 2101 may be attached to carrier wafer 2106. For example, dummy material elements 2101 may be of similar thickness and may made of the same material as semiconductor wafer 2103 but may or may not include any integrated circuitry. Dummy material elements 2101 may be silicon or may be a metal such as copper. Dummy material elements 2101 may improve the balance, stability, and structural integrity of wafer 2102 attached to the larger 300 mm carrier wafer 2106 during subsequent encapsulation, thinning, TSV formation, and further downstream processing.

In some examples, wafer 2102 may be thinned after attachment to carrier wafer 2106 (2002) but before filling and planarizing (2004). For example, if semiconductor wafers 2103 have not been thinned before attachment to carrier wafer 2106, the semiconductor wafer material of wafer 2102 may be thinned from its nominal thickness, e.g., 780 µm, to a nominal thickness of about 500 µm, via mechanical grinding or polishing, or chemical mechanical grinding, similar to as described above. In some examples, thinning of the semiconductor wafer material of wafer 2102 may reduce bow during subsequent steps of wafer reconstitution method 2000.

Once wafer 2102 is attached to carrier wafer 2106, a fill material 2111 may be deposited around wafer 2102 to fill a volume between wafer 2102 and any dummy material elements 2101 with fill material 2111 (2004). Fill material 2111 may be a polymer, or the like. In some examples, fill material 2111 may have a thickness that extends beyond the dice and may encapsulate the dice. In some examples, fill material 2111 may be deposited via a molding process and may be a mold material. For example, fill material 2111 may be dispensed, e.g., via a nozzle and/or a liquid dispensing needle. In some examples, fill material 2111 may be configured to reduce tilt and shift of wafer 2102, e.g., during TSV formation.

Fill material 2111 and wafer 2102 and dummy material elements 2101 then may be thinned and planarized (2006). Fill material 2111 and wafer 2102 and dummy material elements 2101 may be thinned to a predetermined thickness (2006). Fill material 2111 and wafer 2102 and dummy material elements 2101 may be thinned using mechanical grinding, mechanical polishing, chemical mechanical polishing, and the like and as described above. The predetermined thickness may be, for example, about 190 µm. Surfaces of wafer 2102 may be exposed after the thinning.

Through substrate vias 2114 then may be formed in wafer 2102 (2008). For example, through substrate vias 2114 may be formed via semiconductor processing techniques for forming through silicon vias. In some examples, the through substrate vias provide I/O connection points to the integrated circuits, and/or µLED arrays, and/or individual µLEDs, and may be connected to I/O contacts. In some examples, a thin coating 2112 may be coated on the exposed surfaces of wafer 2102, fill material 2111, and any exposed sidewalls of fill material 2111, wafer 2102, temporary adhesive 2108, and carrier wafer 2106 before formation of TSVs 2114. Thin coating 2112 may be a protective layer and may be a thin oxide layer. For example, TSVs 2114 may be formed using a reactive ion etch (RIE) or deep RIE process, and thin coating 2112 may protect fill material 2111 from degradation due to the TSV forming process, e.g., RIE. In some examples, fill material 2111 may be an organic polymer, and thin coating 2112 may protect fill material 2111, including the sidewalls, during TSV formation.

Figure 24:
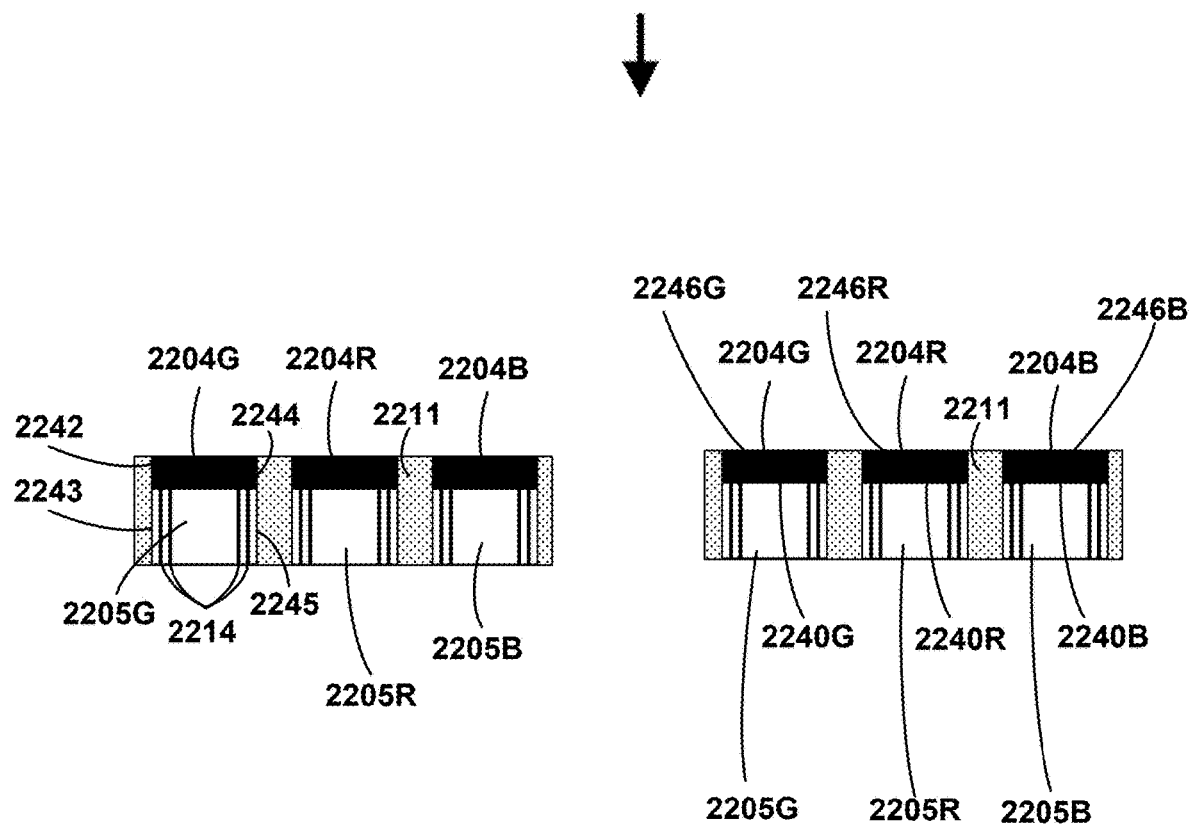
FIG. 24 is a schematic illustration of stacked dice including a plurality of μLED arrays on a plurality of corresponding integrated circuits including through substrate vias after wafer reconstitution according to any of the example methods of FIGS. 18-23, in accordance with the techniques described in this disclosure.

FIG. 24 is a schematic illustration of stacked dice including a plurality of µLED arrays on a plurality of corresponding integrated circuits including through substrate vias after wafer reconstitution according to any of the example methods of FIGS. 18-23, in accordance with the techniques described in this disclosure. In any of the techniques of FIGS. 18-23, once TSVs have been formed in each of the plurality of semiconductor dice, the carrier wafer may be removed and the semiconductor including multiple integrated µLED arrays may be singulated to form stacked dice including multiple µLED arrays and TSVs. For example, downstream processing may include removing any of carrier wafers 1706, 1906, 2106, removing of thin coatings 1712, 1912, 2112, and singulating into multiple stacked dice each including a plurality of µLED arrays. In the example shown and following downstream processing, any of the techniques of FIGS. 18-23 may result in stacked dice 2250 each including embedded pixel array layers 2204B, 2204R, and 2204G (embedded pixel arrays 2204, alternatively referred to as µLED arrays 2204, collectively), singulated dice 2205B, 2205R, and 2205G (singulated dice 2205, collectively), TSVs 2214, and fill material 2211. In the example shown, embedded pixel array layers 2204B, 2204R, and 2204G may be any of embedded pixel array layers 1704B, 1704R, 1704G, 1904, or 2104. In the example shown, singulated dice 2205B, 2205R, and 2205G may be any of singulated dice 1705B, 1705R, and 1705G, 1905, or 2105. In the example shown, TSVs 2214 may be any of TSVs 1714, 1914, or 2114 and fill material 2211 may be any of fill material 1711, 1911, or 2111. In some examples, embedded pixel array layers 2204B, 2204R, and 2204G may be adjacent to each other and without fill material 2211 between each respective embedded pixel layer.

In the example shown, each of stacked dice 2250 include a plurality of singulated dice 2205 each of which may include integrated circuitry, e.g., at least one integrated circuit, embedded pixel arrays 2204, fill material 2211, and TSVs 2214. In some examples, fill material 2211 may join the singulated dice 2205 and embedded pixel arrays 2204. For example, each of singulated dice 2205G, 2205R, and 2205B, as well as each of µLED arrays 2204G, 2204R, and 2204B, may be joined by fill material 2211, and fill material 2211 may be disposed on an edge of µLED arrays 2204 and/or singulated dice 2205, e.g., any or all of first edges 2242 and second edges 2244 of any or all of µLED arrays 2204 and any or all of first edges 2243 and second edges 2245 of any or all of singulated dice 2205.

In some examples, the light emitting surfaces of each of the µLED arrays 2204 of stacked dice 2250, e.g., surfaces 2246G, 2246R, and 2246B (light emitting surfaces 2246, collectively) may be substantially co-planar, e.g., at substantially the same position in the z-direction and in the x-y plane in the example shown.

In some examples, first edge 2242 of µLED arrays 2204 may be substantially coplanar with first edge 2243 of the corresponding singulated dice 2205, second edge 2244 of µLED arrays 2204 may be substantially coplanar with second edge 2245 of the corresponding singulated dice 2205, and one or more other edges, e.g., edges in the x-z plane and not shown in the cross-sectional view of FIG. 24, of µLED arrays 2204 may be substantially coplanar with the corresponding edges of singulated dice 2205. In some examples, edges 2242-2245, as well as any the other edges such as in the x-z plane (not shown), may be substantially perpendicular to surfaces 2240G, 2240R, 2240B of singulated dice 2205 (surfaces 2240, collectively) and/or light emitting surfaces 2246.

In some examples, fill material 2211 may be disposed on one or more of first edges 2242 of µLED arrays 2204, first edges 2243 of singulated dice 2205, second edges 2244 of µLED arrays 2204, second edges 2245 of singulated dice 2205, or any other edges such as in the x-z plane (not shown). In other words, after downstream pixel processing, each of stacked dice 2250 may include fill material 2211 disposed on one or more edges, e.g., edges that are substantially perpendicular to surfaces 2240 of singulated dice 2205 and/or light emitting surfaces 2246 of µLED arrays 2204.

Figure 25A:
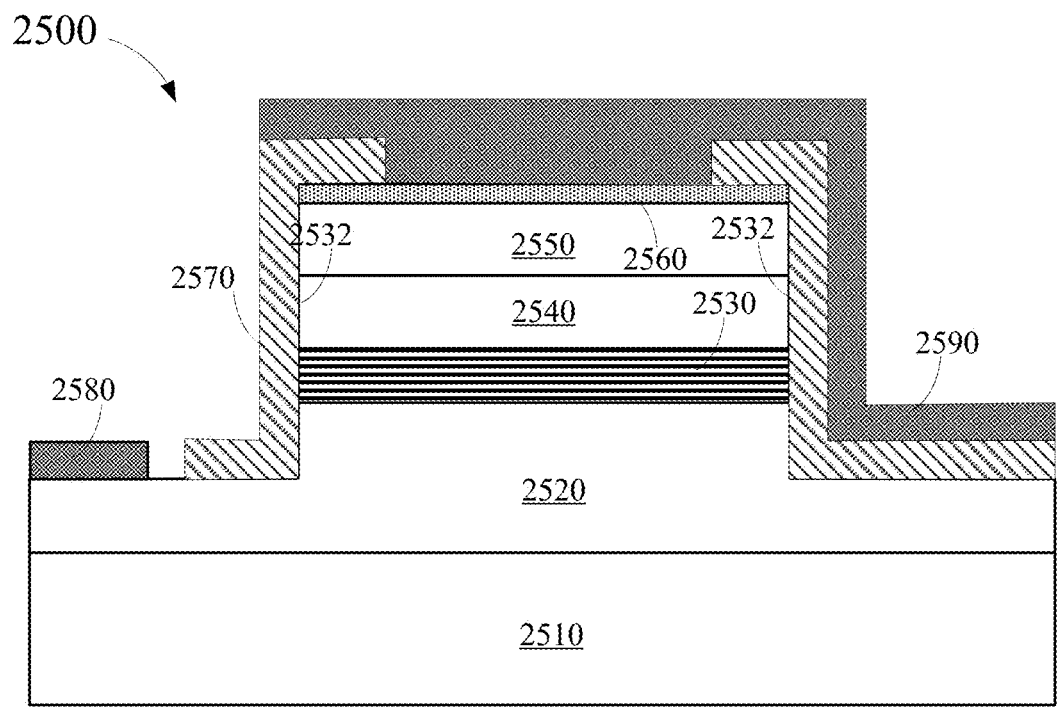
FIG. 25A illustrates an example of a light emitting diode (LED) having a vertical mesa structure according to certain embodiments.

FIG. 25A illustrates an example of an LED 2500 having a vertical mesa structure. LED 2500 may be a light emitter in light source 510, 540, or 642. LED 2500 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO2 structure, where the substrate may be cut in a specific direction to expose a specific plane as the growth surface.

In the example shown in FIG. 25A, LED 2500 may include a substrate 2510, which may include, for example, a sapphire substrate or a GaN substrate. A semiconductor layer 2520 may be grown on substrate 2510. Semiconductor layer 2520 may include a III-V material, such as GaN, and may be p-doped (e.g., with Mg, Ca, Zn, or Be) or n-doped (e.g., with Si or Ge). One or more active layers 2530 may be grown on semiconductor layer 2520 to form an active region. Active layer 2530 may include III-V materials, such as one or more InGaN layers, one or more AlInGaP layers, and/or one or more GaN layers, which may form one or more heterostructures, such as one or more quantum wells or MQWs. A semiconductor layer 2540 may be grown on active layer 2530. Semiconductor layer 2540 may include a III-V material, such as GaN, and may be p-doped (e.g., with Mg, Ca, Zn, or Be) or n-doped (e.g., with Si or Ge). One of semiconductor layer 2520 and semiconductor layer 2540 may be a p-type layer and the other one may be an n-type layer. Semiconductor layer 2520 and semiconductor layer 2540 sandwich active layer 2530 to form the light emitting region. For example, LED 2500 may include a layer of InGaN situated between a layer of p-type GaN doped with magnesium and a layer of n-type GaN doped with silicon or oxygen. In some embodiments, LED 2500 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 25A) may be grown to form a layer between active layer 2530 and at least one of semiconductor layer 2520 or semiconductor layer 2540. The EBL may reduce the electron leakage current and improve the efficiency of the LED. In some embodiments, a heavily-doped semiconductor layer 2550, such as a P+ or P++ semiconductor layer, may be formed on semiconductor layer 2540 and act as a contact layer for forming an ohmic contact and reducing the contact impedance of the device. In some embodiments, a conductive layer 2560 may be formed on heavily-doped semiconductor layer 2550. Conductive layer 2560 may include, for example, an indium tin oxide (ITO) or Al/Ni/Au film. In one example, conductive layer 2560 may include a transparent ITO layer.

To make contact with semiconductor layer 2520 (e.g., an n-GaN layer) and to more efficiently extract light emitted by active layer 2530 from LED 2500, the semiconductor material layers (including heavily-doped semiconductor layer 2550, semiconductor layer 2540, active layer 2530, and semiconductor layer 2520) may be etched to expose semiconductor layer 2520 and to form a mesa structure that includes layers 2520-760. The mesa structure may confine the carriers within the device. Etching the mesa structure may lead to the formation of mesa sidewalls 2532 that may be orthogonal to the growth planes. A passivation layer 2570 may be formed on sidewalls 2532 of the mesa structure. Passivation layer 2570 may include an oxide layer, such as a SiO2 layer, and may act as a reflector to reflect emitted light out of LED 2500. A contact layer 2580, which may include a metal layer, such as Al, Au, Ni, Ti, or any combination thereof, may be formed on semiconductor layer 2520 and may act as an electrode of LED 2500. In addition, another contact layer 2590, such as an Al/Ni/Au metal layer, may be formed on conductive layer 2560 and may act as another electrode of LED 2500.

When a voltage signal is applied to contact layers 2580 and 2590, electrons and holes may recombine in active layer 2530, where the recombination of electrons and holes may cause photon emission. The wavelength and energy of the emitted photons may depend on the energy bandgap between the valence band and the conduction band in active layer 2530. For example, InGaN active layers may emit green or blue light, AlGaN active layers may emit blue to ultraviolet light, while AlInGaP active layers may emit red, orange, yellow, or green light. The emitted photons may be reflected by passivation layer 2570 and may exit LED 2500 from the top (e.g., conductive layer 2560 and contact layer 2590) or bottom (e.g., substrate 2510).

In some embodiments, LED 2500 may include one or more other components, such as a lens, on the light emission surface, such as substrate 2510, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

In some examples, LED 2500 may comprise at least a portion of one or more reconstituted semiconductor components such as described herein.

Figure 25B:
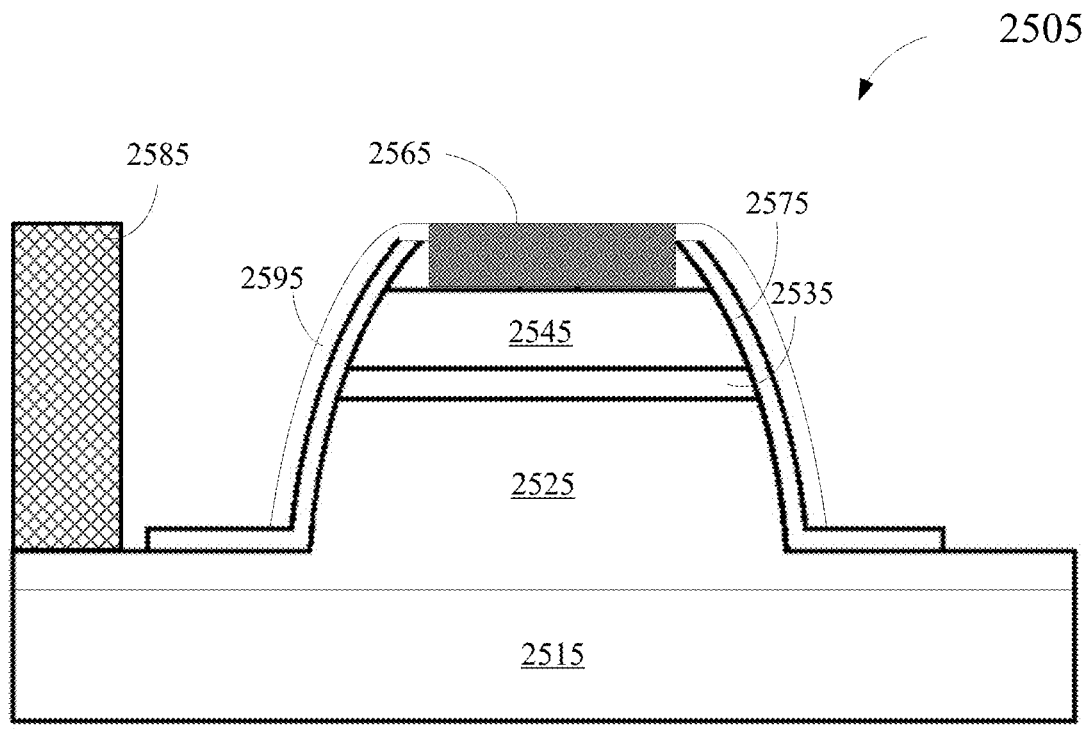
FIG. 25B is a cross-sectional view of an example of an LED having a parabolic mesa structure according to certain embodiments.

FIG. 25B is a cross-sectional view of an example of an LED 2505 having a parabolic mesa structure. Similar to LED 2500, LED 2505 may include multiple layers of semiconductor materials, such as multiple layers of III-V semiconductor materials. The semiconductor material layers may be epitaxially grown on a substrate 2515, such as a GaN substrate or a sapphire substrate. For example, a semiconductor layer 2525 may be grown on substrate 2515. Semiconductor layer 2525 may include a III-V material, such as GaN, and may be p-doped (e.g., with Mg, Ca, Zn, or Be) or n-doped (e.g., with Si or Ge). One or more active layer 2535 may be grown on semiconductor layer 2525. Active layer 2535 may include III-V materials, such as one or more InGaN layers, one or more AlInGaP layers, and/or one or more GaN layers, which may form one or more heterostructures, such as one or more quantum wells. A semiconductor layer 2545 may be grown on active layer 2535. Semiconductor layer 2545 may include a III-V material, such as GaN, and may be p-doped (e.g., with Mg, Ca, Zn, or Be) or n-doped (e.g., with Si or Ge). One of semiconductor layer 2525 and semiconductor layer 2545 may be a p-type layer and the other one may be an n-type layer.

To make contact with semiconductor layer 2525 (e.g., an n-type GaN layer) and to more efficiently extract light emitted by active layer 2535 from LED 2505, the semiconductor layers may be etched to expose semiconductor layer 2525 and to form a mesa structure that includes layers 2525-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 2525-745.

As shown in FIG. 25B, LED 2505 may have a mesa structure that includes a flat top. A dielectric layer 2575 (e.g., SiO2 or SiNx) may be formed on the facets of the mesa structure. In some embodiments, dielectric layer 2575 may include multiple layers of dielectric materials. In some embodiments, a metal layer 2595 may be formed on dielectric layer 2575. Metal layer 2595 may include one or more metal or metal alloy materials, such as aluminum (Al), silver (Ag), gold (Au), platinum (Pt), titanium (Ti), copper (Cu), or any combination thereof. Dielectric layer 2575 and metal layer 2595 may form a mesa reflector that can reflect light emitted by active layer 2535 toward substrate 2515. In some embodiments, the mesa reflector may be parabolic-shaped to act as a parabolic reflector that may at least partially collimate the emitted light.

Electrical contact 2565 and electrical contact 2585 may be formed on semiconductor layer 2545 and semiconductor layer 2525, respectively, to act as electrodes. Electrical contact 2565 and electrical contact 2585 may each include a conductive material, such as Al, Au, Pt, Ag, Ni, Ti, Cu, or any combination thereof (e.g., Ag/Pt/Au or Al/Ni/Au), and may act as the electrodes of LED 2505. In the example shown in FIG. 25B, electrical contact 2585 may be an n-contact, and electrical contact 2565 may be a p-contact. Electrical contact 2565 and semiconductor layer 2545 (e.g., a p-type semiconductor layer) may form a back reflector for reflecting light emitted by active layer 2535 back toward substrate 2515. In some embodiments, electrical contact 2565 and metal layer 2595 include same material(s) and can be formed using the same processes. In some embodiments, an additional conductive layer (not shown) may be included as an intermediate conductive layer between the electrical contacts 2565 and 2585 and the semiconductor layers.

When a voltage signal is applied across contacts 2565 and 2585, electrons and holes may recombine in active layer 2535. The recombination of electrons and holes may cause photon emission, thus producing light. The wavelength and energy of the emitted photons may depend on the energy bandgap between the valence band and the conduction band in active layer 2535. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 2505, for example, from the bottom side (e.g., substrate 2515) shown in FIG. 25B. One or more other secondary optical components, such as a lens or a grating, may be formed on the light emission surface, such as substrate 2515, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

In some examples, LED 2505 may comprise at least a portion of one or more reconstituted semiconductor components such as described herein.

Figures 26A, 26B:
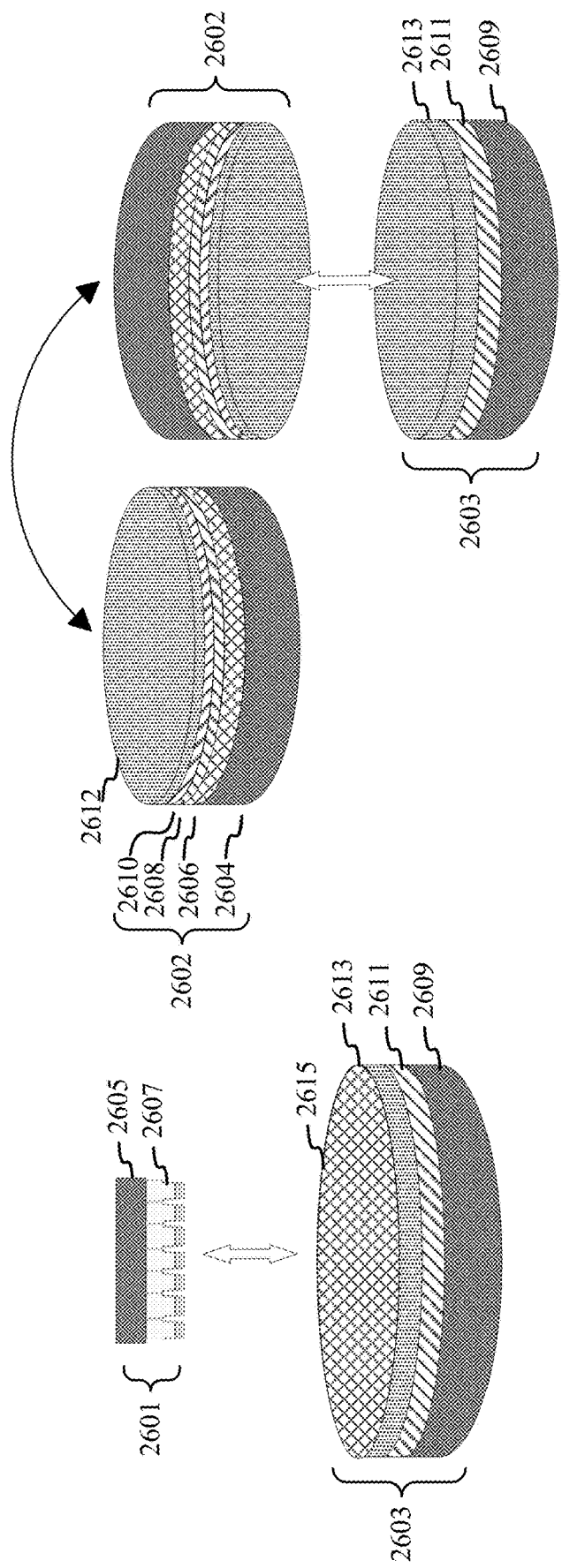
FIG. 26A illustrates an example of a method of die-to-wafer bonding for arrays of LEDs according to certain embodiments.
FIG. 26B illustrates an example of a method of wafer-to-wafer bonding for arrays of LEDs according to certain embodiments.

FIG. 26A illustrates an example of a method of die-to-wafer bonding for arrays of LEDs according to certain embodiments. In the example shown in FIG. 26A, an LED array 2601 may include a plurality of LEDs 2607 on a carrier substrate 2605. Carrier substrate 2605 may include various materials, such as GaAs, InP, GaN, AlN, sapphire, SiC, Si, or the like. LEDs 2607 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 2603 may include a base layer 2609 having passive or active integrated circuits (e.g., driver circuits 2611) fabricated thereon. Base layer 2609 may include, for example, a silicon wafer. Driver circuits 2611 may be used to control the operations of LEDs 2607. For example, the driver circuit for each LED 2607 may include a 2T1C pixel structure that has two transistors and one capacitor. Wafer 2603 may also include a bonding layer 2613. Bonding layer 2613 may include various materials, such as a metal, an oxide, a dielectric, CuSn, AuTi, and the like. In some embodiments, a patterned layer 2615 may be formed on a surface of bonding layer 2613, where patterned layer 2615 may include a metallic grid made of a conductive material, such as Cu, Ag, Au, Al, or the like.

LED array 2601 may be bonded to wafer 2603 via bonding layer 2613 or patterned layer 2615. For example, patterned layer 2615 may include metal pads or bumps made of various materials, such as CuSn, AuSn, or nanoporous Au, that may be used to align LEDs 2607 of LED array 2601 with corresponding driver circuits 2611 on wafer 2603. In one example, LED array 2601 may be brought toward wafer 2603 until LEDs 2607 come into contact with respective metal pads or bumps corresponding to driver circuits 2611. Some or all of LEDs 2607 may be aligned with driver circuits 2611, and may then be bonded to wafer 2603 via patterned layer 2615 by various bonding techniques, such as metal-to-metal bonding. After LEDs 2607 have been bonded to wafer 2603, carrier substrate 2605 may be removed from LEDs 2607.

FIG. 26B illustrates an example of a method of wafer-to-wafer bonding for arrays of LEDs according to certain embodiments. As shown in FIG. 26B, a first wafer 2602 may include a substrate 2604, a first semiconductor layer 2606, active layers 2608, and a second semiconductor layer 2610. Substrate 2604 may include various materials, such as GaAs, InP, GaN, AN, sapphire, SiC, Si, or the like. First semiconductor layer 2606, active layers 2608, and second semiconductor layer 2610 may include various semiconductor materials, such as GaN, InGaN, (AlGaIn) P, (AlGaIn) AsP, (AlGaIn) AsN, (AlGaIn) Pas, (Eu:InGa) N, (AlGaIn)

N, or the like. In some embodiments, first semiconductor layer 2606 may be an n-type layer, and second semiconductor layer 2610 may be a p-type layer. For example, first semiconductor layer 2606 may be an n-doped GaN layer (e.g., doped with Si or Ge), and second semiconductor layer 2610 may be a p-doped GaN layer (e.g., doped with Mg, Ca, Zn, or Be). Active layers 2608 may include, for example, one or more GaN layers, one or more InGaN layers, one or more AlInGaP layers, and the like, which may form one or more heterostructures, such as one or more quantum wells or MQWs.

In some embodiments, first wafer 2602 may also include a bonding layer. Bonding layer 2612 may include various materials, such as a metal, an oxide, a dielectric, CuSn, AuTi, or the like. In one example, bonding layer 2612 may include p-contacts and/or n-contacts (not shown). In some embodiments, other layers may also be included on first wafer 2602, such as a buffer layer between substrate 2604 and first semiconductor layer 2606. The buffer layer may include various materials, such as polycrystalline GaN or AlN. In some embodiments, a contact layer may be between second semiconductor layer 2610 and bonding layer 2612. The contact layer may include any suitable material for providing an electrical contact to second semiconductor layer 2610 and/or first semiconductor layer 2606.

First wafer 2602 may be bonded to wafer 2603 that includes driver circuits 2611 and bonding layer 2613 as described above, via bonding layer 2613 and/or bonding layer 2612. Bonding layer 2612 and bonding layer 2613 may be made of the same material or different materials. Bonding layer 2613 and bonding layer 2612 may be substantially flat. First wafer 2602 may be bonded to wafer 2603 by various methods, such as metal-to-metal bonding, eutectic bonding, metal oxide bonding, anodic bonding, thermo-compression bonding, ultraviolet (UV) bonding, and/or fusion bonding.

As shown in FIG. 26B, first wafer 2602 may be bonded to wafer 2603 with the p-side (e.g., second semiconductor layer 2610) of first wafer 2602 facing down (i.e., toward wafer 2603). After bonding, substrate 2604 may be removed from first wafer 2602, and first wafer 2602 may then be processed from the n-side. The processing may include, for example, the formation of certain mesa shapes for individual LEDs, as well as the formation of optical components corresponding to the individual LEDs.

In some examples, FIGS. 26A-26B may describe arrays and/or wafers that comprise at least a portion of one or more reconstituted semiconductor components such as described herein.

Figure 27A:
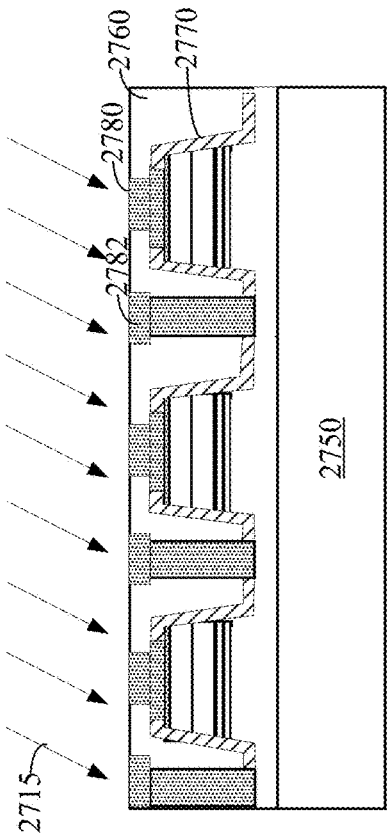
FIGS. 27A-27D illustrates an example of a method of hybrid bonding for arrays of LEDs according to certain embodiments.

FIGS. 27A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 27A shows a substrate 2710 with passive or active circuits 2720 manufactured thereon. As described above with respect to FIGS. 26A-8B, substrate 2710 may include, for example, a silicon wafer. Circuits 2720 may include driver circuits for the arrays of LEDs. A bonding layer may include dielectric regions 2740 and contact pads 2730 connected to circuits 2720 through electrical interconnects 2722. Contact pads 2730 may include, for example, Cu, Ag, Au, Al, W, Mo, Ni, Ti, Pt, Pd, or the like. Dielectric materials in dielectric regions 2740 may include SiCN, SiO2, SiN, Al2O3, HfO2, ZrO2, Ta2O5, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 2705. The activated surface may be atomically clean and may be reactive for formation of direct bonds between wafers when they are brought into contact, for example, at room temperature.

Figure 27B:
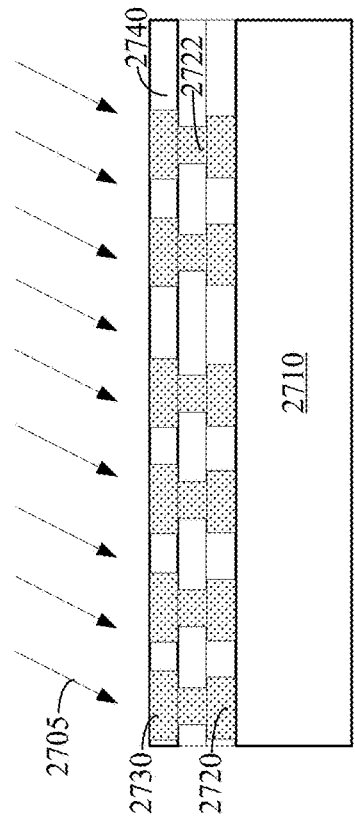

FIG. 27B illustrates a wafer 2750 including an array of micro-LEDs 2770 fabricated thereon as described above with respect to, for example, FIGS. 25A-8B. Wafer 2750 may be a carrier wafer and may include, for example, GaAs, InP, GaN, AlN, sapphire, SiC, Si, or the like. Micro-LEDs 2770 may include an n-type layer, an active region, and a p-type layer epitaxially grown on wafer 2750. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 2780 and n-contacts 2782 may be formed in a dielectric material layer 2760 deposited on the mesa structures and may make electrical contacts with the p-type layer and the n-type layers, respectively. Dielectric materials in dielectric material layer 2760 may include, for example, SiCN, SiO2, SiN, Al2O3, HfO2, ZrO2, Ta2O5, or the like. P-contacts 2780 and n-contacts 2782 may include, for example, Cu, Ag, Au, Al, W, Mo, Ni, Ti, Pt, Pd, or the like. The top surfaces of p-contacts 2780, n-contacts 2782, and dielectric material layer 2760 may form a bonding layer. The bonding layer may be planarized and polished using, for example, chemical mechanical polishing, where the polishing may cause dishing in p-contacts 2780 and n-contacts 2782. The bonding layer may then be cleaned and activated by, for example, an ion (e.g., plasma) or fast atom (e.g., Ar) beam 2715. The activated surface may be atomically clean and reactive for formation of direct bonds between wafers when they are brought into contact, for example, at room temperature.

Figure 27C:
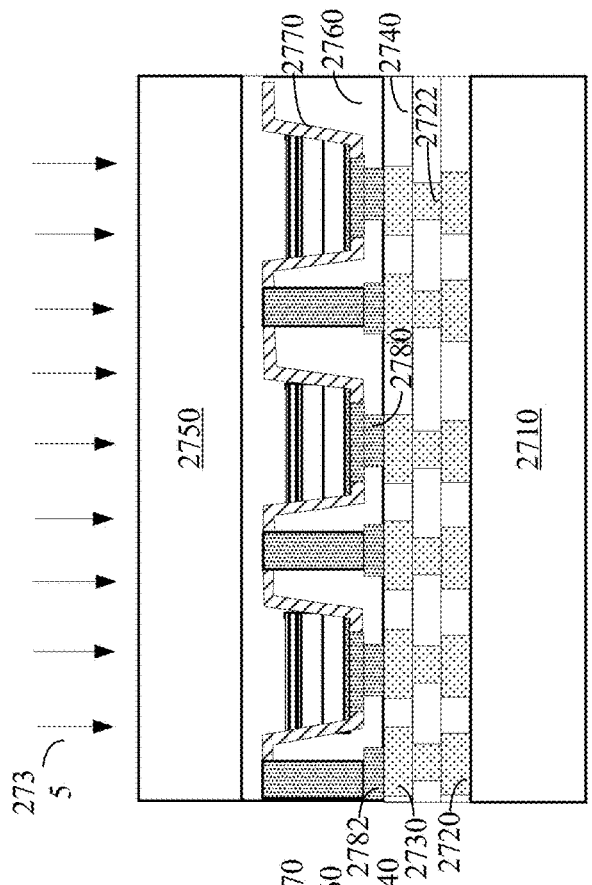

FIG. 27C illustrates a room temperature bonding process for bonding the dielectric materials in the bonding layers. For example, after the bonding layer that includes dielectric regions 2740 and contact pads 2730 and the bonding layer that includes p-contacts 2780, n-contacts 2782, and dielectric material layer 2760 are surface activated, wafer 2750 and micro-LEDs 2770 may be turned upside down and brought into contact with substrate 2710 and the circuits formed thereon. In some embodiments, compression pressure 2725 may be applied to substrate 2710 and wafer 2750 such that the bonding layers are pressed against each other. Due to the surface activation and the dishing in the contacts, dielectric regions 2740 and dielectric material layer 2760 may be in direct contact because of the surface attractive force, and may react and form chemical bonds between them because the surface atoms may have dangling bonds and may be in unstable energy states after the activation. Thus, the dielectric materials in dielectric regions 2740 and dielectric material layer 2760 may be bonded together with or without heat treatment or pressure.

Figure 27D:
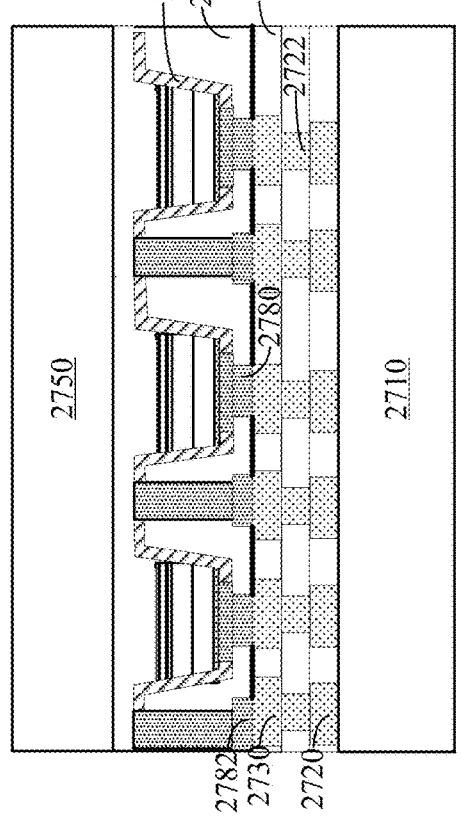

FIG. 27D illustrates an annealing process for bonding the contacts in the bonding layers after bonding the dielectric materials in the bonding layers. For example, contact pads 2730 and p-contacts 2780 or n-contacts 2782 may be bonded together by annealing at, for example, about 200-400° C. or higher. During the annealing process, heat 2735 may cause the contacts to expand more than the dielectric materials (due to different coefficients of thermal expansion), and thus may close the dishing gaps between the contacts such that contact pads 2730 and p-contacts 2780 or n-contacts 2782 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

In some examples, FIGS. 27A-27D may describe methods that may include reconstitution of one or more semiconductor components or that may include at least a portion of one or more reconstituted semiconductor components such as described herein.

Figure 28:
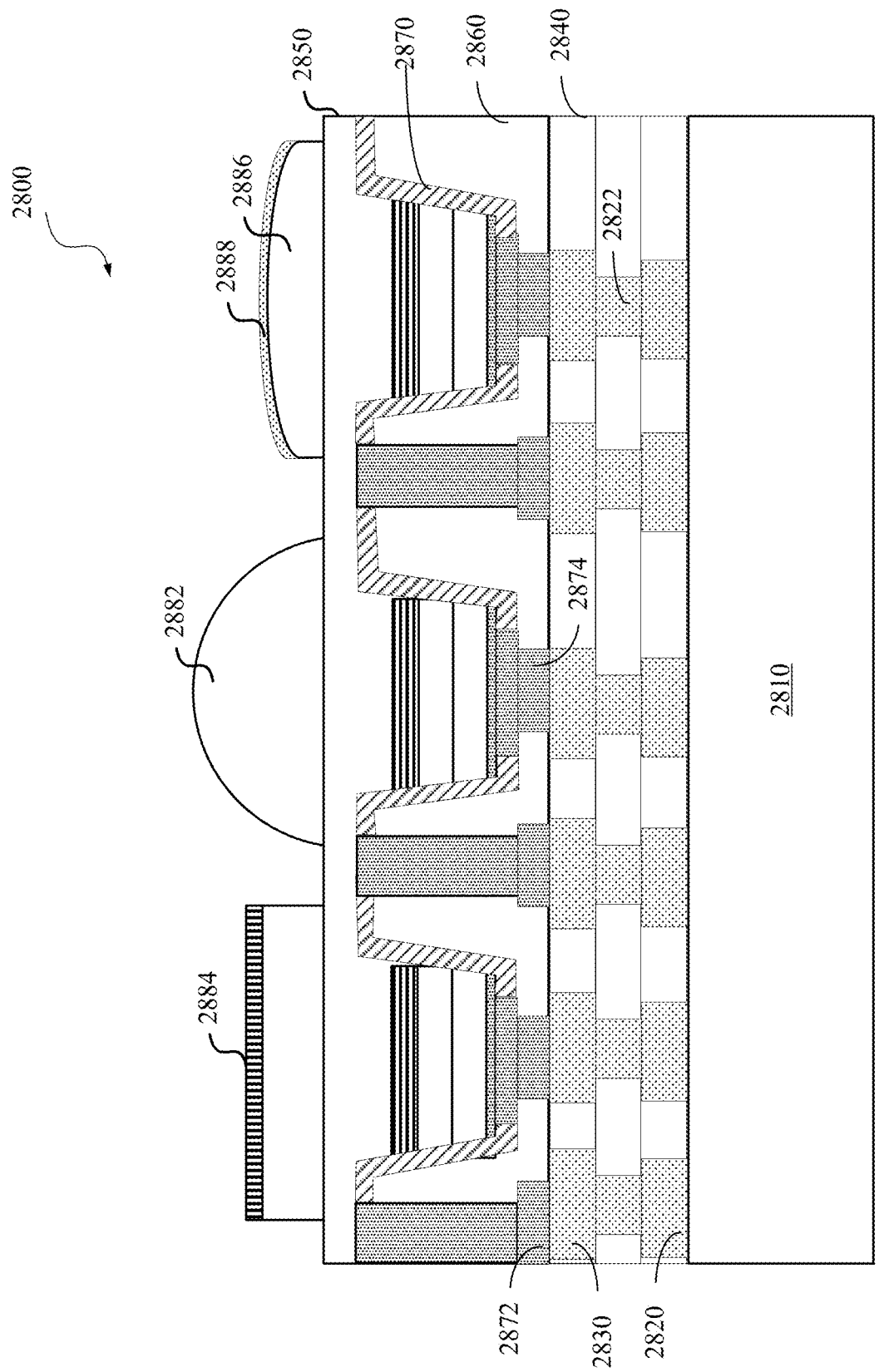
FIG. 28 illustrates an example of an LED array with secondary optical components fabricated thereon according to certain embodiments.

FIG. 28 illustrates an example of an LED array 2800 with secondary optical components fabricated thereon according to certain embodiments. LED array 2800 may be made by bonding an LED chip or wafer with a silicon wafer including electrical circuits fabricated thereon, using any suitable bonding techniques described above with respect to, for example, FIGS. 26A-9D. In the example shown in FIG. 28, LED array 2800 may be bonded using a wafer-to-wafer hybrid bonding technique as described above with respect to FIG. 27A-9D. LED array 2800 may include a substrate 2810, which may be, for example, a silicon wafer. Integrated circuits 2820, such as LED driver circuits, may be fabricated on substrate 2810. Integrated circuits 2820 may be connected to p-contacts 2874 and n-contacts 2872 of micro-LEDs 2870 through interconnects 2822 and contact pads 2830, where contact pads 2830 may form metallic bonds with p-contacts 2874 and n-contacts 2872. Dielectric layer 2840 on substrate 2810 may be bonded to dielectric layer 2860 through fusion bonding.

The substrate (not shown) of the LED chip or wafer may be thinned or may be removed to expose the n-type layer 2850 of micro-LEDs 2870. Various secondary optical components, such as a spherical micro-lens 2882, a grating 2884, a micro-lens 2886, an antireflection layer 2888, and the like, may be formed in or on top of n-type layer 2850. For example, spherical micro-lens arrays may be etched in the semiconductor materials of micro-LEDs 2870 using a grayscale mask and a photoresist with a linear response to exposure light, or using an etch mask formed by thermal reflowing of a patterned photoresist layer. The secondary optical components may also be etched in a dielectric layer deposited on n-type layer 2850 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO2, SiN, Al2O3, HfO2, ZrO2, Ta2O5, or the like. In some embodiments, a micro-LED 2870 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 28 to show some examples of secondary optical components that can be formed on micro-LEDs 2870, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

In some examples, LED array 2800 may include one or more reconstituted semiconductor components such as described herein.

Figure 29:
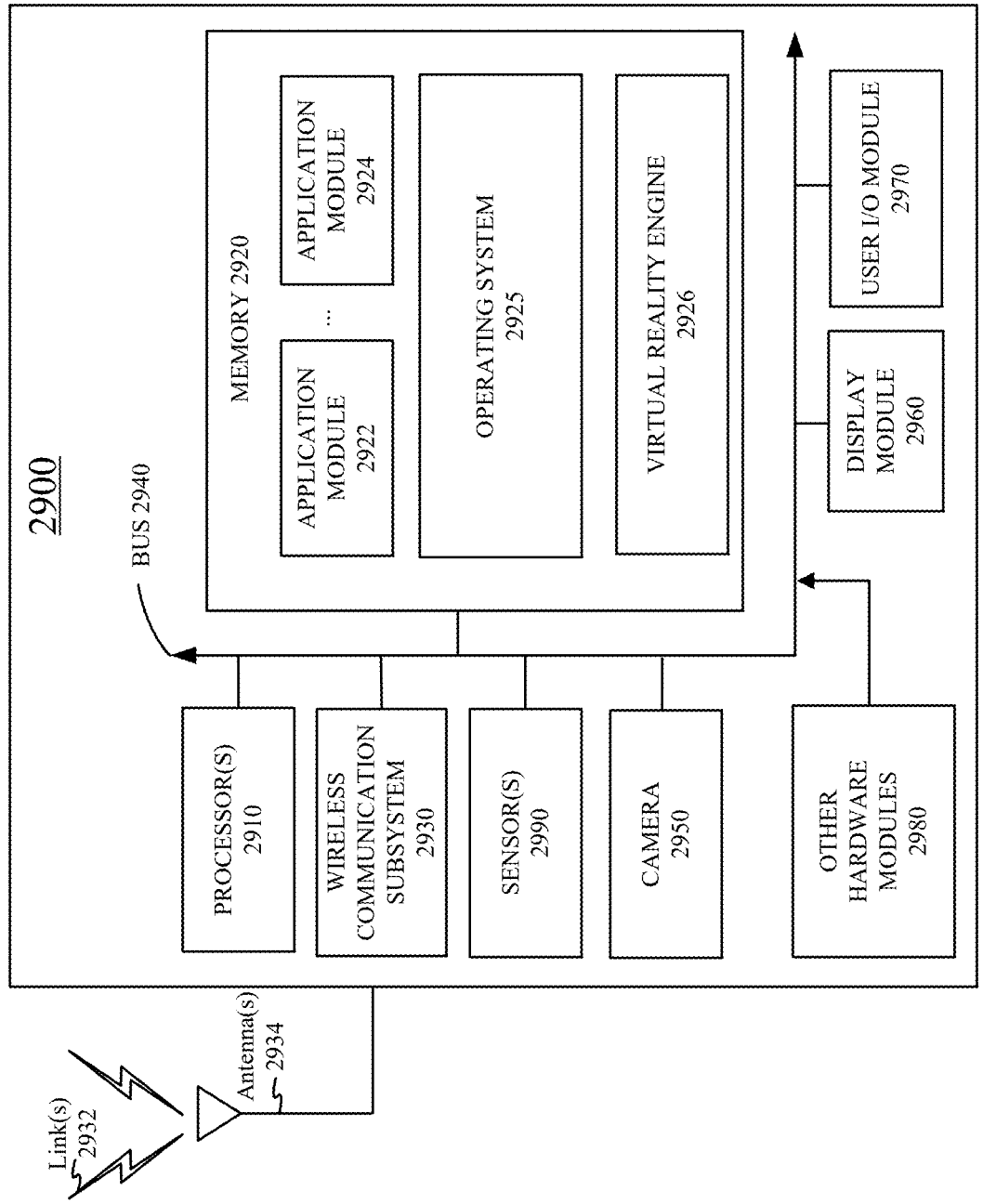
FIG. 29 is a simplified block diagram of an electronic system of an example of a near-eye display according to certain embodiments.

FIG. 29 is a simplified block diagram of an example electronic system 2900 of an example near-eye display (e.g., HMD device) for implementing some of the examples disclosed herein. Electronic system 2900 may be used as the electronic system of an HMD device or other near-eye displays described above. In this example, electronic system 2900 may include one or more processor(s) 2910 and a memory 2920. Processor(s) 2910 may be configured to execute instructions for performing operations at a number of components, and can be, for example, a general-purpose processor or microprocessor suitable for implementation within a portable electronic device. Processor(s) 2910 may be communicatively coupled with a plurality of components within electronic system 2900. To realize this communicative coupling, processor(s) 2910 may communicate with the other illustrated components across a bus 2940. Bus 2940 may be any subsystem adapted to transfer data within electronic system 2900. Bus 2940 may include a plurality of computer buses and additional circuitry to transfer data.

Memory 2920 may be coupled to processor(s) 2910. In some embodiments, memory 2920 may offer both short-term and long-term storage and may be divided into several units. Memory 2920 may be volatile, such as static random access memory (SRAM) and/or dynamic random access memory (DRAM) and/or non-volatile, such as read-only memory (ROM), flash memory, and the like. Furthermore, memory 2920 may include removable storage devices, such as secure digital (SD) cards. Memory 2920 may provide storage of computer-readable instructions, data structures, program modules, and other data for electronic system 2900. In some embodiments, memory 2920 may be distributed into different hardware modules. A set of instructions and/or code might be stored on memory 2920. The instructions might take the form of executable code that may be executable by electronic system 2900, and/or might take the form of source and/or installable code, which, upon compilation and/or installation on electronic system 2900 (e.g., using any of a variety of generally available compilers, installation programs, compression/decompression utilities, etc.), may take the form of executable code.

In some embodiments, memory 2920 may store a plurality of application modules 2922 through 2924, which may include any number of applications. Examples of applications may include gaming applications, conferencing applications, video playback applications, or other suitable applications. The applications may include a depth sensing function or eye tracking function. Application modules 2922-2924 may include particular instructions to be executed by processor(s) 2910. In some embodiments, certain applications or parts of application modules 2922-2924 may be executable by other hardware modules 2980. In certain embodiments, memory 2920 may additionally include secure memory, which may include additional security controls to prevent copying or other unauthorized access to secure information.

In some embodiments, memory 2920 may include an operating system 2925 loaded therein. Operating system 2925 may be operable to initiate the execution of the instructions provided by application modules 2922-2924 and/or manage other hardware modules 2980 as well as interfaces with a wireless communication subsystem 2930 which may include one or more wireless transceivers. Operating system 2925 may be adapted to perform other operations across the components of electronic system 2900 including threading, resource management, data storage control and other similar functionality.

Wireless communication subsystem 2930 may include, for example, an infrared communication device, a wireless communication device and/or chipset (such as a Bluetooth® device, an IEEE 2602.11 device, a Wi-Fi device, a WiMax device, cellular communication facilities, etc.), and/or similar communication interfaces. Electronic system 2900 may include one or more antennas 2934 for wireless communication as part of wireless communication subsystem 2930 or as a separate component coupled to any portion of the system. Depending on desired functionality, wireless communication subsystem 2930 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 2602.16) network. A WLAN may be, for example, an IEEE 2602.11x network. A WPAN may be, for example, a Bluetooth network, an IEEE 2602.15x, or some other types of network. The techniques described herein may also be used for any combination of WWAN, WLAN, and/or WPAN. Wireless communications subsystem 2930 may permit data to be exchanged with a network, other computer systems, and/or any other devices described herein. Wireless communication subsystem 2930 may include a means for transmitting or receiving data, such as identifiers of HMD devices, position data, a geographic map, a heat map, photos, or videos, using antenna(s) 2934 and wireless link(s) 2932. Wireless communication subsystem 2930, processor(s) 2910, and memory 2920 may together comprise at least a part of one or more of a means for performing some functions disclosed herein.

Embodiments of electronic system 2900 may also include one or more sensors 2990. Sensor(s) 2990 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2990 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2900 may include a display module 2960. Display module 2960 may be a near-eye display, and may graphically present information, such as images, videos, and various instructions, from electronic system 2900 to a user. Such information may be derived from one or more application modules 2922-2924, virtual reality engine 2926, one or more other hardware modules 2980, a combination thereof, or any other suitable means for resolving graphical content for the user (e.g., by operating system 2925). Display module 2960 may use LCD technology, LED technology (including, for example, OLED, ILED, micro-LED, AMOLED, TOLED, etc.), light emitting polymer display (LPD) technology, or some other display technology.

Electronic system 2900 may include a user input/output module 2970. User input/output module 2970 may allow a user to send action requests to electronic system 2900. An action request may be a request to perform a particular action. For example, an action request may be to start or end an application or to perform a particular action within the application. User input/output module 2970 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2900. In some embodiments, user input/output module 2970 may provide haptic feedback to the user in accordance with instructions received from electronic system 2900. For example, the haptic feedback may be provided when an action request is received or has been performed.

Electronic system 2900 may include a camera 2950 that may be used to take photos or videos of a user, for example, for tracking the user's eye position. Camera 2950 may also be used to take photos or videos of the environment, for example, for VR, AR, or MR applications. Camera 2950 may include, for example, a complementary metal-oxide-semiconductor (CMOS) image sensor with a few millions or tens of millions of pixels. In some implementations, camera 2950 may include two or more cameras that may be used to capture 3-D images.

In some embodiments, electronic system 2900 may include a plurality of other hardware modules 2980. Each of other hardware modules 2980 may be a physical module within electronic system 2900. While each of other hardware modules 2980 may be permanently configured as a structure, some of other hardware modules 2980 may be temporarily configured to perform specific functions or temporarily activated. Examples of other hardware modules 2980 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2980 may be implemented in software.

In some embodiments, memory 2920 of electronic system 2900 may also store a virtual reality engine 2926. Virtual reality engine 2926 may execute applications within electronic system 2900 and receive position information, acceleration information, velocity information, predicted future positions, or any combination thereof of the HMD device from the various sensors. In some embodiments, the information received by virtual reality engine 2926 may be used for producing a signal (e.g., display instructions) to display module 2960. For example, if the received information indicates that the user has looked to the left, virtual reality engine 2926 may generate content for the HMD device that mirrors the user's movement in a virtual environment. Additionally, virtual reality engine 2926 may perform an action within an application in response to an action request received from user input/output module 2970 and provide feedback to the user. The provided feedback may be visual, audible, or haptic feedback. In some implementations, processor(s) 2910 may include one or more GPUs that may execute virtual reality engine 2926.

In various implementations, the above-described hardware and modules may be implemented on a single device or on multiple devices that can communicate with one another using wired or wireless connections. For example, in some implementations, some components or modules, such as GPUs, virtual reality engine 2926, and applications (e.g., tracking application), may be implemented on a console separate from the head-mounted display device. In some implementations, one console may be connected to or support more than one HMD.

In alternative configurations, different and/or additional components may be included in electronic system 2900. Similarly, functionality of one or more of the components can be distributed among the components in a manner different from the manner described above. For example, in some embodiments, electronic system 2900 may be modified to include other system environments, such as an AR system environment and/or an MR environment.

In some examples, electronic system 2900 may include one or more reconstituted semiconductor components such as described herein.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs or videos). The artificial reality content may include video, audio, haptic feedback, or some combination thereof, and any of which may be presented in a single channel or in multiple channels (such as stereo video that produces a three-dimensional effect to the viewer). Additionally, in some examples, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An augmented-reality glasses, comprising:
    a plurality of panels of light emitters arranged to form an array of light emitters, wherein:
        the array of light emitters includes light emitters generating three colors,
        each panel of the plurality of panels of light emitters has light emitters generating a same color, and
        each panel of the plurality of panels of light emitters is positioned on a surface of a semiconductor with at least one integrated circuit;
    collimation optics for collimating light received from the array of light emitters;
    an optical coupler for receiving the collimated light; and
    a waveguide for display of augmented-reality content to a wearer of the augmented-reality glasses.

2. The augmented-reality glasses of claim 1, wherein the array of light emitters is a two-dimensional array of light emitters arranged on a common plane and the array of light emitters is characterized by a pitch that is less than 2 μm.

3. The augmented-reality glasses of claim 1, wherein each light emitter of the two-dimensional array of light emitters has a diameter that is less than 2 μm.

4. The augmented-reality glasses of claim 1, wherein each panel of the plurality of panels of light emitters has a surface area of 3 mm×4 mm.

5. The augmented-reality glasses of claim 1, wherein the semiconductor with the at least one integrated circuit has a surface area of 4 mm×5 mm.

6. The augmented-reality glasses of claim 1, wherein the semiconductor with at least one integrated circuit has at least one through surface via (TSV).

7. The augmented-reality glasses of claim 1, wherein the waveguide is an optical combiner and the light emitters are light emitting diodes.

8. A projector assembly comprising:
    a plurality of panels of light emitters arranged to form an array of light emitters, wherein:
        the array of light emitters includes light emitters generating three colors,
        each panel of the plurality of panels of light emitters has light emitters generating a same color, and
        each panel of the plurality of panels of light emitters is positioned on a surface of a semiconductor with at least one integrated circuit;
    collimation optics for collimating light received from the array of light emitters; and
    an optical coupler for receiving the collimated light, wherein the projector assembly is configured to project augmented-reality content for viewing via a waveguide.

9. The projector assembly of claim 8, wherein the array of light emitters is a two-dimensional array of light emitters arranged on a common plane and the array of light emitters is characterized by a pitch that is less than 2 μm.

10. The projector assembly of claim 8, wherein each light emitter of the two-dimensional array of light emitters has a diameter that is less than 2 μm.

11. The projector assembly of claim 8, wherein each panel of the plurality of panels of light emitters has a surface area of 3 mm×4 mm.

12. The projector assembly of claim 8, wherein the semiconductor with the at least one integrated circuit has a surface area of 4 mm×5 mm.

13. The projector assembly of claim 8, wherein the semiconductor with at least one integrated circuit has at least one through surface via (TSV).

14. The projector assembly of claim 8, wherein the waveguide is an optical combiner and the light emitters are light emitting diodes.

15. A method of assembling augmented-reality glasses, comprising:
    forming a projector assembly comprising:
        a plurality of panels of light emitters arranged to form an array of light emitters, wherein:
            the array of light emitters includes light emitters generating three colors,
            each panel of the plurality of panels of light emitters has light emitters generating a same color, and
            each panel of the plurality of panels of light emitters is positioned on a surface of a semiconductor with at least one integrated circuit; and
        collimation optics for collimating light received from the array of light emitters; and
    coupling the projector assembly with an optical coupler for receiving the collimated light, wherein the optical coupler is coupled to a waveguide configured to cause display of augmented-reality content to a wearer of the augmented-reality glasses.

16. The method of assembling the augmented-reality glasses of claim 15, wherein the array of light emitters is a two-dimensional array of light emitters arranged on a common plane and the array of light emitters is characterized by a pitch that is less than 2 μm.

17. The method of assembling the augmented-reality glasses of claim 15, wherein each panel of the plurality of panels of light emitters has a surface area of 3 mm×4 mm.

18. The method of assembling the augmented-reality glasses of claim 15, wherein each light emitter of the two-dimensional array of light emitters has a diameter that is less than 2 μm.

19. The method of assembling the augmented-reality glasses of claim 15, wherein the semiconductor with at least one integrated circuit has at least one through surface via (TSV).

20. The method of assembling the augmented-reality glasses of claim 15, wherein the waveguide is an optical combiner and the light emitters are light emitting diodes.

* * * * *